United States Patent
Suhara

(10) Patent No.: US 6,260,260 B1
(45) Date of Patent: *Jul. 17, 2001

(54) APPARATUS FOR SUPPLYING ELECTRONIC COMPONENTS TO A CIRCUIT BOARD MANUFACTURING APPARATUS

(75) Inventor: Shinsuke Suhara, Kariya (JP)

(73) Assignee: Fuji Machine Mfg. Co., Ltd., Chiryu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,931

(22) Filed: Oct. 28, 1998

(30) Foreign Application Priority Data

Oct. 29, 1997 (JP) .................................................. 9-297533

(51) Int. Cl.[7] ...................................................... H05K 3/30
(52) U.S. Cl. ............................ 29/740; 29/426.3; 29/429; 29/741; 29/743; 29/832; 226/110; 226/139
(58) Field of Search ......................... 29/740, 832, 426.3, 29/429, 741, 743; 226/110, 139; 414/403, 404

(56) References Cited

U.S. PATENT DOCUMENTS

| 5,588,195 | 12/1996 | Asai et al. | |
|---|---|---|---|
| 5,695,309 | 12/1997 | Kondo et al. | |
| 5,784,777 | * 7/1998 | Asai et al. | 29/832 |
| 5,850,683 | * 12/1998 | Okazaki et al. | 29/740 |
| 5,865,359 | * 2/1999 | Kanai | 226/122 |
| 6,047,874 | * 4/2000 | Asai et al. | 226/110 |

FOREIGN PATENT DOCUMENTS

| 5-218685 | 8/1993 | (JP) . |
|---|---|---|
| 6-342998 | 12/1994 | (JP) . |
| 9-237997 | 9/1997 | (JP) . |

* cited by examiner

*Primary Examiner*—Lee Young
*Assistant Examiner*—Rick Kiltae Chang
(74) *Attorney, Agent, or Firm*—Oliff & Berridge, PLC

(57) ABSTRACT

A method of supplying electric components ("ECs") with an EC supplying apparatus including an EC-supply table including a displaceable table displaceable in a reference direction, and EC-supply units provided on the displaceable table such that respective EC-supply portions of the units are arranged along a line parallel to the reference direction, each of the EC-supply units including a driven member and a carrier-tape feeding device which feeds, based on the driven member being driven, a carrier tape carrying the ECS at a EC-carry pitch, at a tape-feed pitch equal to a quotient obtained by dividing the EC-carry pitch by an integral number, so that the ECs are positioned, one by one, at the EC-supply portion of each unit, a table displacing device which displaces the displaceable table and positions the EC-supply portion of each EC-supply unit, at an EC-supply position, a drive member which is provided near the EC-supply position, and a drive device which drives the drive member which in turn drives the driven member of each EC-supply unit, the method including the step of causing the drive member to drive the driven member of each EC-supply unit being displaced with the displaceable table, while causing the drive member to follow the driven member being displaced, so that a portion of a carrier-tape feeding operation and/or a tape-feed preparing operation of the carrier-tape feeding device of each unit is performed while each unit is displaced with the displaceable table.

12 Claims, 23 Drawing Sheets

APPARATUS FOR SUPPLYING ELECTRONIC COMPONENTS TO A CIRCUIT BOARD MANUFACTURING APPARATUS

BACKGROUND OF THE INVENTION

1. Field of the Invention

The present invention generally relates to a method and an apparatus for supplying electric components (e.g., electronic components) and an apparatus for mounting electric components, and particularly to the art of improving the efficiency of supplying of electric components.

2. Related Art Statement

U.S. Pat. No. 5,695,309 discloses an electric-component ("EC") supplying apparatus including a plurality of EC supplying units each of which feeds a carrier tape carrying a plurality of electric components ("ECs") and thereby supplies the ECs, one by one, and each one of which is selectively positioned at an EC-supply position to supply one or more ECs. The carrier tape carries the ECs at a predetermined EC-carry pitch and, when a driven member of each EC supplying unit is driven, the carrier tape is fed at a predetermined tape-feed pitch by a carrier-tape feeding device of the unit, so that the ECs are positioned, one by one, at an EC-supply portion of the unit. The plurality of EC supplying units are provided on a movable table such that the respective EC-supply portions of the units are arranged along a straight line, and the movable table is movable in a direction parallel to the straight line, so that each one of the units is selectively positioned at the EC-supply position. A drive member which drives the driven member of each EC supplying unit is provided in the vicinity of the EC-supply position. The plurality of EC supplying units share the drive member and a drive device which drives the drive member. The present EC supplying apparatus can supply the carrier tapes at a lower cost than an apparatus wherein a plurality of EC supplying units include respective drive members and drive devices.

In the above-indicated EC supplying apparatus, the moving of the EC supplying units occurs at a timing different from that at which the feeding of the carrier tape on each EC supplying unit does. For example, after the movable table is moved and the EC-supply portion of one of the EC supplying units is positioned at the EC-supply position, one EC is taken from the carrier tape supplied by the one EC supplying unit, and the drive member is engaged with the driven member of the one unit to feed the carrier tape. After the feeding of the carrier tape, the movable table is moved so that the EC-supply portion of another EC supplying unit is positioned at the EC-supply position.

However, recently, there has been a demand to shorten a positioning time which is needed to position the EC-supply portion of each EC supplying unit at the EC-supply position. For example, the EC supplying apparatus may be employed in an EC mounting system to supply ECs to an EC mounting apparatus of the system. The EC mounting apparatus includes an intermittent-rotation body which intermittently rotates about a vertical axis line at a predetermined rotation-angle pitch, and a plurality of EC holders which is provided on the rotation body such that the EC holders are equiangularly spaced from each other about the vertical axis line at a predetermined spacing-angle pitch equal to the rotation-angle pitch. As the rotation body is intermittently rotated, the EC holders are sequentially moved to each of stop positions including an EC-receive position where each of the EC holders receives an EC from the EC supplying apparatus, and an EC-mount position where each EC holder mounts the EC on a circuit substrate as an example of an object on which ECs are to be mounted. In this case, a cyclic operation time is defined as a time duration needed for an EC holder following another EC holder to reach a stop position after that another EC holder reaches that stop position. Japanese Patent Application laid open for public inspection under Publication No. 6(1994)-342998 discloses an EC mounting apparatus wherein the moving of EC holders by the rotation of an intermittent-rotation body occurs partially concurrently with the EC taking and mounting actions of each of the EC holders, so as to shorten the cyclic operation time of the apparatus. To this end, it is required that the EC-supply portion of each of the EC supplying units be moved to the EC-supply position at a shorter time interval. Accordingly, both a time duration which can be used to position the EC-supply portion of each EC supplying unit at the EC-supply position, and a time duration which can be used to feed the carrier tape on each EC supplying unit are shortened. However, in the case where the acceleration and deceleration of movement of the movable table is increased to shorten the positioning time, the vibration which is produced when the movement of the movable table is started and stopped is increased, which leads to lowering the accuracy of positioning of the EC-supply portion of each EC supplying unit at the EC-supply position. On the other hand, in the case where the acceleration and deceleration of feeding of the carrier tape is increased to shorten the time duration needed to feed the carrier tape, the life expectancy of each EC supplying unit is reduced because the inertia of the unit is great and a great load is applied to the constituent members of the unit (e.g., the members of the carrier-tape feeding device).

In the case where the moving of the EC supplying units and the feeding of each carrier tape are concurrently carried out, the time interval at which the EC-supply portion of each EC supplying unit reaches the EC-supply position can be shortened without having to shorten the time duration needed to position the EC-supply portion of each EC supplying unit at the EC-supply position or the time duration needed to feed the carrier tape.

SUMMARY OF THE INVENTION

It is therefore an object of the present invention to provide an electric-component supplying method which improves the efficiency of supplying of electric components by shortening a time interval at which respective component-supply portions of component-supply units reach a component-supply position, without having to shorten a time duration which can be used to position the component-supply portion of each component-supply unit at the component-supply position, or a time duration which can be used to feed a carrier tape on each component-supply unit.

It is another object of the present invention to provide an electric-component supplying apparatus which enjoys the same advantage of the above method.

It is another object of the present invention to provide an electric-component mounting apparatus which enjoys the same advantage of the above method.

The present invention provides an electric-component supplying method, an electric-component supplying apparatus, and an electric-component mounting apparatus which have one or more of the technical features that are described below in respective paragraphs given parenthesized sequential numbers (1) to (13). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the combinations thereof are just the examples to which the present invention is by no means limited.

(1) According to a first feature of the present invention there is provided a method of supplying a plurality of electric components, with an electric-component supplying apparatus comprising a component-supply table including a displaceable table which is displaceable in a reference direction, and a plurality of component-supply units which are provided on the displaceable table such that respective component-supply portions of the units are arranged along a line parallel to the reference direction, each of the component-supply units including a driven member and a carrier-tape feeding device which feeds, based on the driven member being driven, a carrier tape carrying the electric components at a predetermined component-carry pitch, at a tape-feed pitch equal to a quotient obtained by dividing the component-carry pitch by an integral number, so that the electric components are positioned, one by one, at the component-supply portion of the each unit, a table displacing device which displaces the displaceable table and thereby positions the component-supply portion of the each component-supply unit, at a predetermined component-supply position, at least one drive member which is provided near the component-supply position, and at least one drive device which drives the drive member which in turn drives the driven member of the each component-supply unit, the method comprising the step of causing the drive member to drive the driven member of the each component-supply unit being displaced with the displaceable table, while causing the drive member to follow the driven member being displaced, so that at least a portion of at least one of a carrier-tape feeding operation and a tape-feed preparing operation of the carrier-tape feeding device of the each unit is performed while the each unit is displaced with the displaceable table. The line parallel to the reference direction may be a straight line, a circle, a circular arc, a curve other than the circular arc, or a combination of two or more of those lines. In the case where the line is a straight line, the displaceable table is provided by a linearly displaceable table; in the case where the line is a circle, the displaceable table is provided by a circular (full-circular) table which is rotatable about an axis line; and in the case where the line is a circular arc, the displaceable table is provided by a sectorial (part-circular) table which is rotatable about an axis line. Each of the circular table and the sectorial table can be said as a rotary table which is rotatable about an axis line. The carrier tape may be one which includes an accommodating tape having, at a predetermined pocket pitch, a plurality of pockets accommodating a plurality of electric components ("ECs"), respectively, and a cover tape fixed to the accommodating tape to close respective openings of the pockets; or one which carries ECs having lead wires and which includes a pair of holding tapes which extend parallel to each other and hold the lead wires of the ECs. Each of the component-supply units may be one which includes a carrier-tape feeding device and a carrier-tape storing device; or one which includes a carrier-tape feeding device but does not include a carrier-tape storing device. The latter component-supply units are disclosed in U.S. patent application Ser. No. 09/099,460 assigned to the Assignee of the present application. The Patent Application also discloses a plurality of stationary carrier-tape storing devices which correspond to the respective carrier-tape feeding devices of the component-supply units, respectively. Thus, when the displaceable table is displaced, the component-supply units are displaced, so that the respective carrier-tape feeding devices thereof are displaced relative to the stationary carrier-tape storing devices. In the present EC supplying method, the component-supply table is displaced by the table displacing device so that the component-supply portion of each of the component-supply units is positioned at the component-supply position, and the drive member is driven by the drive device to drive the driven member and thereby feed the carrier tape. The drive member drives the driven member while being displaced with the driven member being displaced with the displaceable table. Thus, while the component-supply units are displaced with the displaceable table, at least a portion of at least one of the carrier-tape feeding operation and the tape-feed preparing operation occurs. Thus, even in the case where a time pitch at which the respective component-supply portions of the plurality of component-supply units reach the component-supply position is limited to a short time, the component-supply portion of each component-supply unit can be positioned at the component-supply position while the carrier tape is fed on the each unit, without having to shorten a time duration needed to displace the displaceable table or a time duration needed to feed the carrier tape. That is, the component-supply portion of each component-supply unit can be positioned at the component-supply position at a short time interval, while the carrier tape is fed on the each unit, without having to increase the acceleration and deceleration of displacement of the displaceable table or increase the acceleration and deceleration of feeding of the carrier tape. Therefore, the efficiency of supplying of the ECs can be improved without lowering the accuracy of supplying of the ECs or reducing the life expectancy of the component-supply units. In the case where the carrier-tape feeding device of each component-supply unit performs both the carrier-tape feeding operation and the tape-feed preparing operation, at least a portion of either one, or each, of the two operations may be performed while the component-supply units are displaced. In the case where the carrier-tape feeding device performs only the carrier-tape feeding operation, at least a portion of the carry-tape feeding operation is performed while the component-supply units are displaced. In this connection, it is noted that the present EC supplying method may be combined with any one of the second to twelfth features (2) to (12), described below, of the EC supplying apparatus of the present invention.

(2) According to a second feature of the present invention there is provided an electric-component supplying apparatus comprising a component-supply table including a displaceable table which is displaceable in a reference direction, and a plurality of component-supply units which are provided on the displaceable table such that respective component-supply portions of the units are arranged along a line parallel to the reference direction, each of the component-supply units including a driven member and a carrier-tape feeding device which feeds, based on the driven member being driven, a carrier tape carrying a plurality of electric components at a predetermined component-carry pitch, at a tape-feed pitch equal to a quotient obtained by dividing the component-carry pitch by an integral number, so that the electric components are positioned, one by one, at the component-supply portion of the each unit; a table displacing device which displaces the displaceable table and thereby positions the component-supply portion of the each component-supply unit, at a predetermined component-supply position; at least one drive member which is provided near the component-supply position; at least one drive device which drives the drive member which in turn drives the driven member of the each component-supply unit; at least one drive-member returning device which permits, in a state in which the drive member is engaged with the driven member of the each component-supply unit being displaced with the displaceable table, the drive member to be displaced with the driven member being displaced and, in a state in which the drive member is away from the driven member, returns the drive member to a reference position thereof. In the present EC supplying apparatus, when the displaceable table is displaced and the component-supply units are displaced, the drive member is moved with the driven member of each component-supply unit being displaced, while being engaged with the driven member. Thus, at least a portion of at least one of the carrier-tape feeding operation and the tape-feed preparing operation is performed while the component-supply units are displaced. The movement of the drive member with the driven member is permitted by the drive-member returning device. In the state in which the drive member is away from the driven member after having driven the driven member, the returning device returns the drive member to its reference position where the drive member can engage the driven member of another component-supply unit. The reference position may be a position aligned with the component-supply position as seen in the reference direction, or a position away upstream or downstream from the component-supply position as seen in the reference direction. The present EC supplying apparatus enjoys the same advantages of the EC supplying method according to the first feature (1) of the present invention.

(3) According to a third feature of the present invention that includes the second feature (2), the drive-member returning device comprises a drive-member holder which holds the drive member such that the drive member is movable in a direction intersecting the reference direction; a guide device which guides the drive-member holder in a direction parallel to the reference direction; and a biasing device which biases the drive-member holder toward the reference position of the drive member. The drive member drives the drive member so that the drive member is moved in a direction intersecting the reference direction so as to be engaged, and disengaged from, the driven member. In the state in which the drive member is engaged with the driven member, the drive member is displaced with the driven member being displaced, and the drive-member holder is also displaced with the drive member being displaced with the driven member. In the state in which the drive member is away from the driven member, the biasing device biases the drive-member holder so that the holder is displaced in a direction opposite to the direction in which the holder is displaced with the drive member being displaced with the driven member, so that the drive member and the drive-member holder are returned to the reference position of the drive member.

(4) According to a fourth feature of the present invention that includes the third feature (3), the biasing device comprises a pair of biasing members which apply, to the drive-member holder, respective elastic forces in opposite directions, so that the drive-member holder is allowed to move in each of the opposite directions. The displaceable table is displaced in the reference direction parallel to the line along which the respective component-supply portions of the component-supply units are arranged, so that the respective component-supply portions of the units may be sequentially positioned at the component-supply position where each of the units supplies one or more ECs. The displaceable table may be displaced in such a manner that after all the component-supply units that are pre-selected from all the units on the displaceable table to supply ECs in one EC-supplying operation have finished supplying the ECs, the displaceable table is returned, at a stroke, to its supply-start position where the next EC-supplying operation is to be started. Otherwise, the displaceable table may be displaced in such a manner that the pre-selected component-supply units supply ECs not only while the displaceable table is displaced forward but also while the table is displaced backward. In the latter case, both while the displaceable table is displaced forward and while the table is displaced backward, the respective component-supply portions of the pre-selected units are sequentially positioned at the component-supply position where each of the units supplies one or more ECs. The order of the sorts of the ECs supplied during the backward displacement of the table is reverse to that of the sorts of the ECs supplied during the forward displacement of the table. Moreover, the displaceable table may be displaced such that the table is alternately displaced forward and backward two or more times in one EC-supplying operation. Furthermore, the displaceable table may be displaced in such a manner that while it is taken as a general rule that the pre-selected units supply ECs only while the table is displaced forward, the table is allowed to displace backward only in special cases, such as when one unit fails to supply one or more ECs, so that another unit which has finished supplying one or more ECs can supply one or more ECs in place of the one unit. In the present EC supplying apparatus, the pair of biasing members apply, to the drive-member holder, respective biasing forces in opposite directions, so that the drive-member holder is allowed to move in each of the opposite directions. Therefore, even if the displaceable table may be displaced forward and backward for supplying ECs, the drive member can be moved with the driven member of each of the component-supply units, so that the carrier tape can be fed while the units are displaced with the displaceable table.

(5) According to a fifth feature of the present invention that includes the fourth feature (4), the drive-member returning device further comprises a pair of movable members which are biased toward respective stop positions by the pair of biasing members, and wherein a slight space is left between the drive-member holder and each of the pair of movable members that is positioned at the stop position thereof. Each of the two movable members cannot be moved over the stop position thereof, but can be moved, against the biasing force of a corresponding one of the two biasing members, in a direction opposite to the direction in which the each movable member is biased by the one biasing member. Therefore, when the drive member being engaged with the driven member is displaced with the driven member, one of the two movable members that is biased by one biasing member against the biasing force of which the drive-member holder is moved, is moved with the drive-member holder, and the other movable member is held at the stop position thereof. In the state in which the drive member is away from the driven member, the one movable member is moved toward the stop position thereof against the biasing force of the one biasing member, so that the drive-member holder is returned to the reference position of the drive member in a direction opposite to the direction in which the drive member engaged with the drive member is moved with the driven member. After the one movable member is moved to its stop position, the drive-member holder is held at the reference position. In the present EC supplying apparatus, the drive-member holder can be stopped at the reference position more quickly and accurately than in the case where the holder is stopped at the reference position by the balance of the respective biasing forces of the two biasing members. That is, the drive member can be more quickly prepared for engaging the driven member of another component-supply unit.

(6) According to a sixth feature of the present invention that includes the fifth feature (5), the drive-member returning device further comprises an engageable member which is different from the drive member and which is supported by the drive-member holder such that the engageable member is movable to an engaging position where the engageable member engages an engageable portion of the each component-supply unit and to a retracted position where the engageable member does not engage the engageable portion; and an engageable-member moving device which moves the engageable member to each of the engaging position and the retracted position. Usually, the engageable member is positioned at its retracted position. However, when the drive member is engaged with the driven member of one component-supply unit, the engageable member is moved to its engaging position where the engageable member engages the one unit. Thus, the drive member is forced to displace with the driven member because of the engagement of the engageable member and the one unit and the connection of the engageable member and the drive-member holder. Since the drive member is stably engaged with the driven member, the drive member can surely drive the driven member while being displaced with the driven member. The engageable member may be one which is formed as an integral portion of the drive member held by the drive-member holder, or one which is directly supported by the drive-member holder, independent of the drive member.

(7) According to a seventh feature of the present invention that includes any one of the second to sixth features (2) to (6), the drive-member returning device comprises a drive-member holder which holds the drive member such that the drive member is movable in a direction intersecting the reference direction; a guide device which guides the drive-member holder in a direction parallel to the reference direction; a detector which is provided on the drive-member holder and which detects a detectable portion of the each component-supply unit; and a holder moving device which includes a drive source and which moves the drive-member holder such that the detector continues to detect the detectable portion of the each component-supply unit. The detector may be one of various known switches or sensors, such as a limit switch, a proximity switch, a transmission-type or reflection type photoelectric sensor. The detectable portion of each component-supply unit may be provided depending upon the specific sort of the detector. The drive source may be provided by a compliance which is electrically controllable, such as an electric motor. Based on an output from the detector which is detecting the detectable portion, the drive-member holder is forced to move with each component-supply unit. Since the drive member is stably engaged with the driven member, the displacement of each unit and the feeding of the carrier tape on each unit surely occur concurrently with each other.

(8) According to an eighth feature of the present invention that includes any one of the second to seventh features (2) to (7), the electric-component supplying apparatus comprises two drive members and two drive-member returning devices which return the two drive members to respective reference positions thereof, the two drive members alternately driving the respective driven members of the component-supply units. Since the present EC supplying apparatus includes the two drive members and the two driven-member returning devices, the two drive members may be alternately engaged with the respective driven members of the component-supply units whose component-supply portions are sequentially positioned at the component-supply position. In this case, the two drive members alternately drive the respective driven members of the units. Therefore, it is possible to increase a cyclic operation time during which each drive member is displaced with the driven member from the reference position of each drive member and is returned to the reference position. For example, in the EC supplying apparatus according to the above-indicated third feature (3) wherein the drive-member holder is returned to the reference position by the biasing device, the biasing device may be one which has a small biasing force only. In this case, each drive member can be surely moved with the driven member. On the other hand, if the biasing device is one which has a great biasing force, a great resistance is produced when each drive member is displaced with the driven member and the drive-member holder is moved against the biasing force of the biasing device. In this case, the displacement of each drive member with the driven member may be obstructed. If the present EC supplying apparatus employs the biasing devices each of which has a small biasing force, only a small resistance is produced, which permits each of the drive members to be surely moved with the driven member. The guide device which guides the drive-member holder may be one which includes a guided member provided with a rolling member such as a ball, and a guide member which is engaged with the guided member via the rolling member and which guides the guided member. In this case, the resistance produced when the drive-member holder is moved is further reduced, so that the holder can be more lightly moved and accordingly the drive member can be more reliably moved with the driven member.

(9) According to a ninth feature of the present invention that includes any one of the second to eighth features (2) to (8), the drive device comprises a first drive device including a first drive source, and a second drive device including a second drive source independent of the first drive source. In the present EC supplying apparatus, the carrier tape can be fed based on the drive member being driven by each of the first and second drive devices. Whether the first or second drive device is operated may depend on the specific sort of the carrier tape to be fed, and/or the conditions of their peripheral devices. Both the first and second drive devices may be used for feeding the same sort of carrier tape under the same conditions of their peripheral devices.

(10) According to a tenth feature of the present invention that includes the ninth feature (9), the first drive device further comprises a cam mechanism including a rotary cam which is rotated by the electric motor, and a cam follower which follows the rotary cam, and the second drive source comprises a fluid-pressure-operated cylinder device. In the first drive device, the timings at which the drive member is engaged with, and disengaged from, the driven member, and the velocity at which the drive member is moved are defined by the shape of the rotary cam. In the second drive device, the fluid-pressure-operated cylinder device can drive the drive member a desired number of times at respective desired timings. The rotary cam of the cam mechanism of the first drive device may be so shaped as to be able to use, as the drive source thereof, the electric motor which is also used as a drive source of another device, while assuring that the drive member is engaged with, and disengaged from, the driven member at desired timings. Otherwise, the rotary cam may be so shaped as to be able to start and stop the movement of the drive member without producing vibration.

(11) According to an eleventh feature of the present invention that includes any one of the second to tenth features (2) to (10), the drive device comprises a rotary cam; a cam follower which follows the rotary cam; a fluid-pressure-operated actuator including an operative portion which is movable in a first direction in which the operative portion presses the cam follower against the rotary cam, and in a second direction in which the operative portion moves the cam follower away from the rotary cam; a valve device which changes a direction in which a working fluid is supplied to the fluid-pressure-operated actuator and thereby switches the movement of the operative portion to one of the first and second directions. The valve device may be one which includes a single solenoid-operated valve, or one which includes a plurality of shut-off valves. In the state in which the cam follower is pressed against the rotary cam, the cam follower follows the rotary cam, so that the drive member is engaged with, and disengaged from, the driven member. In the case where the drive member is not used to drive the driven member for some reason, the fluid-pressure-operated actuator is switched to the second direction, so that while the rotary cam continues to rotate, the cam follower does not follow the rotary cam and the drive member does not drive the driven member. That is, the rotation of the rotary cam may not be transmitted to the drive member, without having to stop the rotation of the electric motor. For example, in the case where the drive device shares, with another device, an electric motor as a drive source which drives the rotary cam, the drive member can be prevented from driving the driven member, without having to stop the operation of the another device that involves the operation of the electric motor. The fluid-pressure-operated actuator functions as not only a following-causing device which causes the cam follower to follow the rotary cam but also a stopping device which stops the cam follower from following the rotary cam.

(12) According to a twelfth feature of the present invention that includes any one of the second to eleventh features (2) to (11), the driven member includes a flat driven portion parallel to the reference direction, and the drive member includes a flat drive portion which is perpendicular to the reference direction and the flat driven portion. The flat drive and driven portions can be easily produced, and the drive portion can be surely engaged with the flat driven portion because the flat driven portion has a great area.

(13) According to a thirteenth feature of the present invention, there is provided an electric-component mounting apparatus comprising a component-supply table including a displaceable table which is displaceable in a reference direction, and a plurality of component-supply units which are provided on the displaceable table such that respective component-supply portions of the units are arranged along a line parallel to the reference direction, each of the component-supply units including a driven member and a carrier-tape feeding device which feeds, based on the driven member being driven, a carrier tape carrying a plurality of electric components at a predetermined component-carry pitch, at a tape-feed pitch equal to a quotient obtained by dividing the component-carry pitch by an integral number, so that the electric components are positioned, one by one, at the component-supply portion of the each unit; a table displacing device which displaces the displaceable table and thereby positions the component-supply portion of the each component-supply unit, at a predetermined component-supply position; a circuit-substrate holding device which holds a circuit substrate on which electric components are to be mounted; a plurality of component holders which hold respective electric components; a holder revolving device which revolves the component holders about an axis line perpendicular to the reference direction, and sequentially positions the component holders at a component-receive position opposed to the component-supply position; a component-reception control device which controls the holder revolving device and each of the component holders such that the each component holder receives, while being positioned at the component-receive position, an electric component from the component-supply portion of the each component-supply unit being positioned at the component-supply position; a component-mounting control device which controls the holder revolving device and the each component holder such that the each component holder mounts, while being opposed to the circuit substrate held by the circuit-substrate holding device, the electric component on the circuit substrate; at least one drive member which is provided near the component-supply position; at least one drive device which drives the drive member which in turn drives the driven member of the each component-supply unit; at least one drive-member returning device which permits, in a state in which the drive member is engaged with the driven member of the each component-supply unit being displaced with the displaceable table, the drive member to be displaced with the driven member being displaced and, in a state in which the drive member is away from the driven member, returns the drive member to a reference position thereof. Each of the component holders may be one which holds an EC by applying a negative pressure (or a vacuum) thereto, or one which includes a plurality of grasping members which can be opened and closed to hold an EC. The holder revolving device may be one which includes an intermittent-rotation body which is intermittently rotatable about an axis line, and a drive device which intermittently rotates the body. In this case, the plurality of component holders may be provided on the intermittent-rotation body such that the holders are equiangularly spaced from each other about the axis line at a predetermined spacing-angle pitch equal to a predetermined rotation-angle pitch at which the body is intermittently rotated about the axis line. As the body is intermittently rotated, the holders are sequentially moved to the component-receive position and a component-mount position where each of the holders mounts an EC on the circuit substrate. The axis line about which the body is intermittently rotated may be a vertical axis line or an axis line inclined with respect to a vertical plane. The plurality of component holders may be mounted on a rotatable body which is rotatable about an axis line by any desired angle in each of opposite directions. In this case, the rotatable body may be mounted on a movable device such as an X-Y robot, so that each of the holders mounted on the rotatable body may be moved to any desired position based on the movement of the movable device and may receive or mount an EC at the desired position based on the rotation of the body. The holder revolving device may be one which includes a plurality of rotary members which are rotatable about a common axis line, independent of each other, and a rotary-motion applying device which applies a rotary motion to each of the rotary members such that the each rotary member is fully rotated about the common axis line, is stopped at least one time during the full rotation thereof, and has a predetermined time difference from the preceding or following rotary member. In this case, the plurality of component holders may be supported by the plurality of rotary members, respectively. In an EC mounting apparatus which employs the above-indicated holder revolving device including the plurality of rotary members, or in the EC mounting apparatus which is disclosed in the previously-identified Japanese document No. 6-342998, the cyclic operation time of each of the component holders is shortened for the purpose of improving the efficiency of mounting of ECs. In addition, according to the present feature (13), the displacement of each component-supply unit and the feeding of the carrier tape on the each unit concurrently occur. This feature greatly contributes to improving the efficiency of mounting of ECs. The present EC mounting apparatus may be combined with any one of the above-indicated features (2) to (12) of the EC supplying apparatus.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings in which.

DETAILED DESCRIPTION OF THE PREFERRED EMBODIMENTS

Figure 1:
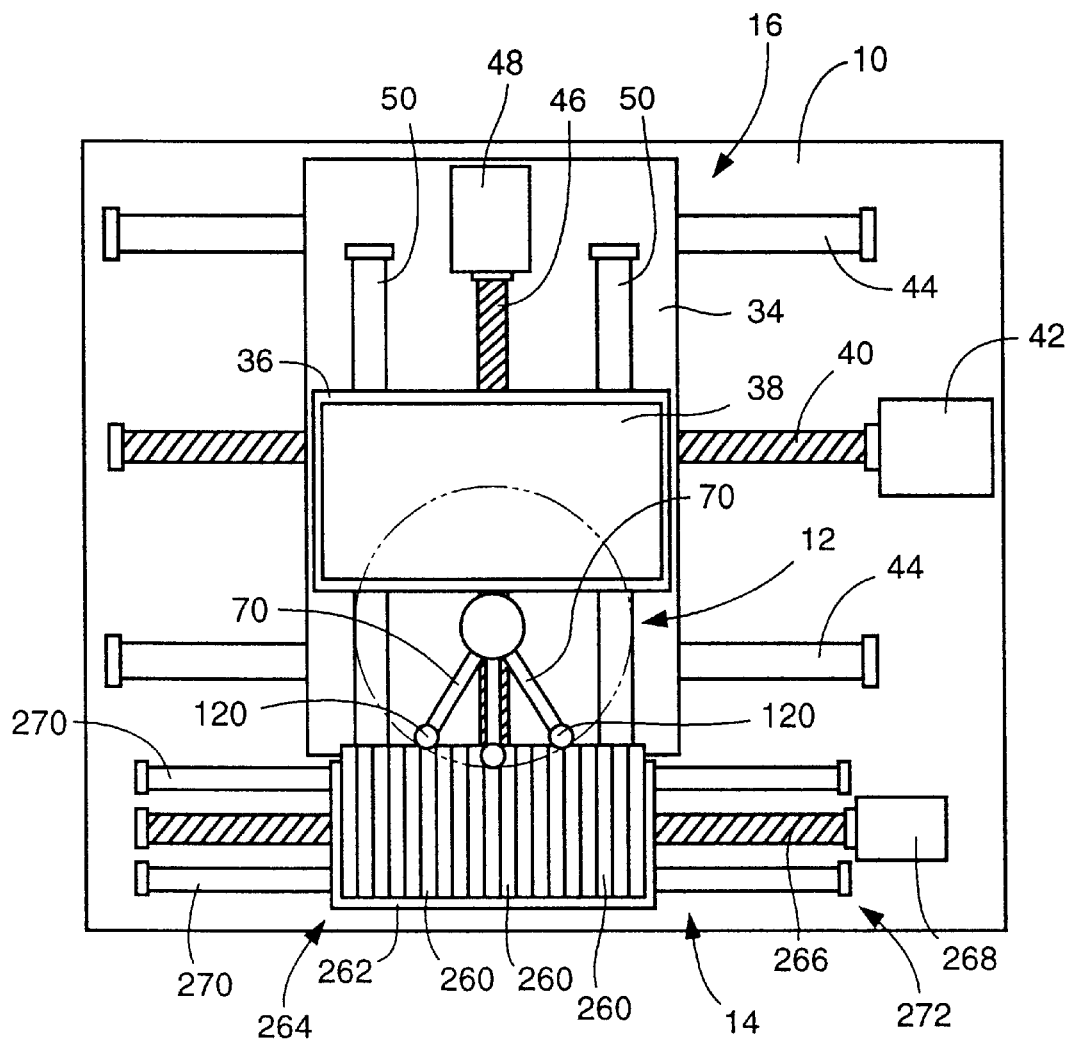
FIG. 1 is a schematic plan view of an electric-component ("EC") mounting system to which the present invention is applied.

Referring to the drawings, there will be described an electric-component ("EC") mounting system which embodies the EC mounting apparatus of the present invention. The EC mounting system includes an EC supplying apparatus 14 which embodies the EC supplying apparatus of the present invention and which carries out the EC supplying method of the present invention.

In FIG. 1, reference numeral 10 denotes a base on which are mounted an EC mounting device 12, an EC supplying apparatus 14, and an object supporting and positioning device in the form of a board supporting and positioning device 16. The board supporting and positioning device 16 includes an X-axis table 34 movable in an X-axis direction, and a Y-axis table 36 which is mounted on the X-axis table 34 and which is movable in a Y-axis direction which is perpendicular to the X-axis direction in a horizontal plane. The Y-axis table 36 has a board holding device (not shown) mounted thereon to position and hold an object in the form of a printed-circuit board 38. The X-axis table 34 is moved in the X-axis direction while it is guided by guide members in the form of straight guide rails 44 when a feed screw 40 is rotated by a drive source in the form of an X-axis servomotor 42. The Y-axis table 36 is moved in the Y-axis direction while it is guided by guide members in the form of straight guide rails 50 when a feed screw 46 is rotated by a drive source in the form of a Y-axis servomotor 48. With the X-axis table 34 and the Y-axis table 36 being moved in the horizontal plane, the printed-circuit board 38 is positioned such that a multiplicity of component-mount places on the board 38 are sequentially aligned with a predetermined component-mount position. The printed-circuit board 38 is conveyed in the X-axis direction by a carry-in conveyor and a carry-out conveyor (not shown) so that the board 38 is loaded and unloaded onto and from the board holding device.

The EC mounting device 12 is constructed in the same manner as that disclosed in Japanese Patent Application laid open for public inspection under Publication No. 9(1997)-237997 corresponding to U.S. patent application Ser. No. 08/907,882 assigned to the Assignee of the present application. Therefore, the construction of the mounting device 12 will be briefly described below.

Figure 2:
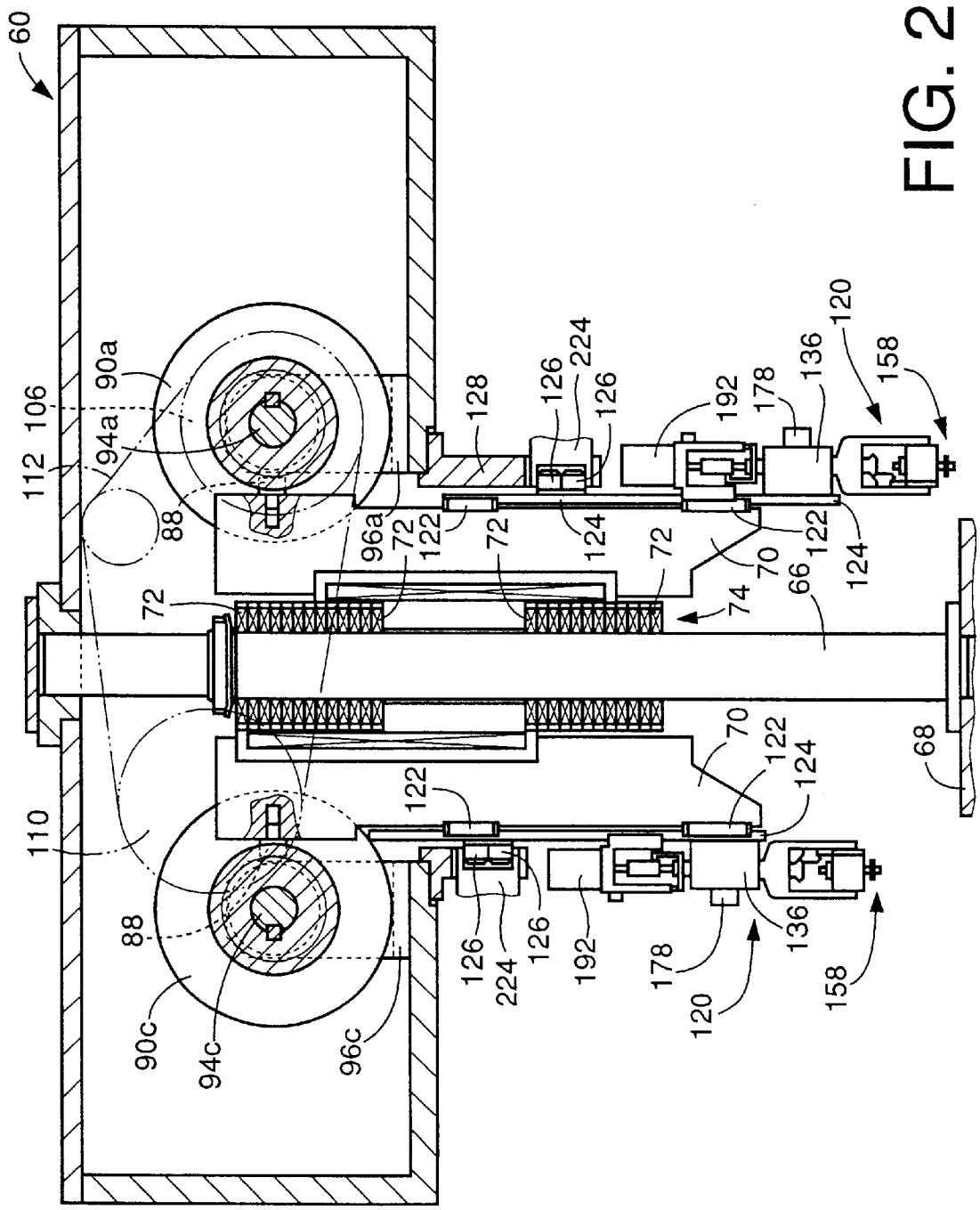
FIG. 2 is a partly cross-sectioned, side elevation view of a relevant portion of an EC mounting device of the EC mounting system of FIG. 1.

As shown in FIG. 2, the EC mounting device 12 has a main body including a frame 60, which is supported by support members (not shown) fixed to the base 10. A support shaft in the form of a stationary shaft 66 is fixed at its upper end to the frame 60. The lower end of the stationary shaft 66 is fixed to a support plate 68 secured to the base 10. Rotary members in the form of twelve rotary plates 70 are fixed to respective pairs of bearings 72, such that the rotary plates 70 are rotatable about an axis of the stationary shaft 66. This axis of the stationary shaft 66 serves as a common axis about which the rotary plates 70 are rotatable.

Figure 3:
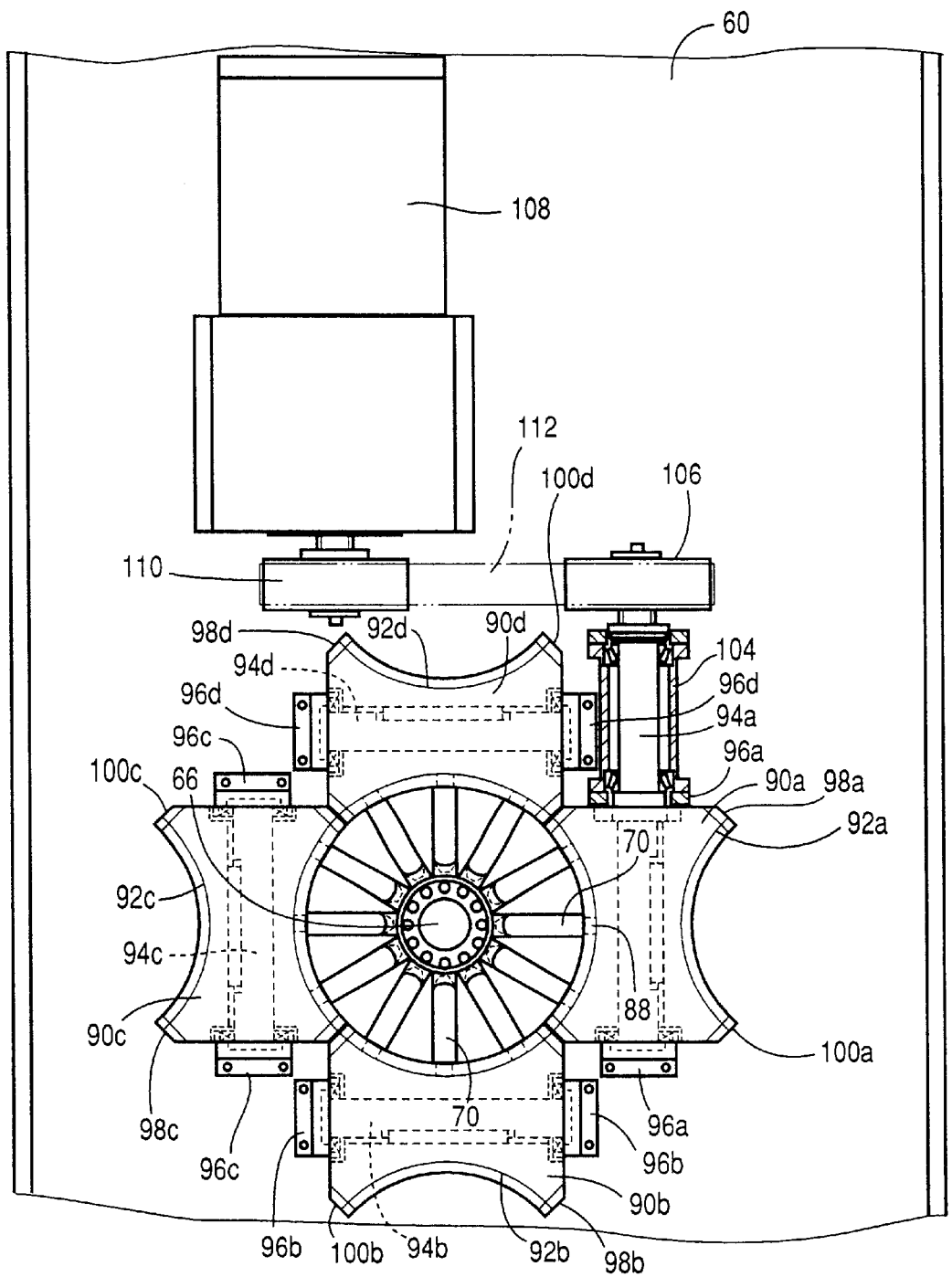
FIG. 3 is a plan view of the EC mounting device of FIG. 2.

As shown in FIG. 2, a cam follower in the form of a cam follower roller 88 is attached to a radial end of each rotary plate 70 remote from the stationary shaft 66, such that the roller 88 is rotatable about a horizontal axis extending in a radial direction of the stationary shaft 66. As shown in FIG. 3, the rollers 88 of the twelve rotary plates 70 are held in rolling engagement with cam grooves 92a, 92b, 92c, 92d formed in four concave globoidal cams 90a, 90b, 90c, 90d which are rotatably mounted on the frame 60. In the interest of brevity and simplification, the twelve rotary plates 70 are shown in FIG. 3 as positioned relative to each other such that the rotary plates 70 are evenly or equi-angularly spaced apart from one another about the stationary shaft 66.

The concave globoidal cams 90a, 90b, 90c, 90d are fixedly mounted on respective rotary shafts 94a, 94b, 94c, 94d, as shown in FIG. 3. The rotary shafts 94 are rotatably supported by respective pairs of brackets 96a, 96b, 96c, 96d fixed to the frame 60. The four concave globoidal cams 90a–90d have respective pairs of bevel gears 98a, 100a, 98b, 100b, 98c, 100c, 98d, 100d. The bevel gears 98, 100 of each globoidal cam 90 are formed integrally and coaxially with the cam 90, at the axially opposite ends. The bevel gears 98, 100 of the adjacent concave globoidal cams 90a–90d are held in meshing engagement with each other.

Figure 5:
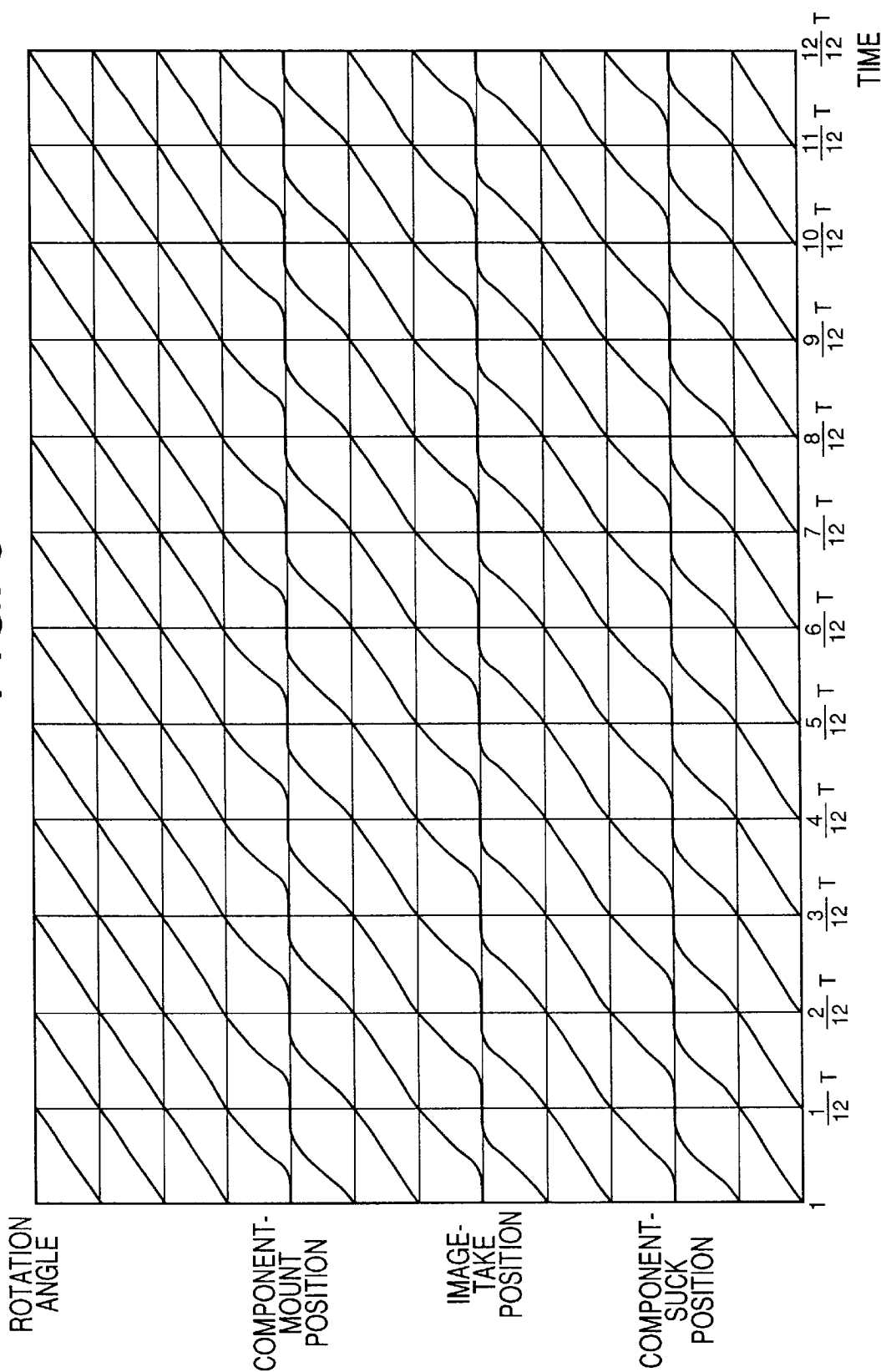
FIG. 5 is a time chart showing a relationship between time and the rotation angle of each of twelve rotary plates of the EC mounting device of FIG. 2.

The rotary shaft 94a to which the concave globoidal cam 90a is attached has a larger axial length than the other rotary shafts 90b–94d, and is rotatably supported also by another bracket 104 fixed to the frame 60, as shown in FIG. 3. At the free end of the rotary shaft 94a, there is fixed a timing pulley 106, which is connected by a timing belt 112 to a timing pulley 110 fixed to an output shaft of a main drive source in the form of an electrically operated main servomotor 108. When the rotary shaft 94a is rotated by the main servomotor 108, the four concave globoidal cams 90 are contemporaneously rotated in synchronism with one another, with the bevel gears 98a–98d, 100a–100d mashing with one another. The twelve rotary plates 70 are respectively accelerated, decelerated, rotated at a constant angular velocity, and stopped, as indicated in the time chart of FIG. 5.

In the present EC mounting device 12, the rotary plates 70 are stopped at a component-suck station, an image-take station and a component-mount station. In these stations, there are set a component-suck position, an image-take position and the component-mount position, respectively. At the component-suck position, the EC mounting device 12 receives ECs from the EC supplying apparatus 14 which is located on the base 10, at a position corresponding to the vicinity of the component-suck position. A CCD (charge coupled device) camera 114 (shown in FIG. 20) is located on the base 10, at a position corresponding to the vicinity of the image-take position, while the board supporting and positioning device 16 is located on the base 10, at a position corresponding to the vicinity of the component-mount position.

The concave globoidal cam 90a is located at a position corresponding to the vicinity of the component-mount position, the concave globoidal cam 90c is located at a position corresponding to the vicinity of the component-suck position, and the concave globoidal cam 90d is located at a position corresponding to the vicinity of the image-take position, while the concave globoidal cam 90b is located at a position which is between the component-mount position and the component-suck position and which is opposite to the image-take position. Each of the twelve rotary plates 70 carries a component-holding head 120 (shown in FIG. 2). The head 120 sucks an EC at the component-suck position, and mounts the EC on the printed-circuit board 38 at the component-mount position. At the image-take position, an image of the EC sucked and held by the head 120 is taken by the CCD camera 114. The rotary plate 70 is stopped at the component-suck position, the image-take position, and the component-mount position in the order of description. While the rotary plate 70 is rotated by 90°, from the component-suck position to the image-take position or from the image-take position to the component-mount position, the rotary plate 70 is accelerated, rotated at a constant angular velocity, and then decelerated. While the rotary plate 70 is rotated by 180°, from the component-mount position to the component-suck position, the rotary plate 70 is rotated at a constant velocity. The cam grooves 92a, 92b, 92c, 92d of the cams 90a, 90b, 90c, 90d are formed or shaped so that the rotary plates 70 are held stopped at the component-suck and component-mount positions and the image-take position, and are accelerated, rotated at the constant angular velocity, and then decelerated toward and from those three positions, as described above. The twelve rotary plates 70 are rotated independent of one another. When three component-holding heads 120 mounted on three rotary plates 70 are respectively held stopped at the component-suck and component-mount positions and the image-take position, the other rotary plates 70 are being rotated.

Each of the rotary plates 70 has guide members in the form of a pair of guide blocks 122 fixed thereto such that the guide blocks 122 are spaced apart from each other in the vertical direction, as shown in FIG. 2. A movable member in the form of a vertical slide 124 is engaged with the guide blocks 122 such that the vertical slide 124 is vertically movable. To an upper part of the vertical slide 124, there are attached cam followers in the form of two cam follower rollers 126 such that each of the rollers 126 is rotatable about an axis line extending in a radial direction of the stationary shaft 66. To a lower part of the vertical slide 124, there is attached the component-holding head 120.

A stationary cylindrical cam 128 is fixed to the underside of the frame 60, in coaxial relationship with the stationary shaft 66. The cam follower rollers 126 indicated above are held in rolling engagement with a cam groove (not shown) formed in the inner circumferential surface of the cylindrical cam 128. The cam groove has a height-varying portion whose height (in the axial direction of the shaft 66) gradually varies in the circumferential direction of the cam 128, and a level portion whose height is constant in the circumferential direction. The cam groove is formed such that each component-holding head 120 is placed at its upper stroke end when the rotary plate 70 is positioned at the component-suck position, is placed at its lower stroke end when the rotary plate 70 is located at the component-mount position, and is moved in a horizontal plane when the rotary plate 70 is rotated around each of the component-suck and component-mount positions and the image-take position. In the present arrangement, the vertical slide 124 is moved up and down so that the component-holding head 120 is moved in the vertical direction, when the cam follower rollers 126 are moved in rolling engagement with each of the height varying portions of the cam groove by the rotation of the rotary plate 70. The EC supplying apparatus 14 is located at a position higher than the board supporting and positioning device 16.

Figure 4:
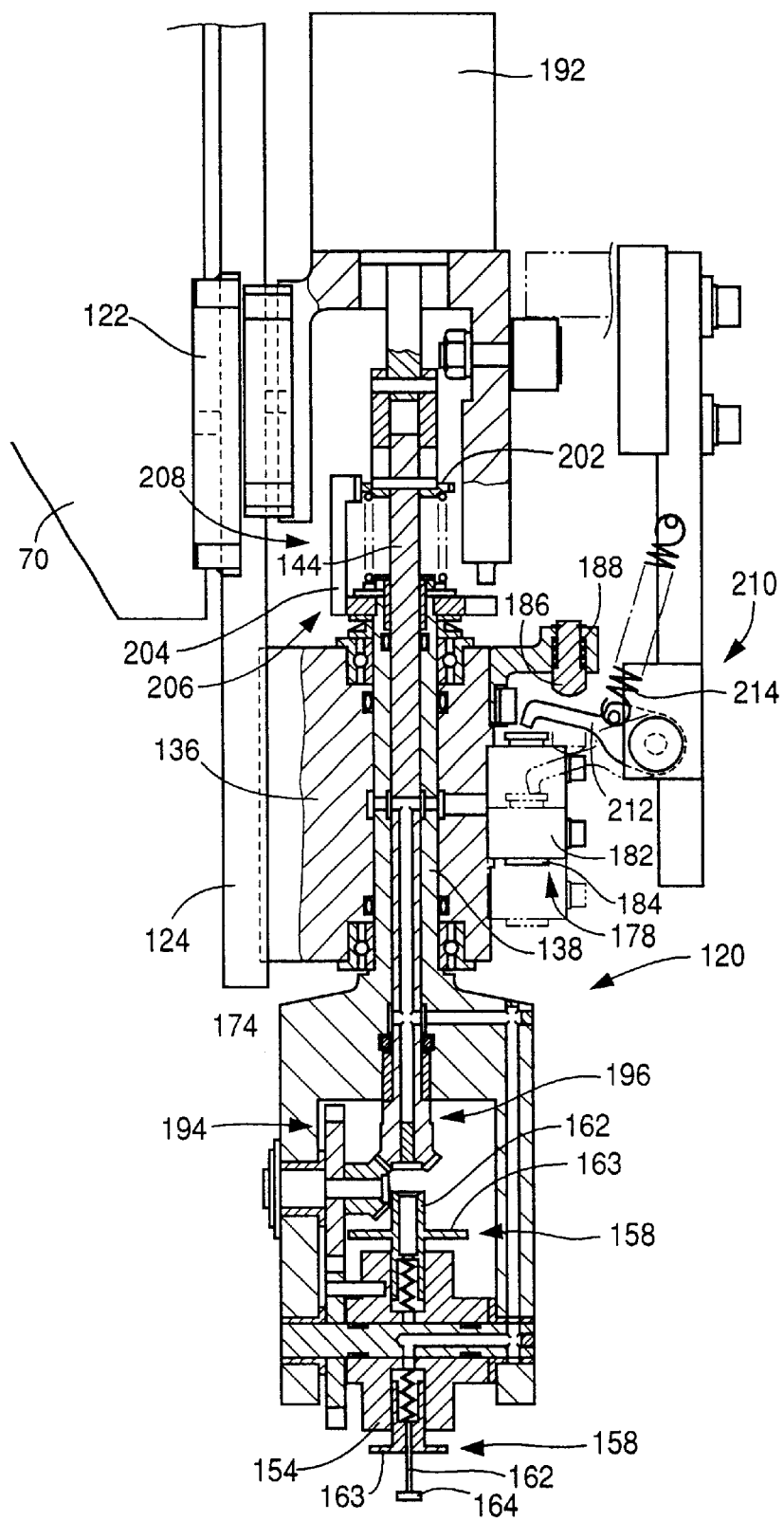
FIG. 4 is a partly cross-sectioned, side elevation view of an EC-holding head of the EC mounting device of FIG. 2.

Each of the twelve component-holding heads 120 has component holders in the form of six suction nozzles 158. (In FIG. 2, only two suction nozzles 158 are shown.) As shown in FIG. 4, a bracket 136 is fixed to the lower end portion of the vertical slide 124, and a sleeve or hollow shaft 138 is supported by the bracket 136 such that the sleeve shaft 138 is rotatable relative to the bracket 136 and is axially immovable relative the bracket 136. The sleeve shaft 138 carries a cylindrical nozzle holder 154 such that the nozzle holder 154 is rotatable about a horizontal axis. The sleeve shaft 138 holds the six suction nozzles 158 on a circumference whose center is the rotation axis of the nozzle holder 154. The six suction nozzles 158 are provided for sucking up ECs having respective different sizes. The suction nozzles 158 have respective suction tubes 162 having respective different diameters. Each of the suction nozzles 158 has a reflector plate 163. The diameter of the reflector plates 163 of the suction nozzles 158 whose suction tubes 162 have the three smaller diameters is smaller than that of the reflector plates 163 of the suction nozzles 158 whose suction tubes 162 have the three larger diameters.

Each of the suction nozzles 158 is adapted to hold an EC 164 by air suction. A switching device 178 is switched so that the suction nozzle 158 being placed at an operating position is communicated selectively with a vacuum source in the form of a vacuum pump 180 (shown in FIG. 20) or the atmosphere. Thus, each nozzle 158 holds and releases the EC 164. The switching device 178 has a housing 182 and a switching member 184 which is provided in the housing 182 such that the switching member 184 is vertically movable. By the movement of the switching member 184, the switching device 178 is selectively switched to a vacuum position at which vacuum (i.e., negative pressure) is supplied to the suction nozzle 158 and an atmosphere position at which the suction nozzle 158 is communicated with the atmosphere. The switch member 184 is adapted to be held at each of the vacuum position (which corresponds to a lower stroke end of the axial movement of the switch member 184) and the atmosphere position (which corresponds to an upper stroke end of the axial movement of the switch member 184). An auxiliary switching member 186 is vertically movably attached to the bracket 136, for switching the switching device 178. The auxiliary switching member 186 is biased downward by biasing means in the form of an elastic member in the form of a compression coil spring 188.

The vacuum pump 180 is connected though a conduit (not shown) to a passage (not shown) formed though the stationary shaft 66, and this passage is connected through a rotary valve (not shown) to the twelve switching devices 178 through respective hoses (not shown). The rotary valve is disposed at a portion of the stationary shaft 66 which portion is lower than the bearings 72. A rotary motion of a valve drive servomotor (not shown) disposed on the support plate 68 is transmitted to the rotary valve through a timing pulley and a timing belt, so that the rotary valve is constantly rotated at the same angular velocity as that of the constant-velocity movement of the rotary plates 70, whereby the switching devices 178 are held connected to the vacuum pump 180. While each of the rotary plates 70 is stopped, the corresponding switching device 178 and the rotary valve are rotated by a small angle relative to each other. This relative rotation is permitted by the elastic deformation of the corresponding hose.

The suction nozzle holder 154 is rotated about a horizontal axis, by a nozzle rotating and selecting servomotor 192, an inner shaft 144 and a nozzle selecting device 196. The inner shaft 144 fits in the sleeve shaft 138 such that the inner shaft 144 is rotatable and is axially immovable relative to the sleeve shaft 138. The nozzle selecting device 196 includes a rotation transmitting device 194 having a bevel gear and a gear. The six suction nozzles 158 are selectively placed at the operating position by rotation of the nozzle holder 154. When a selected one of the suction nozzles 158 is at the operating position, its axis extends in the vertical direction, and the free end of its suction tube 162 is located right below the sleeve shaft 138. The axis of the suction nozzle 158 placed at the operating position is aligned with the axis of the sleeve shaft 138. When each suction nozzle 158 is selected, the rotation of the sleeve shaft 138 is inhibited, and the nozzle holder 154 is rotated by the rotation of the inner shaft 144 relative to the sleeve shaft 138.

The nozzle holder 154 is rotated with the sleeve shaft 138 around the axis of the sleeve shaft 138, by the nozzle rotating and selecting servomotor 192 and a nozzle rotating device 208, such that the suction nozzle 158 placed at the operating position is rotated about the axis thereof. The nozzle rotating device 208 includes a drive member 202, a driven member 204, and a connecting and disconnecting device 206 which is selectively operated to connect or disconnect the rotary motion of the nozzle rotating and selecting servomotor 192 to and from the sleeve shaft 138.

As shown in FIG. 4, a switch operating device 210 is fixed to the frame 60 at the component-suck position. In FIG. 2, the switch operating device 210 is omitted. The switch operating device 210 includes a switch operating member in the form of a lever 212 which is pivotable about a horizontal axis which is perpendicular to the axis of the stationary shaft 66 and is tangent to the locus of rotation of the switching device 178 around the component-suck position. A free end of the lever 212 is biased upward by a biasing means in the form of an elastic member in the form of a tension coil spring 214, so that the free end of the lever 212 is rotated to, and held at, a predetermined position by a stopper member (not shown). The predetermined position is predetermined such that, when each component-holding head 120 is moved to the component-suck position by the rotation of the corresponding rotary plate 70, the free end of the lever 212 is placed between the auxiliary switching member 186 and the main switching member 184. When the component-holding head 120 is lowered by a head elevating and lowering device 220 (described later), the auxiliary switching member 186 engages the lever 212 so that the free end of the lever 212 is rotated downward. The distance of the downward movement of the free end of the lever 212 is predetermined to be larger than that of the downward movement of the auxiliary switching member 186 by the holding head 120. During the downward movement of the holding head 120, the lever 212 engages the switching member 184 so that the main switching member 184 is lowered, whereby the main switching device 178 is switched from the atmosphere position to the vacuum position. After the main switching member 184 has reached its lower stroke end by the lever 212, the bracket 136 continues to move downward. The amount of the downward movement of the bracket 136 after the switching member 184 has reached to its lower stroke end is absorbed by the movement of the auxiliary switching member 186 against the biasing force of the compression coil spring 188.

After the suction nozzle 158 holds the EC 164 by suction, the vertical slide 124, the bracket 136 and the component-holding head 120 are moved upward. Since the rotation of the rotary plate 70 starts during the upward movement of the nozzle 158, the slide 124 and the bracket 136, the auxiliary switching member 186 engaged with the lever 212 also starts to rotate. When the auxiliary switching member 186 disengages from the lever 212, the lever 212 is returned to the predetermined position by the tension coil spring 214, and waits for the next operation.

Another switch operating device (not shown) is provided on the frame 60 at the component-mount position. This switch operating device is operated to move the main switching member 184 from the vacuum position to the atmosphere position for mounting the EC 164 on the printed-circuit board 38.

The supplying of electric energy from a power source to the nozzle rotating and selecting servomotors 192 may be achieved by using a common slip ring. However, in the present embodiment, the electric energy is supplied by a no-contact electricity supplying device disclosed in, e.g., U.S. Pat. No. 5,588,195. The no-contact electricity supplying device includes twelve electricity suppliers and twelve electricity receivers for the twelve servomotors 192, respectively. The electricity suppliers are provided on the stationary shaft 66, and include respective supply-side coils each connected to the power source. The electricity receivers include respective receiver-side coils which are opposed to the supply-side coils with small clearances therebetween, and are rotated at a constant angular velocity together with the above-indicated rotary valve (not shown) employed for the supplying of vacuum, by the above-indicated valve drive servomotor (not shown). The receiver-side coils are connected via conductive lines to the nozzle rotating and selecting servomotors 192, so as to receive the electric energy supplied from the electricity suppliers.

Figure 6:
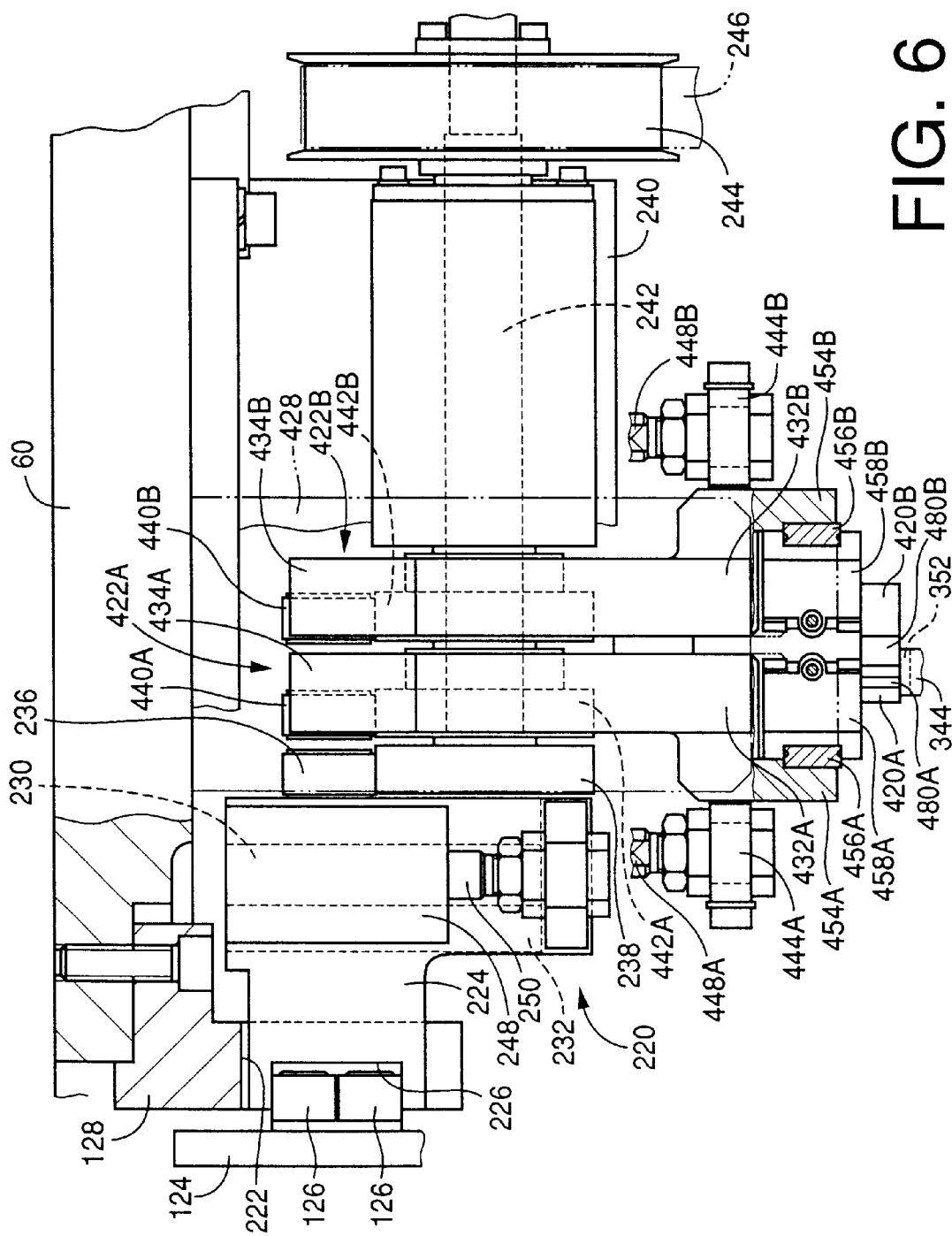
FIG. 6 is a partly cross-sectioned, side elevation view of a head elevating and lowering device of the EC mounting device of FIG. 2 and two first drive devices.

As shown in FIG. 6, the head elevating and lowering device 220 is provided on the frame 60 at the position corresponding to the vicinity of the component-suck position. Also, another head elevating and lowering device 220 (not shown) is provided on the frame 60 at the position corresponding to the vicinity of the component-mount position. Since the two head elevating and lowering devices 220 have substantially the same construction, the device 220 shown in FIG. 6 will be described below.

The stationary cylindrical cam 128 has a cutout 222 formed through the cam 128 in its radial direction, and a movable member in the form of a vertically movable member 224 can be received in the cutout 222. The cutout 222 opens downward. A horizontal groove 226 is formed in an inner surface of the movable member 224, and extends in a direction tangent to the locus of rotation of the rotary plate 70 around the component-suck position. The groove 226 has the same width (which is a dimension as seen in a direction parallel to the axis of rotation of the rotary plates 70) as that of the cam groove of the cam 128. When the movable member 224 is placed at its upper stroke end, the groove 226 is communicated with the cam groove, such that the groove 226 serves as part of the cam groove of the cylindrical cam 128.

Figure 7:
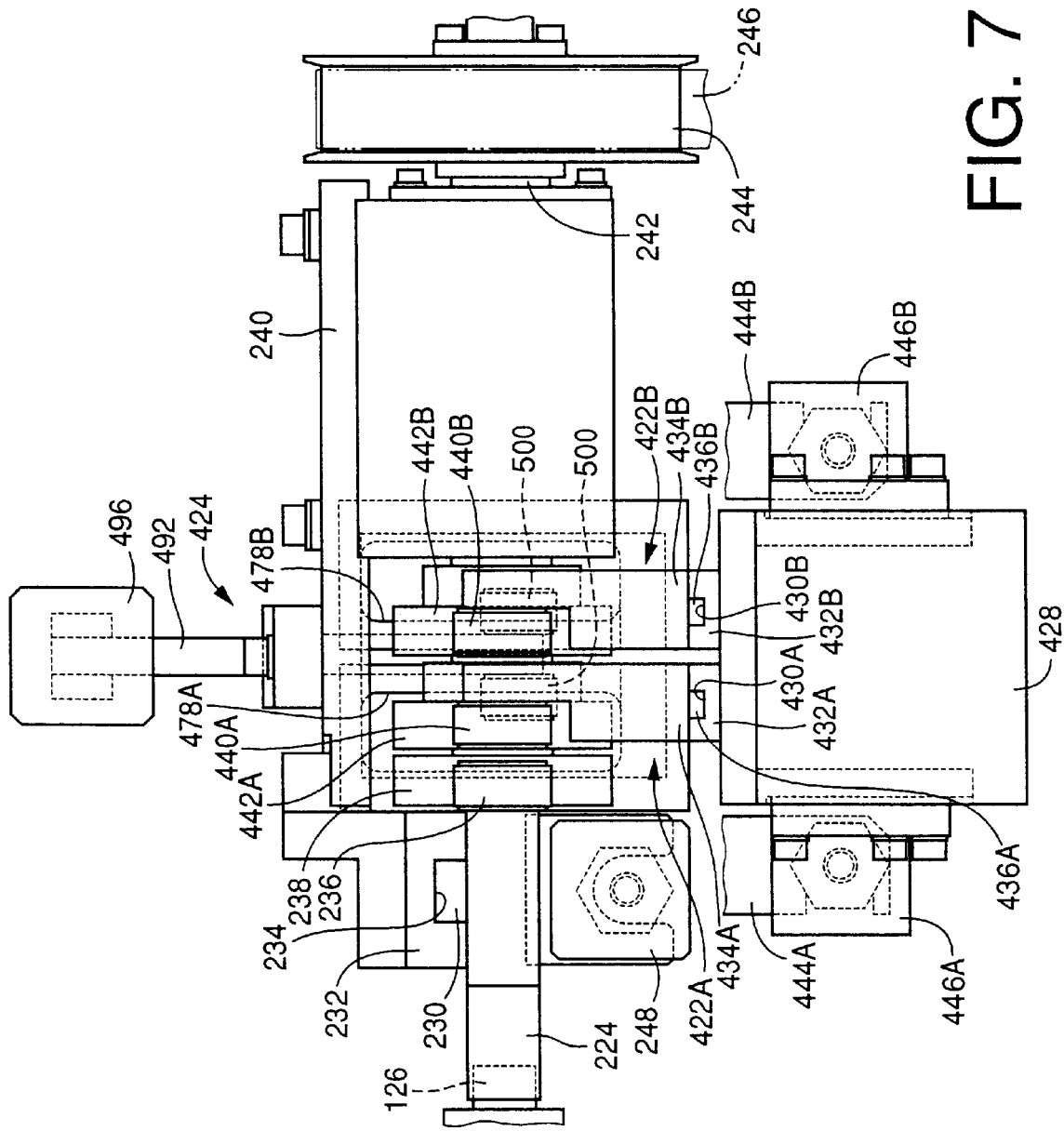
FIG. 7 is a plan view of the head elevating and lowering device of FIG. 6 and the first drive devices.

As shown in FIG. 7, a straight, guided member 230 which vertically extends is fixed to the movable member 224. The guided member 230 is vertically movably engaged with a groove 234 which is formed, in a vertical direction, in a guide member 232 fixed to the frame 60. A cam follower in the form of a roller 236 is fixed to the movable member 224 such that the roller 236 is rotatable around an axis perpendicular to the rotation axis of the rotary plates 70. The roller 236 follows a rotary cam in the form of a plate cam 238. The plate cam 238 is fixed, by a bracket 240 fixed to the frame 60, to a rotary shaft 242 which is rotatable about an axis perpendicular to the rotation axis of the rotary plates 70. The rotary shaft 242 is rotated, through a timing pulley 244 and a timing belt 246 which are associated with the rotary shaft 242, by the same servomotor 108 as used for rotating the globoidal cams 90a–90d.

The movable member 224 is fixed to a piston rod 250 of a fluid-pressure-operated actuator in the form of a fluid-pressure-operated cylinder in the form of an air cylinder 248. The air cylinder device 248 is fixed to the frame 60 by a bracket (not shown) such that the air cylinder is oriented downward. The air cylinder 248 which is a double acting cylinder is controlled by a solenoid-operated direction-control valve 252 (shown in FIG. 20), so that air is selectively supplied to one of two air chambers of the cylinder 248. By this selective air-supply operation, the air cylinder 248 is operated to move the movable member 224 in a first direction in which the roller 236 engages the plate cam 238 or in a second direction in which the roller 236 disengages from the plate cam 238. More specifically, with the air cylinder 248 being switched to the first direction, the roller 236 follows the plate cam 238 and the movable member 224 is moved up and down by the rotation of the plate cam 238. While the movable member 224 waits for sucking the EC 164, the movable member 224 is held at its upper stroke end, and allows the rollers 126 to be moved from the groove of the stationary cam 128 into the groove 226. After the rollers 126 are moved into the groove 226, the movable member 224 is vertically moved, so that the holding head 120 is vertically moved with the rollers 126 and the vertical slider 124.

The air cylinder 248 is normally operated to move the movable member 224 in the first direction so that the roller 236 follows the plate cam 238. With the air cylinder 248 being switched to the second direction, the movable member 224 is not vertically moved even if the plate cam 238 is rotated, so that the holding head 120 is not vertically moved. The air cylinder 248 is switched to the second direction in the case where the suction nozzle 158 does not suck the EC 164. In the case of the head elevating and lowering device 220 mounted at a position corresponding to the component-mount position, the air cylinder 248 is switched to the second direction in the case where the EC 164 is not mounted on the circuit-printed board 38 because the EC 164 sucked and held by the suction nozzle 154 is different from an EC which should be mounted on the circuit-printed board 38, or the suction nozzle 158 has failed to suck the EC 164. As indicated in the time chart of FIG. 21, the switching of the air cylinder 248 is carried out in the state in which the suction nozzle 158 has reached its upper stroke end and the roller 236 is engaged with a portion of the plate cam 238 which portion is the most distant from the center of rotation of the cam 238.

Next, the EC supplying apparatus 14 will be described.

As shown in FIG. 1, the EC supplying apparatus 14 includes an EC-supply table 264 which is provided by a plurality of EC-supply units 260 and a movable table 262 on which the EC-supply units 260 are mounted such that respective EC-supply portions of the units 260 are arranged along a straight line parallel to the X-axis direction. The movable table 262 is threadedly engaged with a feed screw 266 via a nut (not shown) and, when the feed screw 266 is rotated by a table moving servomotor 268 as a drive source, the movable table 262 is moved in the X-axis direction while being guided by a pair of straight guide rails 270 as guide members. Thus, the EC-supply portion of one of the EC-supply units 260 is positioned at an EC-supply position which is right below the suction nozzle 158 being positioned at the component-suck position. The nut (not shown), the feed screw 266, and the table moving servomotor 268 cooperate with one another to provide a table moving device 272.

Figure 8:
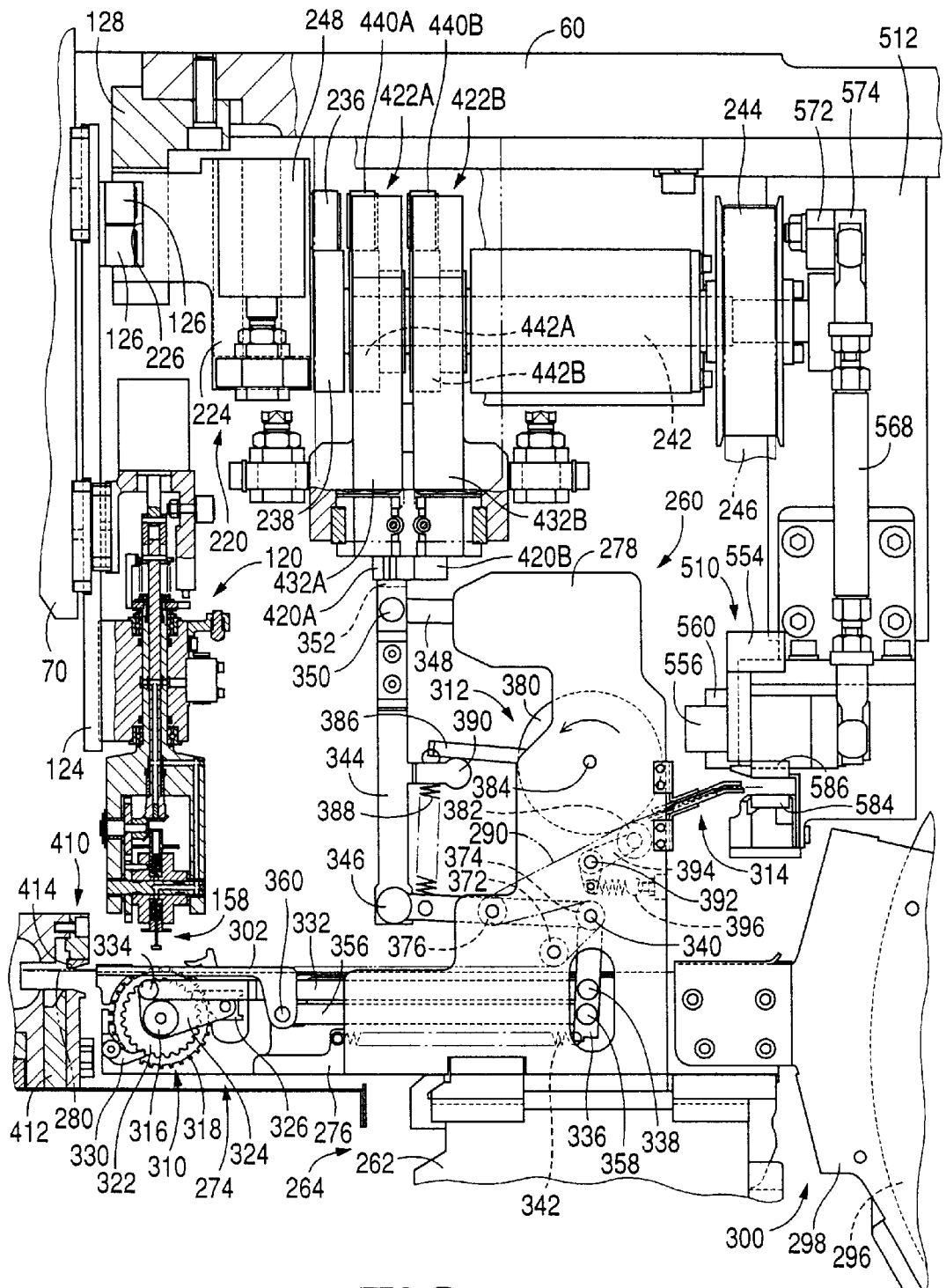
FIG. 8 is a partly cross-sectioned, side elevation view of a relevant portion of the EC mounting device of FIG. 2, an EC-supply unit, the first drive devices, and a cover-tape cutting device.

As shown in FIG. 8, each EC-supply unit 260 includes a main frame 274 which is provided, for the convenience of production, by a plurality of members fixed to each other and which includes a support frame 276 having a generally elongate, plate-like configuration and a bracket 278 fixed to the support frame 276. Each EC-supply unit 260 is positioned in its lengthwise direction and its widthwise direction (parallel to the X-axis direction) by a positioning device (not shown) provided on the movable table 262, and is fixed to the table 262 by a fixing device (not shown).

Figure 9:
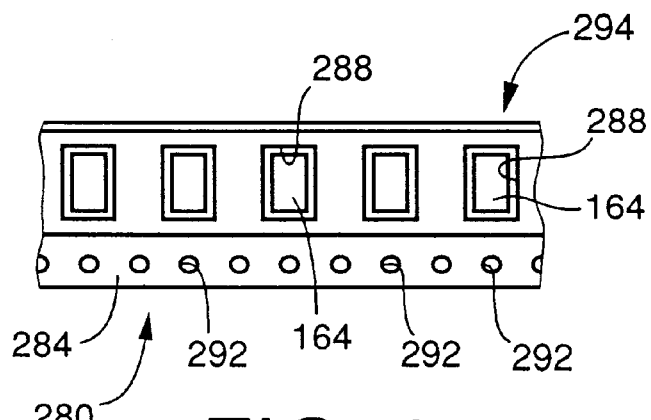
FIG. 9 is a plan view of an EC carrier tape which is supplied by the EC-supply unit of FIG. 8.
Figure 10:
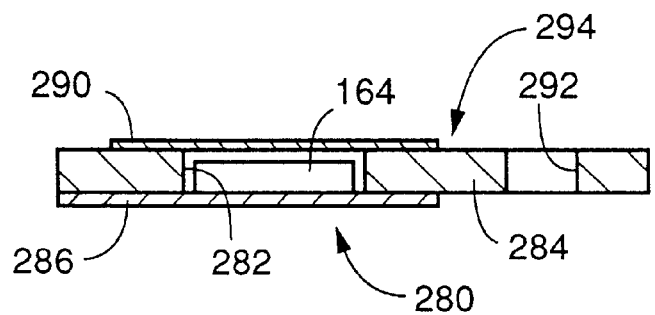
FIG. 10 is a cross-sectioned, side elevation view of the EC carrier tape of FIG. 9.

As shown in FIGS. 9 and 10, each EC-supply unit 260 supplies the ECs 164 in the form of an EC carrier tape 294. The EC carrier tape 294 includes an EC-accommodating tape 280, and a cover tape 290. The EC-accommodating tape 280 includes a paper tape 284 having a number of through-holes 282 formed at a predetermined pitch in its lengthwise direction; and a thin bottom film 286 adhered to a lower surface of the paper tape 284 to close respective lower openings of the holes 282. Thus, the EC-accommodating tape 280 has a number of EC-accommodating pockets 288 each of which opens upward and accommodates one EC 164. The respective upper openings of the EC-accommodating pockets 288 are closed by the cover tape 290 adhered to an upper surface of the paper tape 284. The paper tape 284 has a number of feed holes 292 formed at a predetermined pitch in its lengthwise direction. The EC carrier tape 294 is wound around a reel 296 shown in FIG. 8.

As shown in FIG. 8, each EC-supply unit 260 has a reel holding device 300 including a reel holder 298 and a reel-support axis member (not shown) as a support member. The reel 296 is held by the reel holder 298, and is supported by the reel-support axis member such that the reel 296 is rotatable about an axis line parallel to the X-axis direction. The EC carrier tape 294 drawn from the reel 296 is introduced to a front portion of the EC-supply unit 260 while being guided by a guide portion (not shown) of the support frame 276. In the front portion of the EC-supply unit 260, the tape 294 is covered by a cover member 302, so that the tape 294 is prevented from moving up out of the support frame 276.

On the support frame 276, there are provided a carrier-tape feeding device 310, a cover-tape peeling and feeding device 312, and a guide-passage defining member 314.

The carrier-tape feeding device 310 includes a sprocket 318 which is supported by an axis member 316 fixed to the support frame 276 such that the sprocket 318 is rotatable about a horizontal axis perpendicular to a direction in which the EC carrier tape 294 is fed, that is, a direction parallel to the lengthwise direction of the support frame 276, that is, the Y-axis direction perpendicular to the X-axis direction in the horizontal plane. Some teeth of the sprocket 318 are engaged with some of the feed holes 292 of the EC carrier tape 294.

A ratchet wheel 322 is attached to the sprocket 318 such that the ratchet wheel 322 is concentric with, and is not rotatable relative to, the sprocket 318.

The axis member 316 also supports a generally triangular pivotable plate 324 such that the plate 324 is pivotable about the axis member 316. A ratchet pawl 326 is attached to the pivotable plate 324 via a pin such that the ratchet pawl 326 is pivotable about the pin and such that the pawl 326 is biased by a spring (not shown) in a direction in which the pawl 326 engages one of the teeth of the ratchet wheel 322. When the pivotable plate 324 is pivoted forward (counterclockwise in FIG. 8), the ratchet pawl 326 remains engaged with one tooth of the ratchet wheel 322; and when the plate 324 is pivoted backward (clockwise in FIG. 8), the pawl 326 is moved over some teeth of the wheel 322.

A stopper lever 330 is attached to the support frame 276 such that the stopper lever 330 is pivotable about an axis member and such that the lever 330 is biased by a biasing device (not shown) in a direction in which the lever 330 engages one tooth of the ratchet wheel 322. The stopper lever 330 permits the forward rotation (the counterclockwise rotation in FIG. 8) of the ratchet wheel 322 but inhibits the backward rotation of the same 322.

One end portion of a tape drive plate 332 is pivotally connected to the pivotable plate 324 via a pin 334, and the other end of the tape drive plate 322 is pivotally connected to a drive lever 336 via a pin 338. The drive lever 336 is pivotally attached via an axis member 340 to the bracket 278 fixed to the support frame 276, and is biased, by a tension coil spring 342 which is provided between a lower end of the lever 336 and the support frame 276, in a direction in which the lever 336 is pivoted forward (clockwise in FIG. 8). The drive lever 336 is pivotally connected via a pin 346 to a lower end portion of a driven bar 344 as a driven member which extends vertically.

Figure 13:
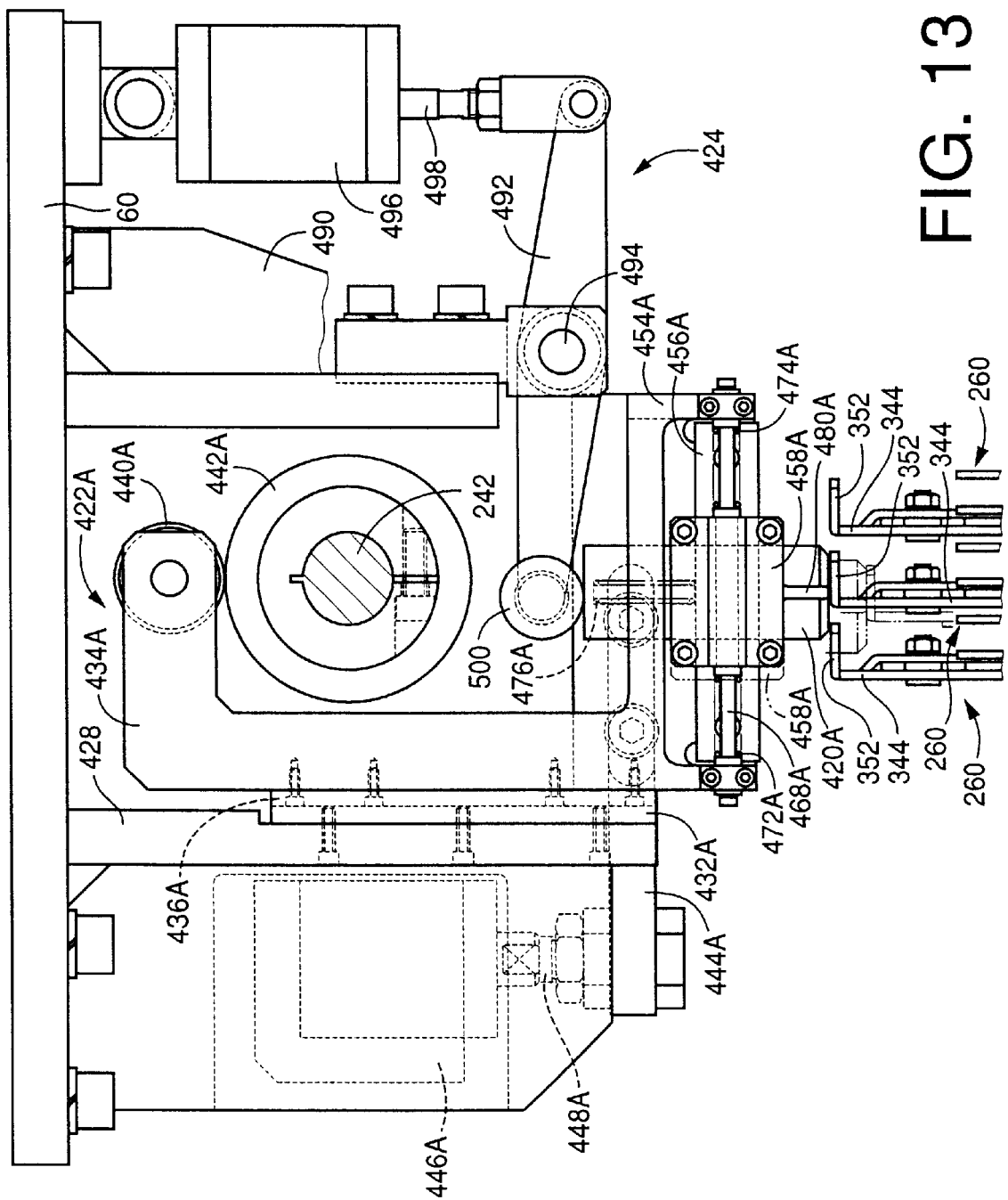
FIG. 13 is a front elevation view of one of the first drive devices and a corresponding one of the drive members.

An upper portion of the driven bar 344 is 25 pivotally connected via a pin 350 to one end portion of a link 348 the other end portion of which is pivotally attached to the bracket 278. The distance between the center of rotation of the link 348 relative to the bracket 278 and the axis of the pin 350 is equal to that between the axis of the axis member 340 and the axis of the pin 346, and the distance between the axis of the pin 350 and the axis of the pin 346 is equal to that between the center of rotation of the link 348 relative to the bracket 278 and the axis of the pin 340. Accordingly, the driven lever 344 is moved up and down while maintaining its vertical attitude. In addition, as shown in FIG. 13, the upper end portion of the driven bar 344 supports a horizontal plate-like driven tongue 352 as a driven portion.

The limit of forward pivotal motion of the drive lever 336 is defined by the butting of the ratchet pawl 326 against a stopper (not shown) provided on the support frame 276. Therefore, when the EC carrier tape 294 is fed by the forward pivotal motion (the clockwise pivotal motion in FIG. 8) of the drive lever 336 in a manner described later, the EC 164 accommodated in the leading one of at least one EC-accommodating pocket 288 from which the cover tape 290 has been peeled, is moved to an EC-pick-up position right below the suction nozzle 158 being positioned at the component-suck position. The EC-supply portion of each EC-supply unit 260 is defined as a portion thereof around its EC-pick-up position.

Figure 11:
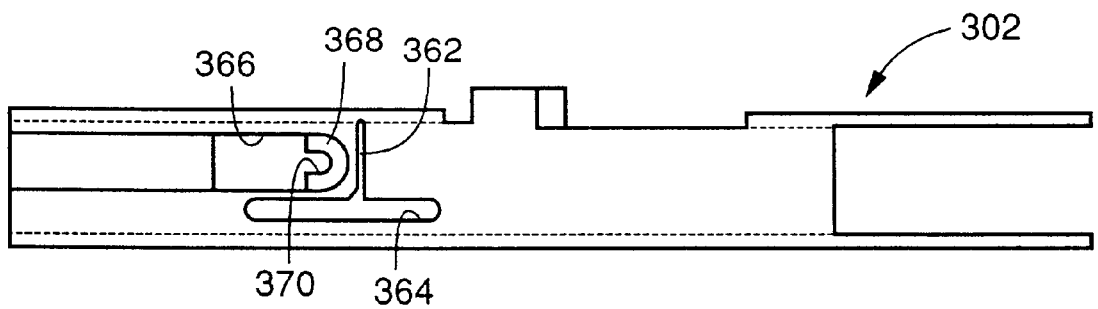
FIG. 11 is a plan view of a cover member which covers the EC carrier tape being fed on the EC-supply unit of FIG. 8.

One end portion of a cover drive plate 356 is pivotally connected to the drive lever 336 via a pin 358, and the cover member 302 is pivotally connected to the other end portion of the cover drive plate 356 via a pin 360. The cover member 302 which has a generally U-shaped cross section fits on the support frame 276. The EC carrier tape 294 is fed through the front portion of the support frame 276, while being guided by, and between, the cover member 302 and the upper surface of the support frame 276. As shown in FIG. 11, the cover member 302 has a slit 362 which extends in a direction perpendicular to the carrier-tape feeding direction in which the carrier tape 294 is fed. The cover tape 290 peeled from the EC-accommodating tape 280 is drawn out through the slit 362.

In addition, the cover member 302 has an elongate hole 364 formed in a portion thereof corresponding to the feed holes 292 of the EC carrier tape 294. The elongate hole 364 functions for preventing the cover member 302 from interfering with the teeth of the sprocket 318. Moreover, the cover member 302 has a rectangular opening 366 through which the EC 164 is picked up by the suction nozzle 158. A generally U-shaped thin tongue 368 is provided on an upstream side of the opening 366 as seen in the carrier-tape feeding direction, and has a cutout 370 which communicates with the upstream-side end of the opening 366. The dimension of the cutout 370 as measured in a direction perpendicular to the carrier-tape feeding direction is smaller than that of the EC 164 in the same direction, and is greater than the diameter of the suction pipe 162 of the suction nozzle 158.

As shown in FIG. 8, the cover tape 290 peeled from the EC-accommodating tape 280 is wound on two stationary rollers 372, 374 each of which is rotatably attached to the bracket 278, and on a movable roller 376 which is rotatably attached to the drive lever 336, and then is introduced to the cover-tape peeling and feeding device 312 attached to the bracket 278. The peeling and feeding device 312 includes a drive roller 380 and a driven roller 382. The drive roller 380 is rotatably attached to the bracket 278 via an axis member 384. A feed lever 386 is pivotally connected to the axis member 384. The feed lever 386 is biased by a tension coil spring 388 as a biasing device provided between the drive lever 336 and a free end portion of the feed lever 386, in its forward direction (counterclockwise in FIG. 8) in which the cover tape 290 is fed, so that the feed lever 386 engages a projecting portion 390 of the driven bar 344.

A first one-way clutch (not shown) is provided between the drive roller 380 and the feed lever 386, and a second one-way clutch (not shown) is provided between the axis member 384 and the drive roller 380. The first one-way clutch inhibits the pivotal motion of the feed lever 386 relative to the drive roller 380 in the cover-tape feeding direction in which the cover tape 290 is fed, but permits the pivotal motion of the same 386 in the opposite direction. The second one-way clutch permits the rotation of the drive roller 380 relative to the axis member 384 in the cover-tape feeding direction, but inhibits the rotation of the same 380 in the opposite direction.

The driven roller 382 is rotatably attached to one end portion of a lever 394 which is pivotally attached to the bracket 278 via an axis member 392. The driven roller 382 is biased by a tension coil spring 396 as a biasing device which is provided between the lever 394 and the bracket 278, so that the roller 382 is pressed against a lower portion of a circumferential surface of the drive roller 380. The cover tape 290 which is wound on the movable roller 376 is then pinched between the drive and driven rollers 380, 382, so that when the drive roller 380 is rotated in the cover-tape feeding direction (counterclockwise in FIG. 8), the cover tape 290 is fed while being peeled from the EC-accommodating tape 280. The distance of movement of the outer circumferential surface of the drive roller 380 during one vertical reciprocation of the driven lever 344 (i.e., one cover-tape peeling operation) is greater than the length of the EC carrier tape 294 fed during one carrier-tape feeding operation of the carrier-tape feeding device 310.

Figure 18:
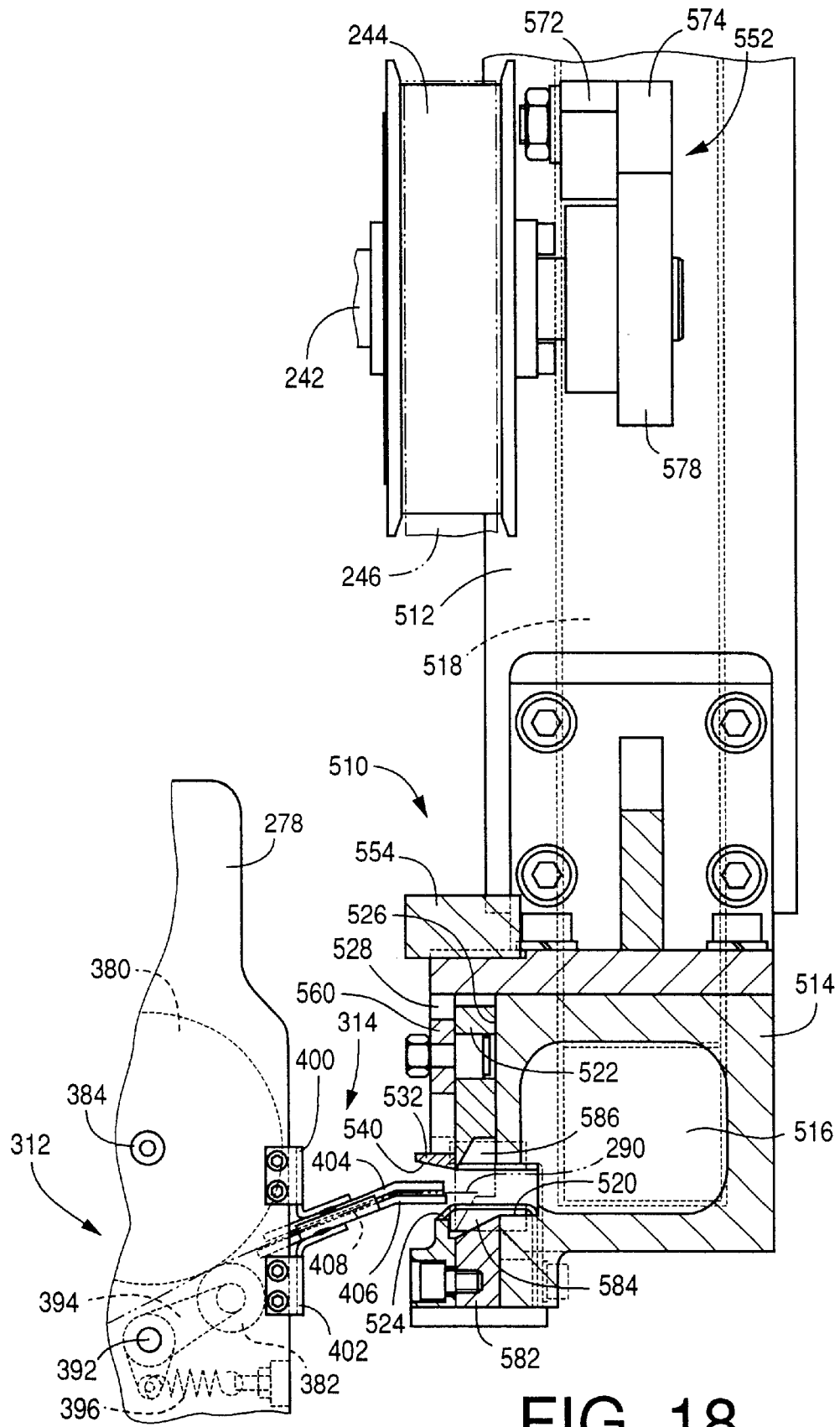
FIG. 18 is a partly cross-sectioned, side elevation view of the relevant portion of the cover-tape cutting device of FIG. 8.

The cover-tape peeling and feeding device 312 has an outlet on a downstream side of respective contact portions of the drive and driven rollers 380, 382 as seen in the cover-tape feeding direction. The guide-passage defining member 314 is fixed to a portion of the bracket 278 on a downstream side of the outlet of the peeling and feeding device 312. As shown in FIG. 18, the guide-passage defining member 314 is provided by the cooperation of a first plate-like member 404 and a second plate-like member 406 which are fixed to two support members 400, 402, respectively, which are fixed to the bracket 278. The first and second members 404, 406 are positioned relative to each other in the widthwise direction of the EC-supply unit 260, and cooperate with each other to define a guide passage 408 which has a vertical dimension slightly greater than the thickness of the cover tape 290. Widthwise opposite ends of the guide passage 408 are closed to be able to guide the cover tape 290 being fed. The width of the guide passage 408 is slightly greater than that of the cover tape 290. The guide passage 408 is inclined such that a downstream-side portion thereof as seen in the cover-tape feeding direction is higher than an upstream-side portion thereof, and includes a horizontal downstream-end portion which projects from the bracket 278. Accordingly, widthwise opposite ends of the horizontal downstream-end portion of the passage 408 are not closed.

As shown in FIG. 8, an EC-accommodating-tape cutting device 410 is provided at a location corresponding to the component-suck position. The cutting device 410 cuts an empty portion of the EC-accommodating tape 280 from which the cover tape 290 has been peeled and the EC 164 has been taken up. The cutting device 410 includes a movable blade 412 as a shearing blade, and a fixed blade 414. When the movable blade 412 is moved upward by a movable-blade elevating and lowering device (not shown) as a movable-blade driving device, the movable blade 412 cooperates with the fixed blade 414 to cut the empty portion off the remaining EC-accommodating tape 280. The cut tape is sucked by a vacuum pump 416 (FIG. 20) as a suction device via a duct (not shown), and is collected in a cut-tape collecting container (not shown) connected to an intermediate portion of the duct. The movable-blade elevating and lowering device includes a rotatable cam which is rotated by the main servomotor 108, and a cam follower. Accordingly, the cutting of the EC-accommodating tape 280 is carried out in timed relation with the feeding of the EC carrier tape 294.

In the vicinity of the component-supply position, there are provided two drive members 420 (420A, 420B) each of which drives the driven bar 344, and two first drive devices 422 (422A, 422B) and one second drive device 424. As shown in FIG. 8, the two drive members 420A, 420B are arranged side by side in a direction perpendicular to the direction of movement of the movable table 262 and parallel to the carrier-tape feeding direction in a horizontal plane. The two first drive devices 422A, 422B are provided for the two drive members 420A, 420B, respectively, and the single second drive device 424 is provided commonly for the two drive members 420A, 420B. The two first drive devices 422A, 422B are arranged side by side in the same direction as that in which the two drive members 420 are arranged. Since the two drive members 420A, 420B or the two first drive devices 422A, 422B have substantially the same construction, only one of them will be described. One of the two drive members 420 and constituent members of one of the two first drive devices 422 are designated with reference numerals each including the symbol "A", and the other drive member 420 and constituent members of the other first drive device 422 are designated with reference numerals each including the symbol "B", for distinction from each other.

As shown in FIGS. 6 and 7, a bracket 428 is fixed to the frame 60, and a guide member 432A having a vertical groove 430A is fixed to the bracket 428. A straight guided member 436A fixed to a roller-hold member 434A as a cam-follower-hold member fits in the groove 430A such that the guided member 436A is vertically movable. The guided member 436A has a rail-like configuration. An upper end portion of the roller-hold member 434A supports a roller 440A as a cam follower, such that the roller 440A can rotate to follow a plate cam 442A as a rotary cam. The plate cam 442A is fixed to the axis member 242 to which the rotary cam 238 of the head elevating and lowering device 220 is fixed. Accordingly, the plate cam 442A is rotated by the main servomotor 108 as its drive source.

A plate-like engaging member 444A is fixed perpendicularly to a lower portion of the roller-hold member 434A, and is fixed to a piston rod 448A of an air cylinder 446A as a fluid-pressure actuator. The engaging member 444A fixed to the roller-hold member 434A functions as part of the member 434A. The air cylinder 446A is a double-acting cylinder, and is fixed to the bracket 428 such that the cylinder 446A is oriented downward. A solenoid-operated direction control valve 450A (FIG. 20) is operated to selectively supply air to one of two air chambers of the air cylinder 446A, so that the piston rod 448A of the cylinder 446A is selectively moved in one of a first direction in which the rod 448A presses the roller 440A against the plate cam 442A via the roller-hold member 434A and a second direction in which the rod 448A moves the roller 440A away from the cam 442A. In the state in which the air cylinder 446A is operated to move the piston rod 448A in the first direction, the roller 440A follows the rotation of the plate cam 442A, so that the roller 440A is moved up and down and accordingly the roller-hold member 434A is moved up and down. In the state in which the cylinder 446A is operated to move the rod 448A in the second direction, the roller 440A is kept away from the plate cam 442A, so that even if the cam 442A is rotated, the roller 440A is not moved up or down but is kept at its upper stroke end. Usually, the cylinder 446A is switched or operated to move the rod 448A in the first direction, so that the roller 440A follows the cam 442A. Thus, the cylinder 446A functions as not only a biasing device which biases the roller 440A in a direction in which the roller 440A follows the cam 442A, but also a stopping device which stops the movement of the roller-hold member 434A. This is also the case with the air cylinder 248 provided in association with the roller 236 as the cam follower of the head elevating and lowering device 220.

The roller-hold member 434A includes a support portion 454A which extends parallel to the direction of movement of the movable table 262, as shown in FIG. 13. A rod 468A having a circular cross section is fixed to the support portion 454A such that the rod 468A extends parallel to the direction of movement of the table 262. A drive-member holding member 458A fits on the rod 468A via rolling bearings 470A, such that the holding member 458A is movable in an axial direction of the rod 468A. Two compression coil springs 472A, 474A as biasing devices fit on opposite end portions of the rod 468A which project from the holding member 458A, respectively. The two springs 472A, 474A are identical with each other and apply the same biasing force to the holding member 458A in opposite directions. The compression of each of the springs 472A, 474A permits the movement of the holding member 458A.

The support portion 454A also supports a straight guide rail 456A as a guide member, such that the guide rail 456A extends parallel to the direction of movement of the movable table 262. A guide block 460A as a guided member fixed to the drive-member holding member 458A fits on the guide rail 456A, such that the guide block 460A is movable along the guide rail 456A. The guide block 460A holds a plurality of balls 462A, and is fitted on the guide rail 456A via the balls 462A. Accordingly, the holding member 458A can be easily moved with a small resistance. Since the guide block 460A fits on the guide rail 456A, the rotation of the holding member 458A can be prevented. The guide rail 456A, the guide block 460A, and the balls 462A cooperate with one another to provide a guide device 464A which guides the movement of the drive-member holding member 458A.

Figure 12:
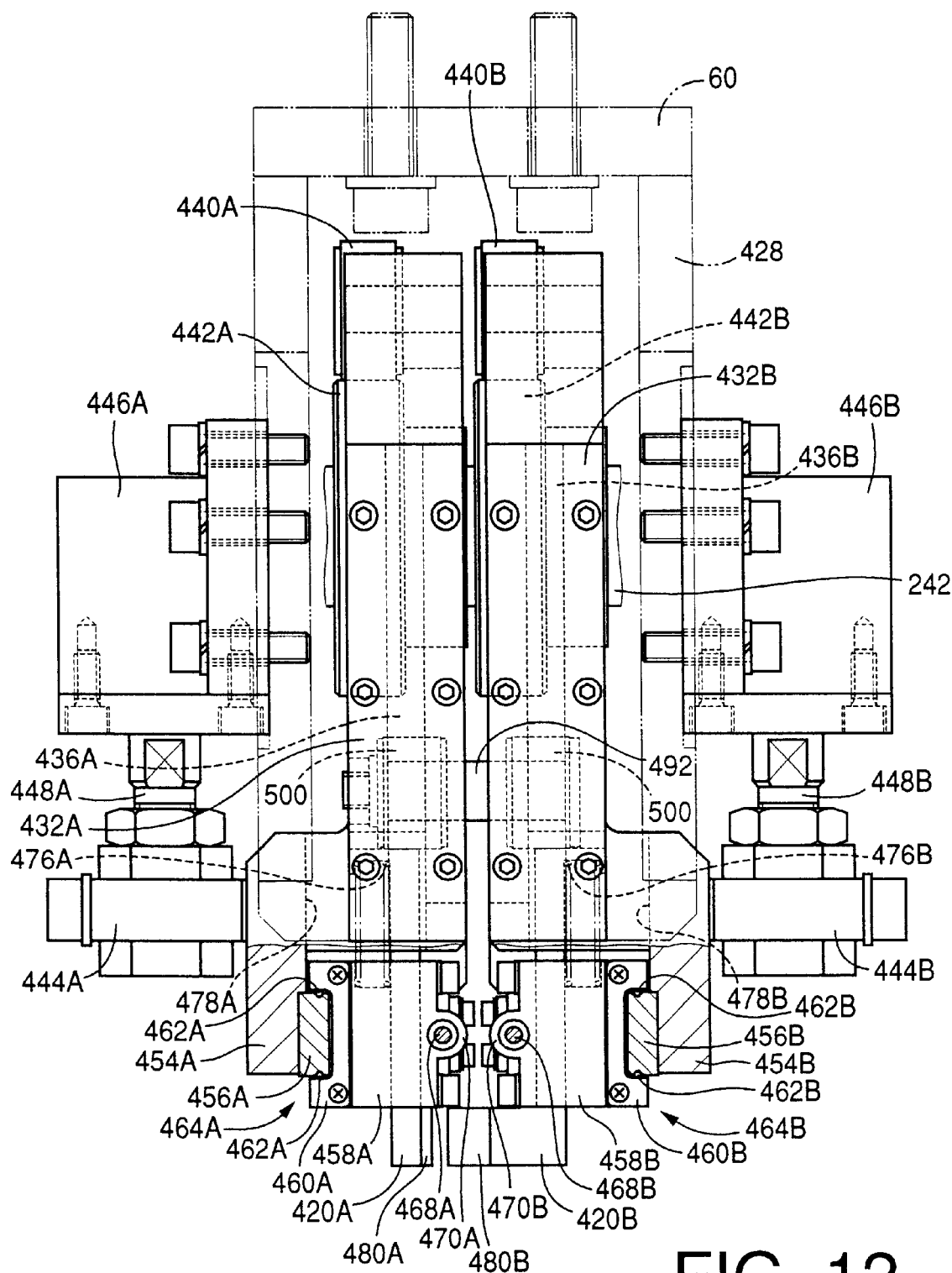
FIG. 12 is a partly cross-sectioned, side elevation view of the first drive devices and two drive members one of which drives a driven lever of the EC-supply unit of FIG. 8.

The drive member 420A fits in the drive-member holding member 458A such that the drive member 420A is movable up and down. As shown in FIGS. 12 and 13, the drive member 420A has a plate-like configuration, and is biased upward by a compression coil spring 476A as a biasing device provided between the drive-member holding member 458A and an upper end portion of the drive member 420A that projects upward from the holding member 458A. The support portion 454A has an opening 478A (FIGS. 7 and 12) formed through the thickness thereof in the vertical direction. Thus, the support portion 454A does not interfere with the drive member 420A.

Figure 14:
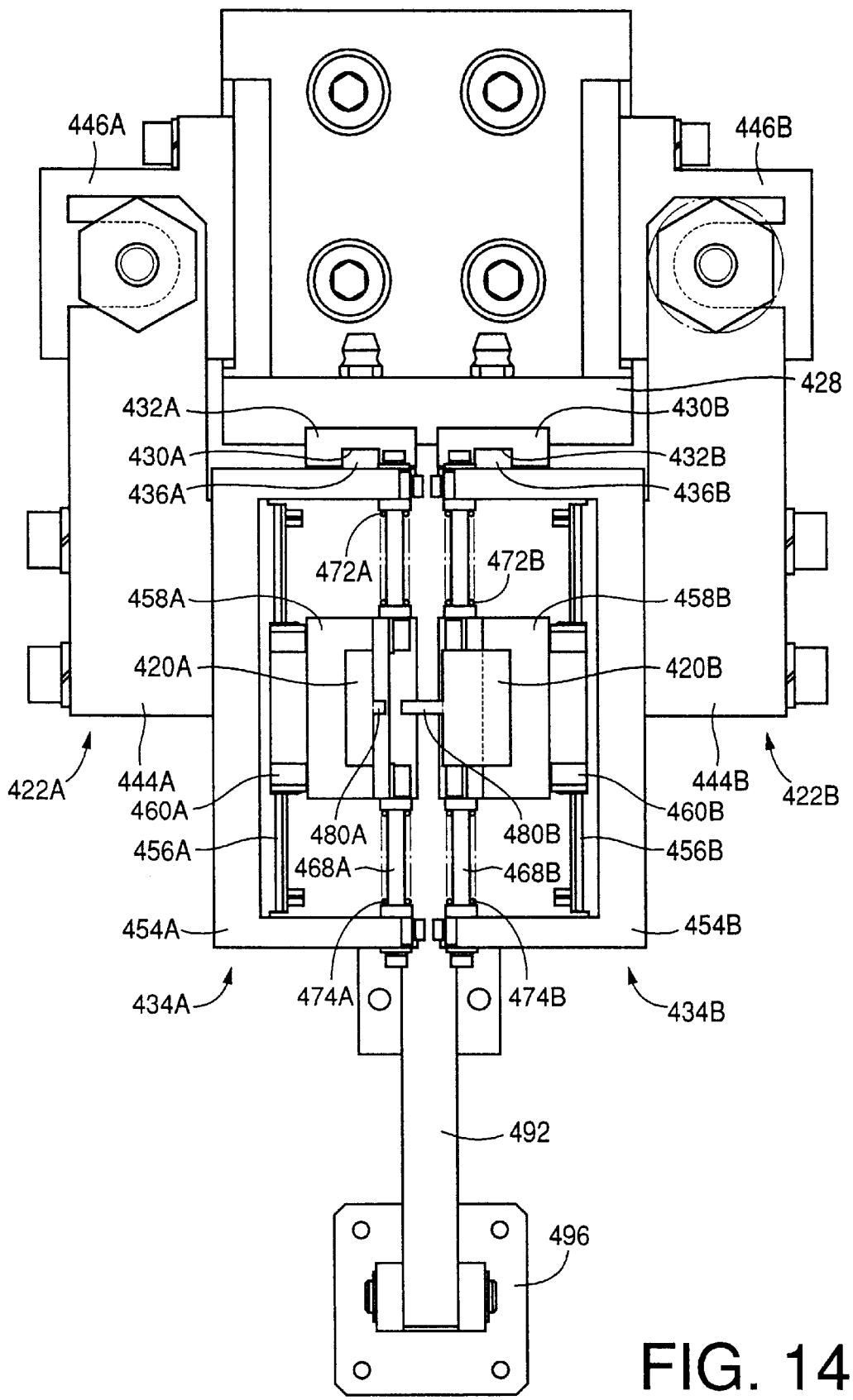
FIG. 14 is a bottom view of the first drive devices and the drive members of FIG. 12.

A lower end portion of the drive member 420A projects downward from the drive-member holding member 458A. As shown in FIGS. 13 and 14, a flat-plate-like drive tongue 480A as a drive portion projects from a middle portion of the lower end portion of the drive member 420A as seen in the widthwise direction of the same 420A (parallel to the direction of movement of the movable table 262). The drive tongue 480A which has a small width extends, perpendicularly to the direction of movement of the table 262 and the driven tongue 352 of the driven bar 344, toward the other drive member 420B. The limit of upward movement of the drive member 420A due to the biasing action of the compression coil spring 476A is defined by the butting of the drive tongue 480A against the lower surface of the drive-member holding member 458A. Thus, while the drive member 420A fitting in the drive-member holding member 458A is not driven, the drive member 420A is held at its origin position where the respective biasing forces of the two compression coils springs 472A, 474A are balanced against each other and accordingly the holding member 458A is positioned at the middle of the rod 468A as seen in its lengthwise direction and where the drive tongue 480A is positioned at the component-supply position as seen in the direction of movement of the table 262. The position the drive-member holding member 458A takes when the drive member 420A takes its origin position may be called an origin position of the member 458A.

Next, the second drive device 424 will be described.

As shown in FIG. 13, a lever 492 is attached via an axis member 494 to a bracket 490 fixed to the frame 60, such that the lever 492 is pivotable about an axis line parallel to that of the plate cam 442A. One end portion of the lever 492 is pivotally connected to a piston rod 498 of an air cylinder 496 as a fluid-pressure-operated actuator which is fixed to the frame 60 such that the air cylinder 496 is oriented downward. A pair of operative rollers 500 are rotatably attached to the other end portion of the lever 492. As shown in FIG. 12, the two operative rollers 500 are provided at respective positions corresponding to the two drive members 420A, 420B. A solenoid-operated direction control valve 502 (FIG. 20) is operated to selectively supply air to one of two air chambers of the air cylinder 496, so that the piston rod 498 of the cylinder 496 is selectively extended or retracted. Accordingly, the lever 492 is pivoted, and the two drive members 420A, 420B are simultaneously pushed down relative to the holding members 458A, 458B against the biasing forces of the compression coil springs 476A, 476B. While the drive members 420A, 420B are not driven by the second drive device 424, the drive members 420A, 420B are held, by the biasing forces of the springs 476A, 476B, at their upper stroke ends where the drive tongues 480A, 480B are held in butting contact with the holding members 458A, 458B, respectively. In this state, the operative rollers 500 are positioned slightly above the drive members 420A, 420B held at their upper stroke ends.

The other first drive device 422B is symmetrical with the above-described first drive device 422A, with respect to a vertical plane parallel to the direction of movement of the movable table 262, except for a roller 440B as a cam follower and a plate am 442B. Thus, the drive tongue 480B of the other drive member 420B can butt on the driven tongue 352 of the driven bar 344, without interfering with the one drive tongue 480A, and in symmetrical relation with the same 480A.

The two first drive devices 422A, 422B and the head elevating and lowering device 220 share the drive source, i.e., the main servomotor 108. Thus, the up-and-down movement of each suction nozzle 158 and the feeding of each EC carrier tape 294 based on the driven bar 344 being driven by the drive member or members 420A, 420B are carried out in association with each other. The plate cams 238, 442A, 442B are so formed that the up-and-down movement of the nozzle 158 and the feeding of the tape 294 are carried out at respective timings shown in the time chart of FIG. 21. In addition, the respective cam surfaces of the cams 442A, 442B are so shaped that the respective up-and-down movements of the drive members 420A, 420B are accelerated and decelerated. The second drive device 424 includes the air cylinder 496 as its exclusive drive source, and drives the drive members 420A, 420B while the sucking of the EC 164 by the nozzle 158 is stopped, as described later. Thus, the second drive device 424 is not operated in association with the up-and-down movement of the nozzle 158, and is not controlled with respect to its operation speed. Except those differences, the second drive device 424 drives the drive members 420A, 420B and the driven bar 344, like the first drive devices 422A, 422B.

Figure 15:
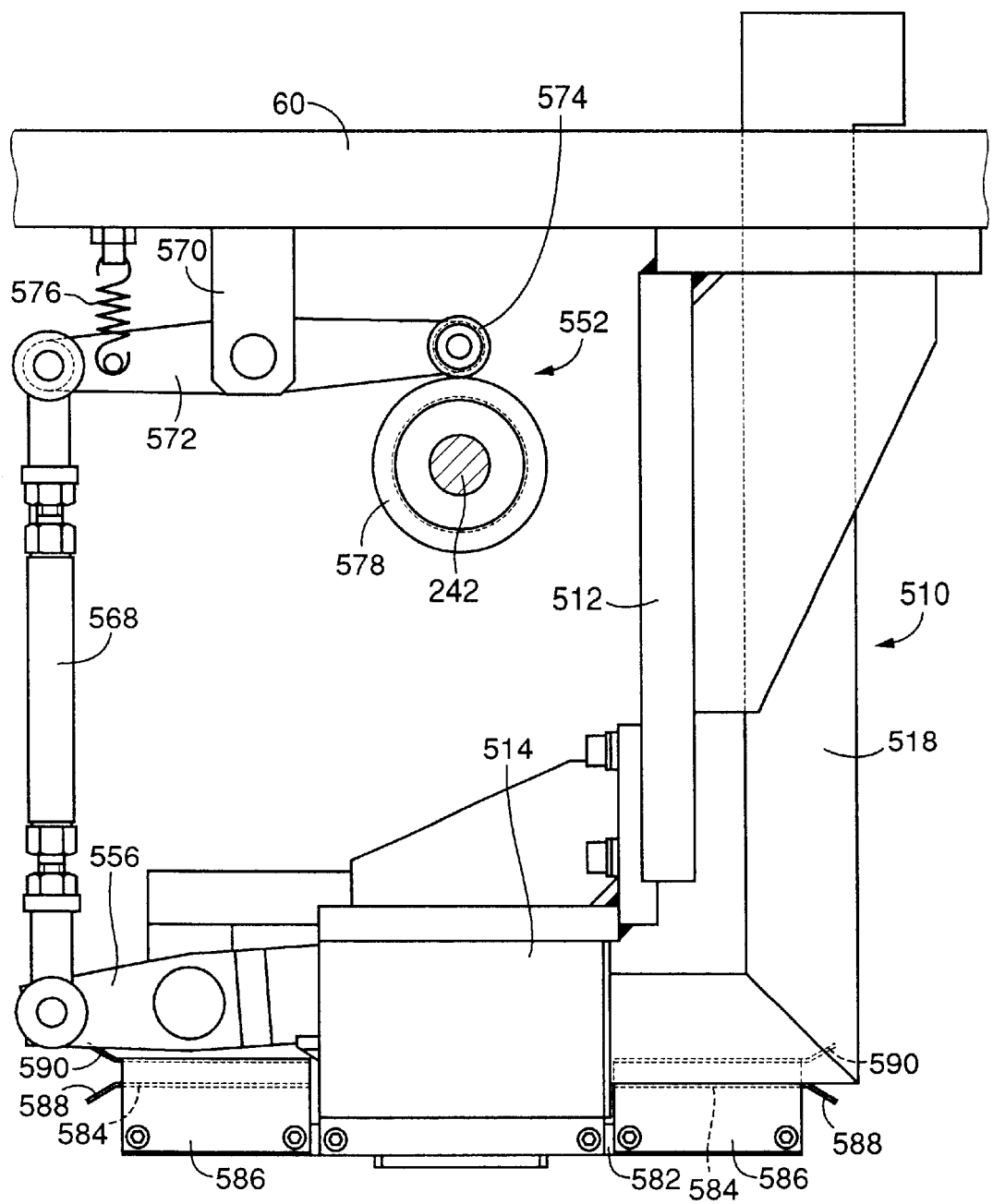
FIG. 15 is a front elevation view of the cover-tape cutting device of FIG. 8.
Figure 17:
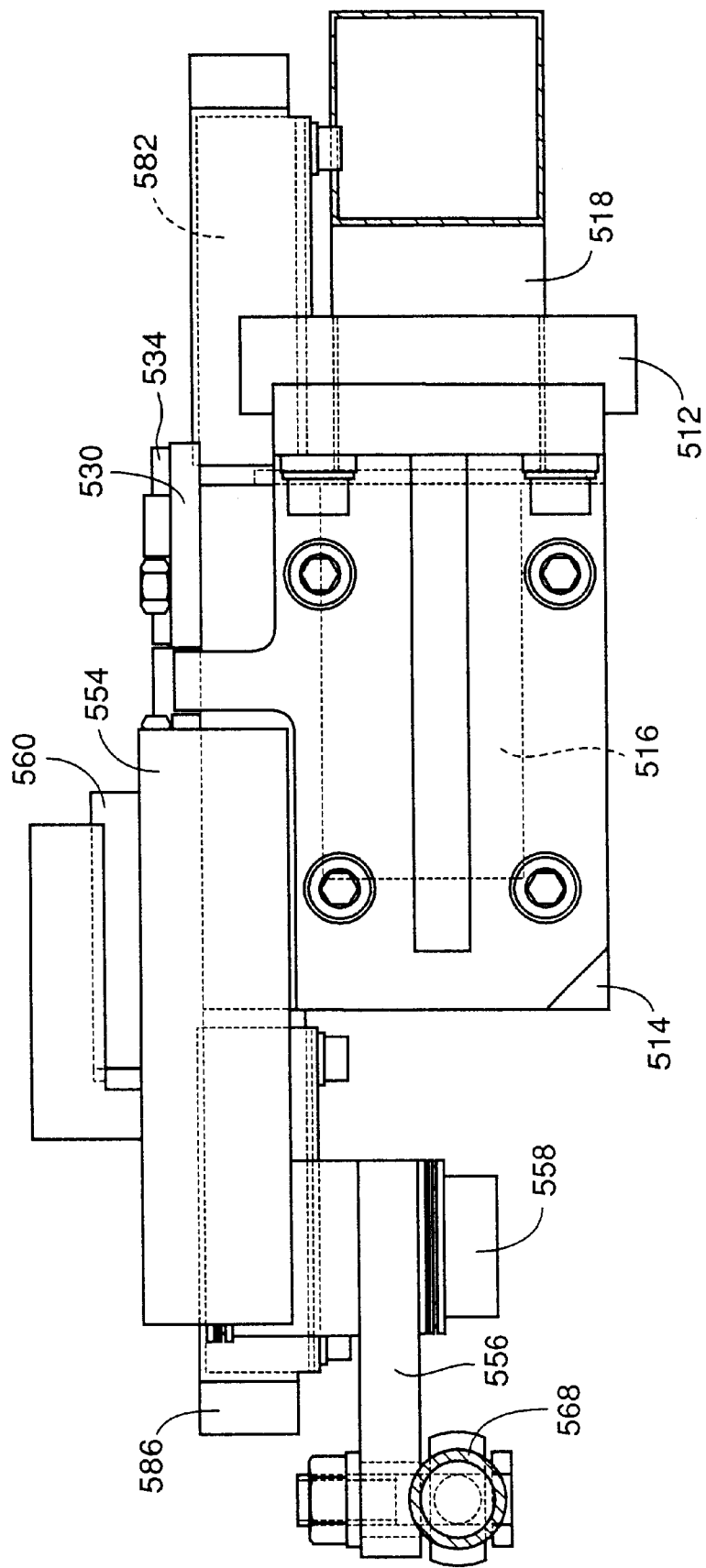
FIG. 17 is a plan view of the relevant portion of the cover-tape cutting device of FIG. 8.

A cover-tape cutting device 510 which cuts the free end portion of the cover tape 290 being fed by the cover-tape peeling and feeding device 312, is provided on a downstream side of the peeling and feeding device 312 as seen in the cover-tape feeding direction. As shown in FIG. 15, the cutting device 510 includes a blade holder 514 which is fixed to a lower end portion of a bracket 512 fixed to the frame 60. As shown in FIGS. 17 and 18, the blade holder 514 has a suction chamber 516 which opens in one of opposite end faces of the holder 514 as seen in the direction of movement of the movable table 262. One end of a duct 518 is fixed to the opening of the suction chamber 516. The other end of the duct 518 is connected to the vacuum pump 416 (FIG. 20), and a cover-tape collecting container (not shown) is provided midway in the duct 518. A passage in the duct 518 provides a suction passage. The suction chamber 516 provides one opening of the suction passage that is opposite to the other opening of the same on the side of the vacuum pump 416.

Figure 16:
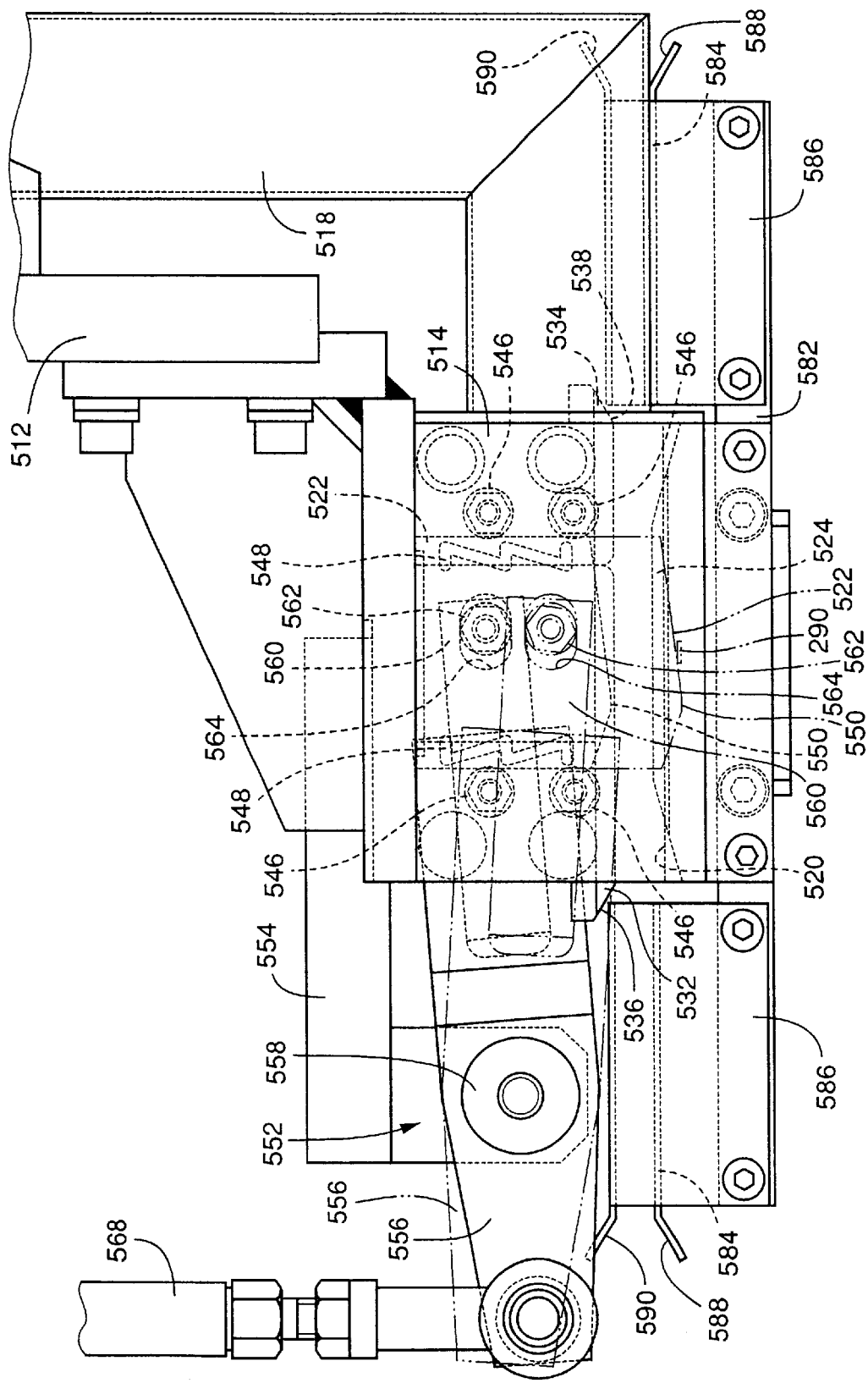
FIG. 16 is an enlarged, front elevation view of a relevant portion of the cover-tape cutting device of FIG. 8.
Figure 19:
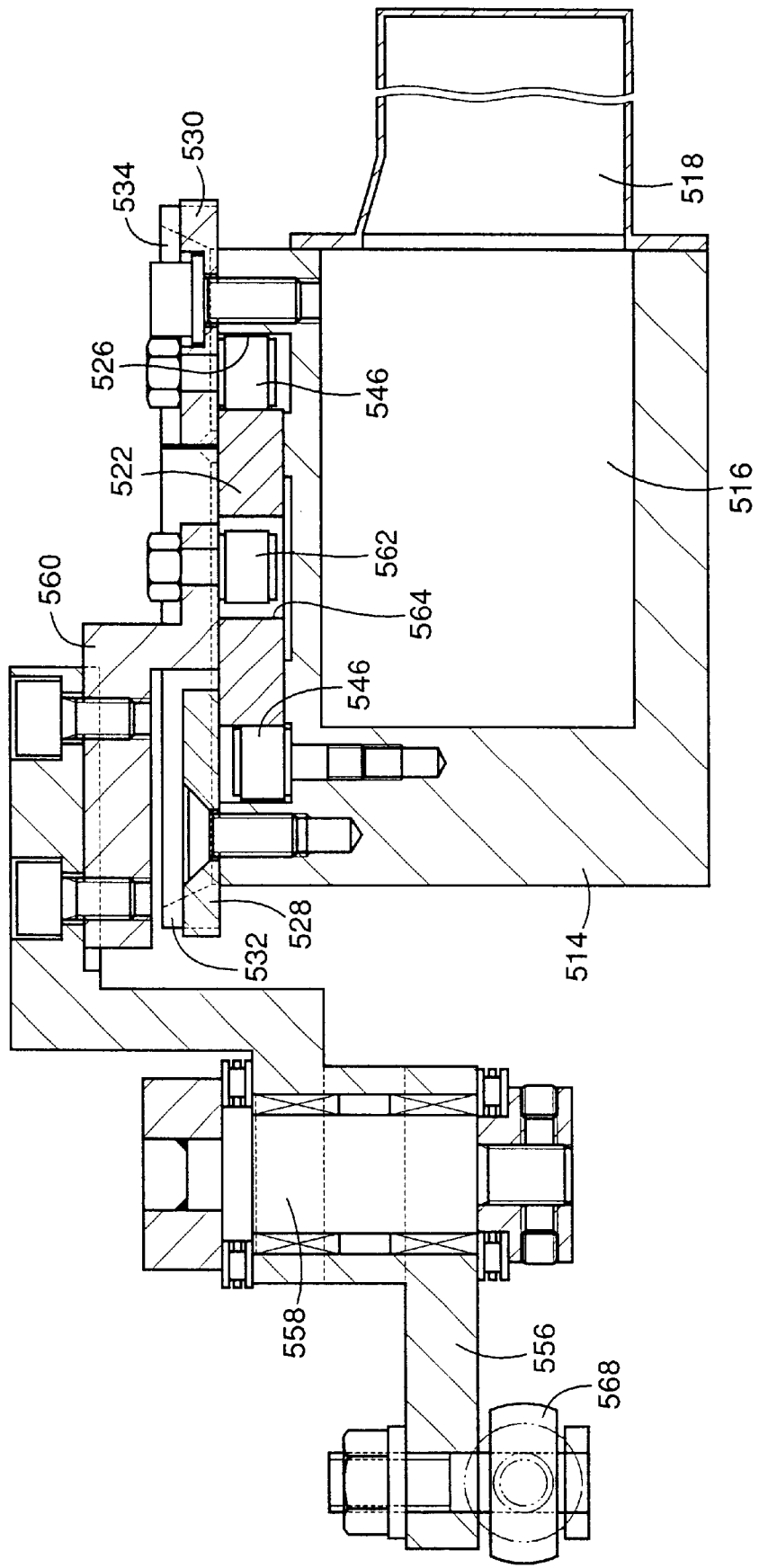
FIG. 19 is a cross-sectioned, plan view of a relevant portion of the cover-tape cutting device of FIG. 8 that includes a movable blade.

As shown in FIGS. 16 and 18, the blade holder 514 has an opening 520 which opens on the side of the cover-tape peeling and feeding device 312, extends through the thickness of the holder 514 in the direction of movement of the movable table 262, and communicates with the suction chamber 516. The blade holder 514 holds a movable blade 522 as a shearing blade above the opening 520, and holds a fixed blade 524 as a shearing blade below the opening 520. As shown in FIG. 19, the blade holder 514 has a recess 526 which opens on the side of the cover-tape peeling and feeding device 312, and the movable blade 522 fits in the recess 526 such that the movable blade 522 is movable up and down. Two hold-down members 528, 530 are fixed to a side surface of the blade holder 514 on the side of the peeling and feeding device 312, and functions to prevent the movable blade 522 from coming off the recess 526.

As shown in FIGS. 16 and 18, two guide members 532, 534 are provided below the two hold-down members 528, 530, respectively. The guide members 532, 534 project from the blade holder 514 in opposite directions, respectively, which are parallel to the direction of movement of the movable table 262, and the respective projecting end portions of the guide members 532, 534 have respective guide surfaces 536, 538 which are inclined such that a lower portion of each guide surface 536, 538 is nearer to the holder 514. As shown in FIG. 18, the guide members 532, 534 have respective guide surfaces 540 (only the guide surface 540 of the guide member 534 is shown in FIG. 18) which are inclined such that a lower portion of each guide surface 540 is more remote from the cover-tape peeling and feeding device 312, i.e., is nearer to the opening 520. One guide member 532 is longer than the other guide member 534 and, as shown in FIG. 16, extends along the movable blade 522.

As shown in FIGS. 16 and 19, the blade holder 514 has two pairs of rotatable guide rollers 546 which are spaced from each other in a widthwise direction of the movable blade 522 that is perpendicular to the direction of up-and-down movement thereof and the direction of thickness thereof. The two pairs of guide rollers 546 are held in engagement with opposite side surfaces of the movable blade 522, respectively, and functions to guide the up-and-down movement of the blade 522. Reference numeral 548 designates an oil groove which is formed in the blade holder 514 and which is filled with oil, which lubricates the blade 522. As shown in FIG. 16, the movable blade 522 has a generally V-shaped cutting edge which projects toward the fixed blade 524 at a position which is slightly remote from the center of the movable blade 522 as seen in its widthwise direction by a distance which permits the cover tape 290 to be positioned at the center of the movable blade 522 in a direction in which the cover-tape peeling and feeding device 312 and the cover-tape cutting device 510 are moved relative to each other. The cutting edge includes, on both sides of the tip of its projection, two side portions which are inclined toward opposite ends of the movable blade 522 as seen in its widthwise direction, away from the fixed blade 524. As shown in FIG. 16, the movable blade 522 is chamfered to form a guide surface 550 which is inclined such that a lower portion of the guide surface 550 is more remote from the fixed blade 524. When the cutting device 510 cuts the cover tape 290, the guide surface 550 guides the engagement of the movable blade 522 with the fixed blade 524, and assures that the two blades 522, 524 engage each other and cooperate with each other to cut the cover tape 290 by shearing.

The movable blade 522 is moved up and down by a movable-blade elevating and lowering device 552 as a movable-blade drive device. The elevating and lowering device 552 includes a lever 556 which is pivotally attached via an axis member 558 to a bracket 554 fixed to the blade holder 514. As shown in FIG. 19, one end portion of the lever 556 is located on the side of the cover-tape peeling and feeding device 312, away from the blade holder 514, so that the lever 556 is prevented from interfering with the blade holder 514 and the hold-down members 528, 530. A support member 560 is fixed to the projecting end of the above-indicated one end portion of the lever 556, and a drive roller 562 is rotatably supported by the support member 560. The drive roller 562 rotatably fits in an elongate hole 564 formed in the movable blade 522. The elongate hole 564 is elongate in a direction perpendicular to both the axis of pivotal motion of the lever 556 and the direction of up-and-down movement of the movable blade 522.

As shown in FIG. 15, the other end portion of the lever 556 is pivotally connected to a lower end portion of a connection member 568. An upper end portion of the connection member 568 is pivotally connected to one end portion of a lever 572 which is pivotally attached to a bracket 570 fixed to the frame 60. A roller 574 as a cam follower is rotatably attached to the other end portion of the lever 572. The lever 572 is biased by a tension coil spring 576 as a biasing device which is provided between the lever 572 and the frame 60, in a direction in which the roller 574 engages and follows a plate cam 578 as a rotary cam. The plate cam 578 is fixed to the rotatable axis member 242 to which the plate cams 238, 442A, 442B are fixed, and accordingly is rotated by the main servomotor 108 as its drive source. When the plate cam 578 is rotated, the lever 572 is pivoted and the connection member 568 is moved up and down, so that the lever 556 is pivoted and the movable blade 522 is moved up and down. Thus, the movable-blade elevating and lowering device 552, the head elevating and lowering device 220, and the first drive devices 422A, 422B share the main servomotor 108 as their drive source, and the cutting of the cover tape 290 is carried out in association with the up-and-down movement of the suction nozzle 158 and the feeding of the EC carrier tape 294, as described later.

As shown in FIGS. 16 and 18, the fixed blade 524 is fixed to a support member 582 which is fixed to a portion of the blade holder 514 that is located below the opening 520 formed through the side surface of the holder 514 on the side of the cover-tape peeling and feeding device 312. As shown in FIG. 16, the fixed blade 524 has a straight cutting edge extending parallel to its widthwise direction. Each of the two blades 522, 524 is coated with a material, e.g., teflon (product name), having a lower degree of adhesiveness to the adhesive used to adhere the cover tape 290 to the EC-accommodating tape 280, than the material (e.g., metal) used to form the blades 522, 524.

As shown in FIG. 16, axially opposite end portions of the support member 582 project from the blade holder 514 in opposite directions, respectively, and a pair of guide members 584, 586 are fixed to each of the projecting end portions. Each of the guide members 584, 586 is provided by a thin plate, and projects from the support member 582 toward the cover-tape peeling and feeding device 312 such that the plane of the thin plate extends perpendicularly to the direction of movement of the movable blade 522. As shown in FIG. 18, the guide member 584 as one of each pair of guide members 584, 586 is provided such that the plane of the thin plate 584 is located below the opening 520, and the other guide member 586 is provided such that the plane of the thin plate 586 is located above the opening 520. In addition, as shown in FIG. 16, one end portion of each lower guide member 584 that is remote from the opening 520 has a guide surface 588 which is inclined such that a lower portion of the guide surface 588 is more remote from the opening 520. On the other hand, one end portion of each upper guide member 586 that is remote from the opening 520 has a guide surface 590 which is inclined such that an upper portion of the guide surface 590 is more remote from the opening 520. As shown in FIG. 16, the other end portion of each upper guide member 586 is opposed to an intermediate portion of the corresponding guide surface 536, 538 as seen in both the direction of movement of the movable table 262 and the vertical direction. Thus, the guide surfaces 536, 538 of the guide members 532, 534 and the two pairs of guide members 584, 586 cooperate with one another to provide a free-end-portion guide device which defines a guide passage which is substantially continuous in a direction parallel to the direction of movement of the table 262 and which guides the free end portion of the cover tape 290 that projects from the guide-passage defining member 314.

Figure 20:
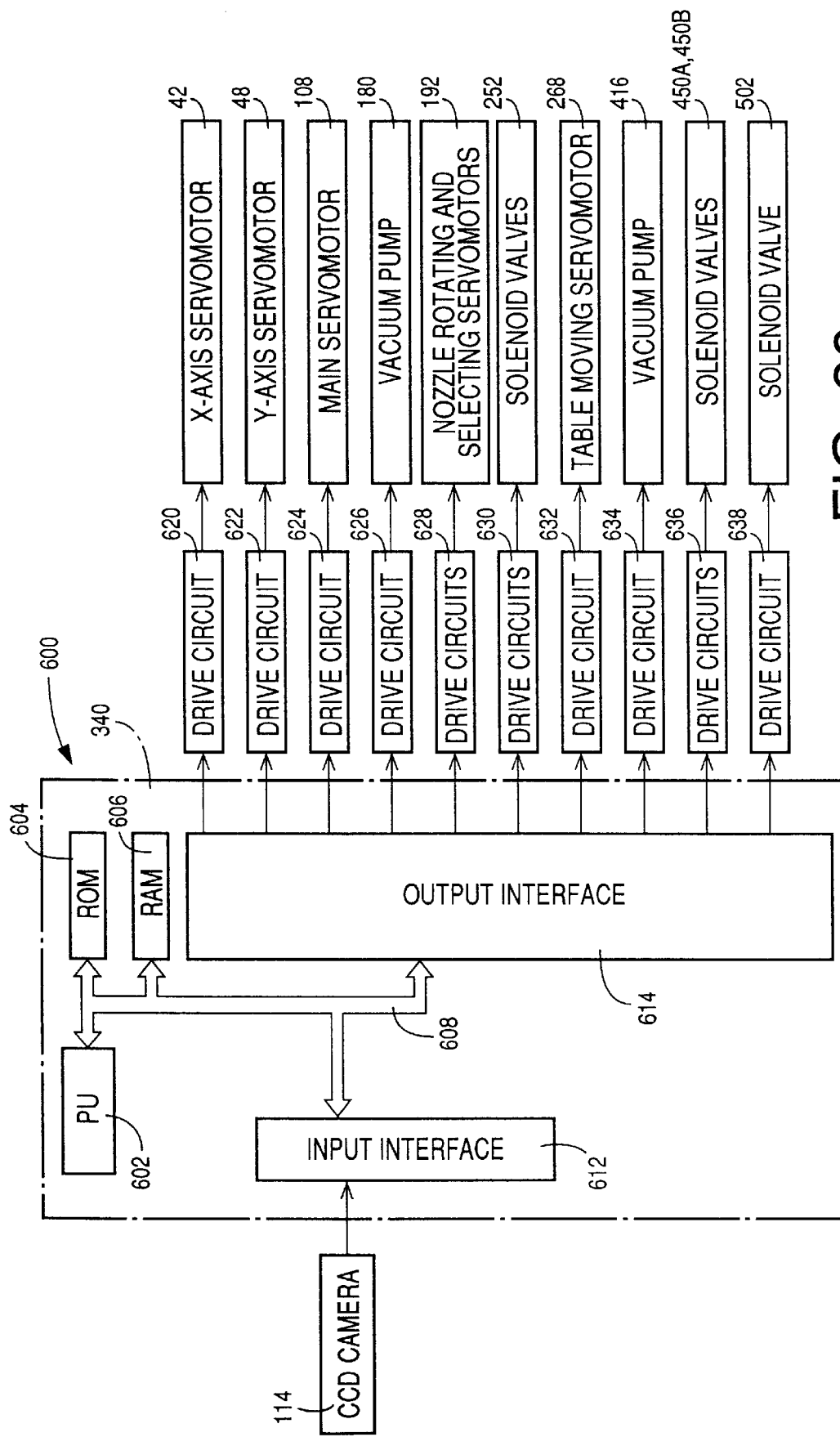
FIG. 20 is a diagrammatic view of a control device of the EC mounting system of FIG. 1.

The present EC mounting system is controlled by a control device 600 shown in FIG. 20. The control device 600 is essentially provided by a computer including a processing unit (PU) 602, a read only memory (ROM) 604, a random access memory (RAM) 606, and a bus 608 for connecting the elements 602, 604, 606 to one another. An input interface 612 and an output interface 614 are connected to the bus 608. The CCD camera 114 is connected to the input interface 612. The X-axis servomotor 42, the y-axis servomotor 48, the main servomotor 108, the vacuum pump 180, the nozzle rotating and selecting servomotors 192, the solenoid valves 252, the table moving servomotor 268, the vacuum pump 416, the solenoid valves 450A, 450B, 502 are connected to the output interface 614 via respective drive circuits 620, 622, 624, 626, 628, 630, 632, 634, 636, 683. The ROM 604 stores various control programs needed for sucking and mounting the ECs 164 and taking the image of each of the ECs 164. Each of the above-indicated servomotors 42, 48, 108, 192, 268 that is employed as a drive source may be replaced by a different electric motor which can be controlled with respect to its rotation angle, such as a stepper motor.

When the EC mounting system constructed as described above is operated to mount the ECs 164 on the printed circuit board 38, the main servomotor 108 contemporaneously rotates the four concave globoidal cams 90a–90d in synchronism with one another, so that the twelve rotary plates 70 are accelerated and decelerated, rotated at a predetermined constant velocity, and stopped, independently of one another. The rotary plates 70 are sequentially stopped at the component-suck position where an EC 164 is sucked, the image-take position where an image of the EC 164 is taken, and the component-mount position where the EC 164 is mounted on the board 38.

Figure 21:
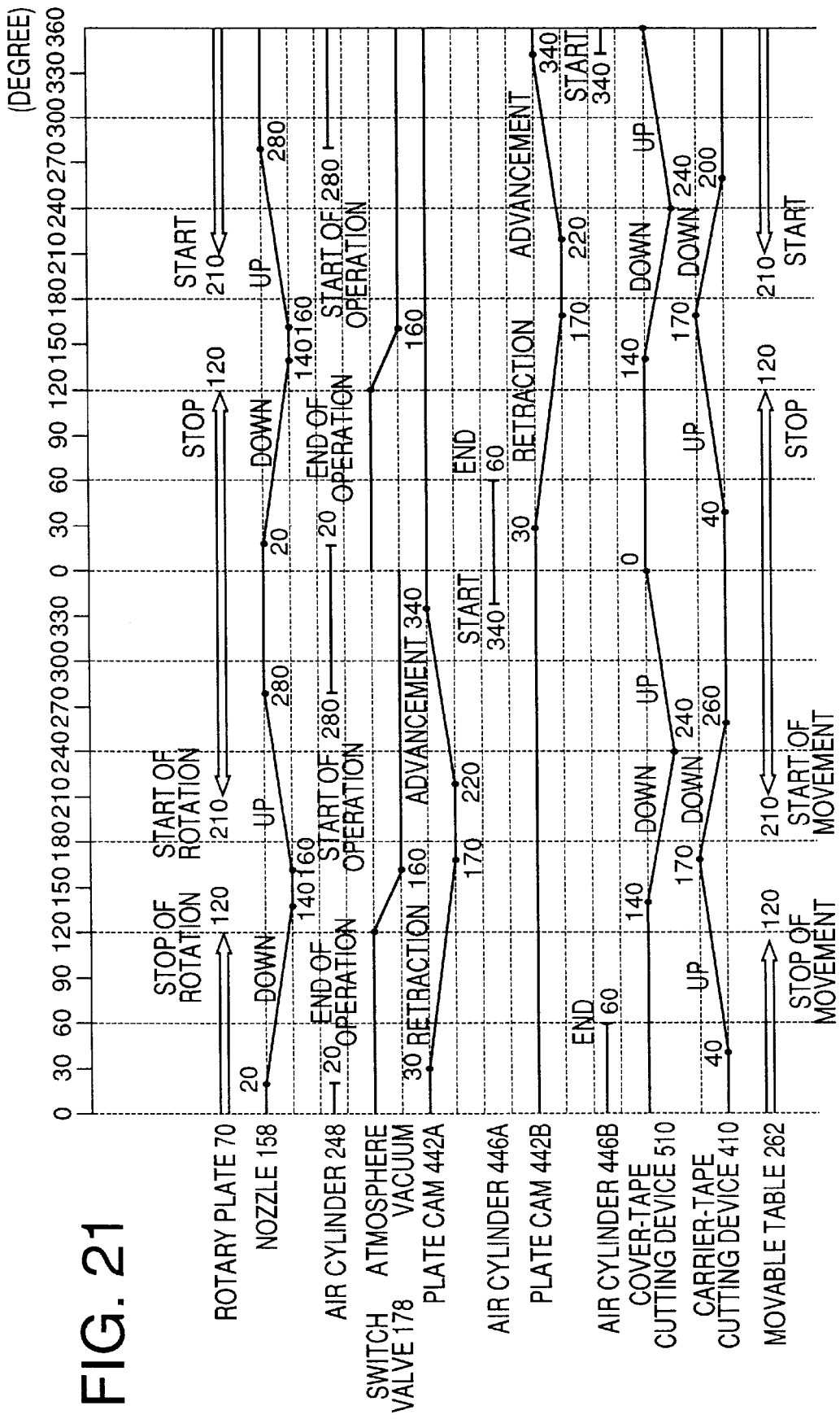
FIG. 21 is a time chart showing respective timings at which one rotary plate is rotated, a corresponding EC-suction nozzle is moved up and down, a cover member is moved, a cover tape is cut, a carrier tape is cut, and a movable table is moved.

When each rotary plate 70 is rotated toward the component-suck position, the cam follower rollers 126 thereof roll in the cam groove of the stationary cam 128 and eventually transfer from the cam groove to the groove 226 of the vertically movable member 224 of the head elevating and lowering device 220 provided in the vicinity of the component-suck position. The time chart of FIG. 21 shows that before each rotary plate 70 reaches the component-suck position, the cam follower rollers 126 thereof transfer from the cam groove of the cam 128 to the groove 226 of the movable member 224 and that after the rollers 126 enter the groove 226 and before the rotary plate 70 is stopped at the component-suck position, the movable member 224 starts moving downward and the rollers 126 move downward with the movable member 224. Thus, the component-holding head 120 carried by the rotary plate 70 is moved downward. That is, the rotation of each rotary plate 70 and the downward movement of the corresponding holding head 120 concurrently occur.

When the component-holding head 120 is moved down, eventually the suction nozzle 158 contacts the EC 164. When the switch valve 178 is switched to the vacuum-supply position to supply the vacuum to the nozzle 158, the nozzle 158 holds the EC 164 by air suction. Since the nozzle 158 contacts the EC 164 after the rotary plate 70 is stopped at the component-suck position, the nozzle 158 can suck the EC 164 with accuracy. Then, the movable member 224 is moved up and accordingly the cam follower rollers 126 are moved up, so that the vertical slide 124 is moved up. Thus, the component-holding head 120 is moved up and accordingly the suction nozzle 158 picks up the EC 164 from the EC-supply unit 260.

After the suction nozzle 158 picks up the EC 164, the rotary plate 70 resumes its rotation, before the movable member 224 reaches its upper stroke end and the groove 226 is aligned with the cam groove of the stationary cam 128. The cam follower rollers 126 are moved up while rolling in the groove 226 of the movable member 224 and, after the movable member 224 reaches its upper stroke end, the rollers 126 transfer from the groove 226 to the cam groove of the cam 128. That is, the rotation of each rotary plate 70 and the upward movement of the corresponding holder head 120 concurrently occur.

After the component-suck position, each rotary plate 70 is rotated toward the image-take position where the rotary plate 70 is stopped. Thus, the CCD camera 114 takes an image of the still EC 164 held by the suction nozzle 158. The control device 600 calculates, based on the EC-image data supplied from the CCD camera 114, an angular error of the EC 164 held by the nozzle 158 from a reference angular position, and X-axis-direction and Y-axis direction positional errors of the center of the EC 164 from its reference positions. While the rotary plate 70 is rotated from the image-take position to the component-mount position, the control device 600 corrects the angular error of the EC 164 by operating the nozzle rotating and selecting servomotor 192 and thereby rotating the sleeve shaft 138. Since the suction nozzle 158 being indexed at the operating position is rotated about its own axis, the EC 164 held thereby is also rotated.

Before the EC mounting system starts mounting the ECs 164 on the printed circuit board 38, an image pick-up (not shown) takes an image of reference marks affixed to the board 38. The control device 600 calculates, based on the mark-image data supplied from the image pick-up, X-axis-direction and Y-axis direction positional errors of each of the EC-mount places on the board 38 from its reference position. When the ECs 164 are mounted on the board 38, the board 38 is moved in the X-axis and Y-axis directions so that each of the EC-mount places on the board 38 is positioned right below the EC 164 held by the component-holding head 120. The control device 600 corrects not only the X-axis-direction and Y-axis direction positional errors of the center of the EC 164 but also the X-axis-direction and Y-axis direction positional errors of the EC-mount place, by correcting the respective predetermined distances of movement of the board 38 in the X-axis and Y-axis directions that are needed to move the EC-mount place to the position right below the suction nozzle 158. The X-axis-direction and Y-axis-direction positional errors of the center of the EC 164 are the sum of the original positional errors of the center of the EC 164 that are produced when the EC 164 is held by the nozzle 158 and the positional changes of the center of the EC 164 that are produced when the angular error of the EC 164 is corrected.

When each rotary plate 70 is rotated toward the component-mount position, the cam follower rollers 126 thereof roll in the cam groove of the stationary cam 128 and eventually transfer from the cam groove to the groove 226 of the vertically movable member 224 of the head elevating and lowering device 220 provided in the vicinity of the component-mount position. After the rollers 126 enter the groove 226 and before the rotary plate 70 reaches the component-mount position, the movable member 224 starts moving downward and the component-holding head 120 carried by the rotary plate 70 moves downward. That is, the rotation of each rotary plate 70 and the downward movement of the corresponding holding head 120 concurrently occur. Since the EC 164 is placed on the board 38 after the rotary plate 70 is stopped at the component-mount position, the EC 164 can be mounted at the corresponding EC-mount place on the board 38 with accuracy. After the EC 164 is mounted on the board 164, the switch valve 178 is switched to the atmosphere position to cut the supply of vacuum from the nozzle 158, so that the nozzle 158 releases the EC 164. Then, the movable member 224 is moved up and accordingly the component-holding head 120 is moved up. In this case, too, the rotary plate 70 resumes its rotation before the movable member 224 reaches its upper stroke end. The cam follower rollers 126 are moved up while rolling in the groove 226 of the movable member 224. After the movable member 224 reaches its upper stroke end, the rollers 126 transfer from the groove 226 to the cam groove of the cam 128. Then, the rotary plate 70 moves toward the component-suck position. While the rotary plate 70 is rotated from the component-mount position to the component-suck position, the sleeve shaft 138 is rotated back to its original angular position before the correction of the angular error of the EC 164. In addition, the control device 600 operates, if necessary, the nozzle selecting device 196 to rotate the nozzle holder 154 about its horizontal axis and thereby index another suction nozzle 158 to the operating position.

In the EC supplying apparatus 14, the EC-supply portion of one of the plurality of EC-supply units 260 is positioned at the component-supply position to supply one or more ECs 164. After the one EC-supply unit 260 finishes supplying the EC or ECs 164, the control device 600 moves the movable table 262 so that the EC-supply portion of another EC-supply unit 260 that is next to supply one or more ECs 164 is positioned at the component-supply position. In the present embodiment, it is assumed that the movable table 262 is moved from its EC-supply start position to its EC-supply end position where one EC supplying operation ends and then is back to the EC-supply start position where the next EC supplying operation starts.

In the present EC mounting system, the carrier-tape feeding operation and the tape-feed preparing operation of each of the EC-supply units 260 and the EC picking-up operation of the suction nozzle 158 of each of the component-holding heads 120 are performed in association with each other. In addition, the moving of the movable table 262 takes place concurrently with a portion of each of the carrier-tape feeding operation and the tape-feeding preparing operation.

First, the above-indicated first function of the EC mounting system will be described by reference to the time chart of FIG. 21. In this time chart, respective graphs corresponding to PLATE CAM 442A and PLATE CAM 442B represent timings at which the cover member 302 is advanced and retracted when the plate cam 442A, 442B is rotated and accordingly the driven bar 344 is driven by the drive member 420A, 420B. In addition, respective graphs corresponding to AIR CYLINDER 446A and AIR CYLINDER 446B represent timings at which the switching of the direction of movement of the piston rod 448A, 448B is started and ended. In the present embodiment, one-time down-and-up movement of each suction nozzle 158 effected to pick up one EC 164 is defined as one cycle corresponding to 360 degrees. Thus, half rotations of the plate cams 238, 442A, 442B correspond to one cycle.

First, the picking-up of the EC 164 by the suction nozzle 164 will be described by reference to an example where the first drive device 422A drives the drive member 420A. It is assumed that the ECs 164 are small and that one-time carrier-tape feeding operation of the carrier-tape feeding device 310 results in feeding the EC carrier tape 294 over the distance of one pitch so that the next EC 158 which is adjacent to the current EC being positioned at the EC-pick-up position and is positioned on the upstream side of the current EC as seen in the carrier-tape feeding direction, is moved to the EC-pick-up position.

When the drive member 420A drives the driven bar 344, the air cylinder 446A of the first drive device 422A is switched to the first direction in which the roller 440A follows the plate cam 442A, the roller-hold member 434A is moved down and up, and the drive member 420A is moved down and up. On the other hand, the air cylinder 446B of the first drive device 422B is switched to the second direction in which the roller 440B does not follow the plate cam 442B, the roller-hold member 434B is held at its upper stroke end, and the drive member 420B is held at its retracted position away from the driven bar 344.

Figure 22:
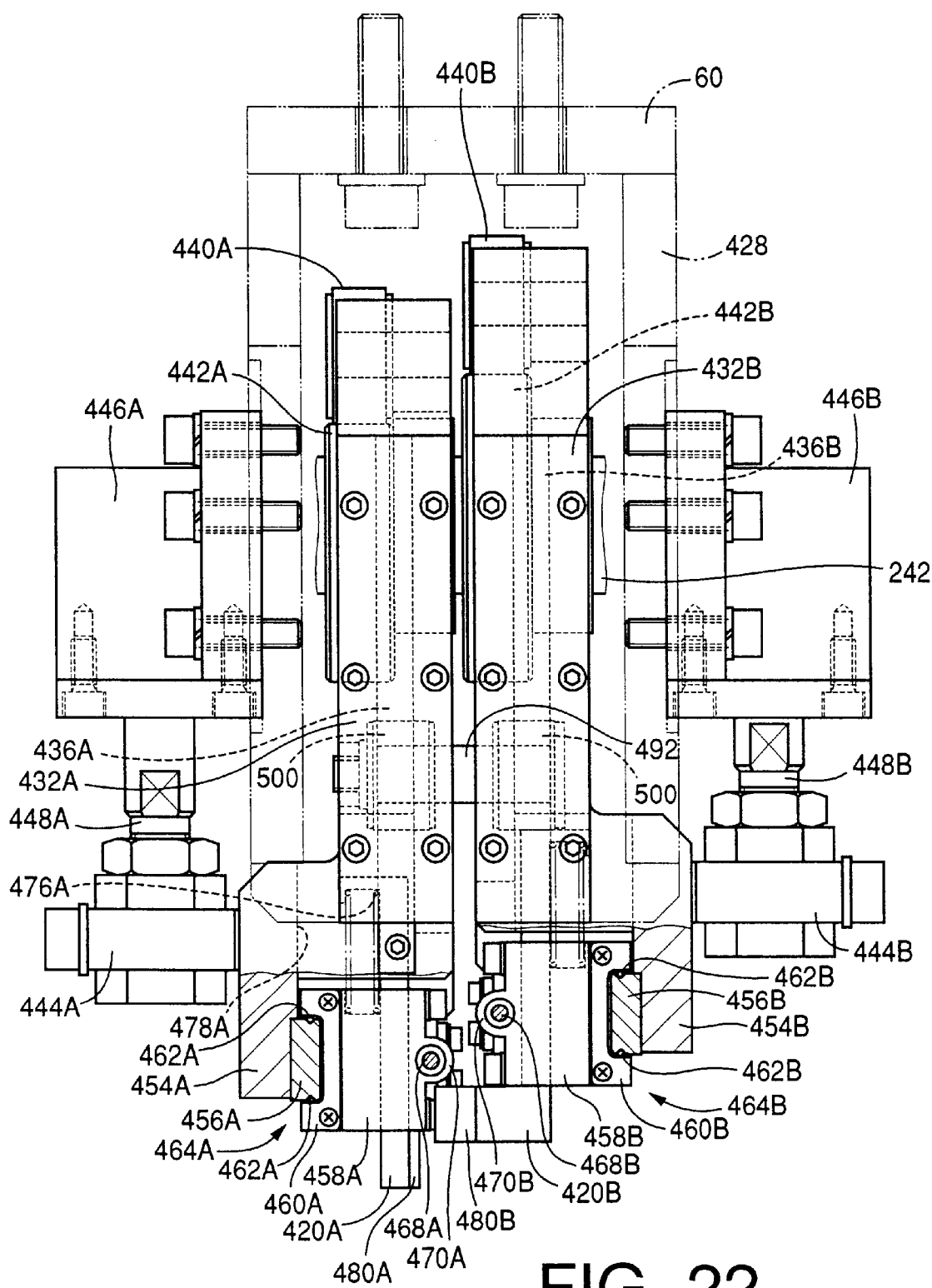
FIG. 22 is a partly cross-sectioned, side elevation view of the drive members driven by the first drive devices.

The drive member 420A is moved downward in synchronism with the downward movement of the suction nozzle 158. The roller 440A follows the plate cam 422A, the roller-hold member 434A is moved down, and the drive-member-hold member 458A is moved down. Thus, as shown in FIG. 22, the drive member 420A is moved down. Consequently the cover member 302 is retracted while the suction nozzle 158 is moved down, as indicated in the time chart of FIG. 21. As the drive member 420A is moved down, the drive tongue 480A engages the driven tongue 352 of the driven bar 344, thereby pushing down the driven bar 344. Accordingly, the drive lever 336 is rotated against the biasing force of the tension coil spring 342, so that the cover drive plate 356 and the tape drive plate 332 are retracted. The pivotable plate 324 is pivoted in its backward direction, and the ratchet pawl 326 is moved over some teeth of the ratchet wheel 322 to effect one tape-feed preparing operation in which the ratchet wheel 322 is not rotated. Thus, the EC carrier tape 294 is not retracted and only the cover member 302 is retracted, so that the current EC 164 is aligned with the rectangular opening 366 of the cover member 302. In this state, the suction nozzle 158 can pick up the EC 164 from the EC-accommodating pocket 288. The next EC 164 is placed under the cutout 370 of the cover member 302.

The suction nozzle 158 contacts and holds the EC 164 through the cutout 370 of the cover member 302. The cover member 302 is retracted at such a timing that after the nozzle 158 contacts the EC 164, the opening 366 is aligned with the EC 164. Therefore, the EC 164 is held by suction by the nozzle 158 while being prevented by the U-shaped tongue 368 from jumping out of the EC-accommodating pocket 288. After the tongue 368 is retracted to a position apart from the EC 164, the nozzle 158 is moved up to pick up the EC 164 from the pocket 288.

As the driven bar 344 is moved down, the feed lever 386 is pivoted against the biasing force of the tension coil spring 388. This pivotal motion is transmitted by the first one-way clutch to the drive roller 380, so that the drive roller 380 is rotated in a direction indicated at arrow in FIG. 8. The drive roller 380 cooperates with the driven roller 382 to sandwich the cover tape 290 and feed the same 290 while peeling the same 290 from the EC-accommodating tape 280.

The distance of movement (i.e., the amount of rotation) of the outer circumferential surface of the drive roller 380 during one-time cover-tape peeling operation based on one-time down-and-up movement of the driven bar 344, is made greater than the amount of feeding (i.e., the feed pitch) of the EC carrier tape 294 during one-time carrier-tape feeding operation of the carrier-tape feeding device 310. Therefore, when the cover tape 290 is peeled from the EC-accommodating tape 280, over a length thereof equal to the feed pitch of the carrier tape 294, the retraction of the cover member 302 is stopped and the peeling of the cover tape 290 is inhibited by the slit 362. Thus, a tension force applied to the cover tape 290 in a direction opposite to the cover-tape peeling direction becomes greater than the biasing force of the tension coil spring 388, so that the pivotal motion of the feed lever 386 is stopped, the lever 386 is moved away from the projection 390 of the driven bar 344, and the feeding of the cover tape 290 is stopped. In the present embodiment, the rotation of the drive roller 380 is not stopped before the cover tape 290 is peeled over its feed pitch and accordingly a sufficient amount of the cover tape 290 is fed by the drive roller 380. Thus, one-pitch length of the cover tape 290 is accurately peeled from the EC-accommodating tape 280.

As the drive lever 336 is pivoted, the movable roller 376 is moved downward, so that the distance between the movable roller 376 and the drive roller 380 increases. Thus, a predetermined length of the cover tape 290 is drawn up.

After the suction nozzle 158 holding the EC 164 is moved up to pick up the same 164 from the EC-accommodating pocket 288, the drive member 420A is moved up, so that the drive lever 336 is pivoted against the biasing force of the tension coil spring 342 and so that the driven bar 344 is moved up to follow the drive member 420A. As the drive lever 336 is pivoted, the tape drive plate 332 is advanced, so that the pivotable plate 324 is pivoted in its forward direction, and so that the ratchet pawl 326 is moved with the pivotable plate 324 till the ratchet pawl 326 butts on the stopper. Thus, the ratchet wheel 322 is rotated in its forward direction, and the sprocket 318 is rotated to feed the EC carrier tape 294. When the drive lever 336 is pivoted, the cover drive plate 356 is concurrently advanced, so that the cover member 302 is advanced with the carrier tape 294. The EC 164 accommodated in the leading one of at least one EC-accommodating pocket 288 from which the cover tape 290 has been peeled, is positioned right below the cutout 370 of the cover member 302, and opposite end portions of the EC 164 as seen in a direction perpendicular to the carrier-tape feeding direction are covered by the two arm portions of the U-shaped tongue 368. Thus, the EC 164 is fed to the EC-pick-up position while being prevented from jumping out of the EC-accommodating pocket 288.

When the movable roller 376 is moved upward and accordingly the distance between the movable roller 376 and the drive roller 380 is decreased, the cover tape 290 which has been drawn up is returned over a certain length and accordingly the EC carrier tape 294 is allowed to be fed by one pitch with the cover member 302.

As the driven bar 344 is moved upward, the feed lever 386 is pivoted in the direction opposite to the cover-tape feeding direction. The first one-way clutch permits the pivotal motion of the feeder lever 386 relative to the drive roller 380 in the direction opposite to the cover-tape feeding direction, and the second one-way clutch inhibits the drive roller 380 from being rotated in the direction opposite to the cover-tape feeding direction. Therefore, the feed lever 386 is pivoted, but the drive roller 380 is not rotated. Thus, no length of the cover tape 290 is peeled or fed.

Next, there will be described the relationship between the carrier-tape feeding and tape-feed preparing operations and the movable-table moving operation.

The greater the width of the ECs 164 is, the greater the width of the EC carrier tape 294 is, and the greater the width of the EC-supply unit 260 is. In the case where the pocket pitch at which the EC-accommodating pockets 288 are formed on the EC carrier tape 294 is equal to the carrier-tape-feed pitch at which the carrier tape 294 is fed by the carrier-tape feeding device 310, each of the EC-supply units 260 feeds, in one-time carrier-tape feeding operation thereof, the carrier tape 294 over a distance equal to the pocket pitch. In this case, assuming that the EC-supply units 260 are attached to the movable table 262 at a reference unit pitch, a plurality of EC-supply units 290 each of which feeds the carrier tape 294 in N-time (N=natural number) carrier-tape feeding operations thereof are attached to the movable table at a unit pitch that is N times as great as the above-indicated reference unit pitch.

First, there will be explained the relationship between the carrier-tape feeding and tape-feed preparing operations and the movable-table moving operation, in the case where each of the EC-supply units 260 feeds, in one-time carrier-tape feeding operation thereof, the carrier tape 294 over the distance equal to the pocket pitch and the EC-supply units 260 are attached to the movable table 262 at the reference unit pitch.

As indicated in the time chart of FIG. 21, before the movable table 262 is stopped, the downward movement of the EC-suction nozzle 158 is started, and the backward movement of the cover member 302 based on the downward movement of the drive member 420A is started. Therefore, the drive tongue 480A being positioned at its origin position corresponding to the EC-supply position engages, as shown in FIG. 13, a portion of the driven tongue 352 of the driven bar 344 on a downstream side of a widthwise center of the tongue 352 as seen in the direction of movement of the movable table 262. Since the movable table 262 is further moved in this state, the drive tongue 480A is kept, by friction, engaged with the driven tongue 352, and is moved with the driven bar 344. While the drive member 420A is moved down and up to drive the driven bar 344, the roller 440B is kept engaged with a portion of the cam surface of the plate cam 442B that is the most distant from the center of rotation of the cam 442B. Thus, the drive member 420B is not moved down or up, but waits in preparation for driving the driven member 344 of the next EC-supply unit 260.

When the EC-supply units 260 are horizontally moved from the right-hand side to the left-hand side in FIG. 13, the drive-member-hold member 458A is moved with the drive member 420A while compressing the downstream-side compression coil spring 472A. While being horizontally moved with the EC-supply unit 260, the drive member 420A is further moved downward, as indicated in two-dot chain lines, to drive the driven bar 344. Thus, the movement of the EC-supply unit 260 and the backward movement of the cover member 302 concurrently occur. Since the drive member 420A is moved downward while being horizontally moved, the drive member 420A does not interfere with the respective drive bars 344 of the two EC-supply units 260 adjacent to, and on both sides of, the EC-supply unit 260 whose drive bar 344 is engaged with the drive member 420A. In addition, since the drive-member-hold member 458A fits on the rod 468 via the rolling bearings 470 and the guide block 460 fits on the guide rails 456 via the balls 462, the drive-member-hold member 458A receives only a small resistance. Thus, the drive member 420A can reliably follow the driven bar 344 being moved.

As indicated in the time chart of FIG. 21, an EC-supply unit 260 is stopped before an EC-suction nozzle 158 reaches its lower stroke end and contacts an EC 164. Thus, the suction nozzle 158 can surely suck up the EC 164 from the EC-supply unit 260 being stopped. After the suction nozzle 158 picks up the EC 164 from the EC-accommodating pocket 288, and before the advancement (i.e., the forward movement) of the cover member 302 is started, the movement of the movable table 262 is started. Therefore, the drive tongue 480A is further moved with the driven bar 344, while it remains engaged with the driven tongue 352. After the movement of the movable table 262 is started, the drive member 420A is moved upward, and the driven bar 344 is moved upward to follow the drive member 420A, because it is subjected to the biasing force of the tension coil spring 342 via the drive lever 336. After the driven bar 344 is elevated to its upper stroke end where the ratchet pawl 326 butts on the stopper (not shown) and the forward pivotal motion of the drive lever 336 is limited, the drive member 420A is further elevated over a small distance, so that the drive tongue 480A is disengaged or separated from the driven tongue 352. Consequently the drive-member-hold member (hereinafter, referred to as the "drive-member holder") 458A is moved, because of the biasing force of the compression coil spring 472A that is currently compressed, in a direction opposite to the direction in which the movable table 262 has been moved, so that the drive member 480A is returned to its origin position as a reference position.

While the EC-supply portion of one EC-supply unit 260 which has finished supplying one or more ECs 164 is moved away from the EC-supply position by the movement of the movable table 262, the EC-supply portion of another EC-supply unit 260 which is next to supply one or more ECs 164 is moved toward the EC-supply position by the movement of the movable table 262. Regarding the another unit 260, too, the driven bar 344 thereof is moved downward and accordingly the cover member 302 thereof is retracted (i.e., moved backward), while the unit 260 is moved with the table 262, like the driven bar 344 of the one unit 260. However, the driven bar 344 of the another or second unit 260 is driven by not the drive member 420A which has driven the driven bar 344 of the one or first unit 260 but the drive member 420B which has been positioned at its origin position during the operation of the drive member 420A.

As described previously, the plate cams 238, 442A, 442B are formed such that the half (i.e., 180 degrees) rotations of the cams 238, 442A, 442B correspond to the cyclic operation time (i.e., "T/12" in the time chart of FIG. 5) of the EC-suction nozzles 158. Therefore, while the drive member 420B operates, the drive member 480A does not operate, i.e., is not vertically moved because the roller 440A is engaged with the portion of the cam surface of the cam 442A that is the most distant from the axis line of rotation of the cam 442A. That is, the drive member 420A waits for driving the driven bar 344 of the next or third EC-supply unit 260. Thus, only the drive member 420B drives the driven bar 344 of the second unit 260. That is, the two drive members 420A, 420B are alternately operated.

An empty portion of the EC-accommodating tape 280 from which the ECs 164 have been picked up is cut by the accommodating-tape cutting device 410. This cutting occurs, as indicated in the time chart of FIG. 21, when the cover member 302 is retracted, that is, in a state in which the EC carrier tape 294 is not moved. The movable blade 412 is moved upward and cooperates with the fixed blade 414 to cut off the free end portion of the empty tape 280. The cut-off piece is sucked with ambient air into the duct by the vacuum pump 416, so that the cut-off piece is collected in the accommodating-tape collecting container. When the collecting container is filled with the cut-off pieces of the accommodating tapes 280, the full container is replaced with an empty one. Otherwise, the operator may discard the cut-off pieces from the full container and again use the thus emptied container. The EC-accommodating tape 280 is thicker than the cover tape 290, and accordingly the cutting of the former tape 280 needs a longer time than the cutting of the latter tape 290. However, since the movable blade 412 is quickly moved down to its initial position, after cutting the accommodating tape 280, it does not obstruct the feeding of the EC carrier tape 294.

The cover tape 290 peeled from the EC-accommodating tape 280 is cut by the cover-tape cutting device 510. The cutting of the cover tape 290 is started, as indicated in the time chart of FIG. 21, immediately before the cover member 302 reaches its retracted position, that is, the peeling of one-pitch length of the cover tape 290 from the accommodating tape 280 is finished. The cutting of the cover tape 290 is finished when the movable blade 522 reaches its lower stroke end immediately after the movement of the movable table 262 is started. The plate cam 578 as part of the movable-blade elevating and lowering device 552 is so formed as to operate the movable blade 522 in this way. Thus, the cover-tape cutting device 510 cuts off the free end portion of the peeled cover tape 290 over one-pitch length equal to the predetermined pocket pitch at which the EC-accommodating pockets 288 are formed on the accommodating tape 280.

A downstream-side portion of the cover tape 290 that has been peeled from the EC-accommodating tape 280 by the drive roller 380 and the driven roller 392 and fed to a downstream side of an outlet of the cover-tape peeling and feeding device 312, is further fed to the cover-tape cutting device 510 provided in rear of the EC-supply unit 260, while being guided by the guide passage 408. Eventually, the free end portion of the cover tape 290 projects out of the guide passage 408. When the EC-supply unit 260 is moved with the movable table 262, the free end portion of the cover tape 290 that projects from the guide-passage defining member 314 is guided by the guide surfaces 588, 590 of the guide members 584, 586 shown in FIGS. 16 and 18, is introduced into a space between the guide members 584, 586, is further guided by the guide surface 538 of the guide member 534, and is introduced into the opening 520. Thus, the free end portion of the cover tape 290 is positioned between the movable and fixed blades 522, 524. Therefore, even in the case where no portion of the cover tape 290 peeled from the EC-accommodating tape 280 has been cut by the cover-tape cutting device 510 because a new EC carrier tape 294 has just been supplied to the main frame 274 of the unit 260, that is, a long free end portion of the cover tape 290 projects out of the guide-passage defining member 314, the long free end portion can be reliably introduced into the opening 520 by being guided by the guide members 584, 586, 534, so that the free end portion is positioned between the movable and fixed blades 522, 524.

In particular, regarding the EC-supply unit 260 whose EC-supply portion is currently positioned at the EC-supply position, the free end portion of the cover tape 290 that projects, while being fed by the cover-tape peeling and feeding device 312, out of the guide-passage defining member 314, is guided by the guide surface 540 of the guide member 532, in the cover-tape feeding direction, so that the free end portion is introduced into a space between the movable and fixed blades 522, 524.

When the cove tape 290 is cut, the lever 572 is pivoted and the connection member 568 is moved upward, so that the lever 556 is pivoted. Accordingly, the movable blade 522 is moved downward as indicated in two-dot chain lines in FIG. 16, and cooperates with the fixed blade 524 to cut the free end portion of the cover tape 290 into a cut-off piece. Since the respective outer surfaces of the two blades 522, 524 are coated with teflon, the adhesive possibly remaining on the cover tape 290 can be prevented from causing the remaining portion of the cover tape 290 to be adhered to the blades 522, 524 or causing the cut-off piece to be adhered to the same 522, 524. Thus, the two blades 522, 524 can reliably cut the cover tape 290.

A widthwise central portion of the generally V-shaped cutting edge of the movable blade 522 protrudes toward the fixed blade 524, in such a manner that the tip of protrusion of the central portion is slightly distant from the widthwise center of the movable blade 522 and is the nearest to the fixed blade 524. Since the tip of protrusion of the central portion is provided with the engagement guide 550, the movable and fixed blades 522, 524 is guided by the guide 550 such that the two blades 522, 524 does not collide with each other but respective surfaces thereof opposed to each other contact and pass each other to shear off the free end portion of the cover tape 290. The cutting of the cover tape 290 does not occur just at the tip of protrusion of the central portion provided with the guide 550, but a section of the central portion that is away from the guide 550.

The cut-off piece of the cover tape 290 is sucked with ambient air, by the vacuum pump 416, into the suction chamber 516, and is collected into the cover-tape collecting container via the duct 518. When the collecting container is filled with the cut-off pieces of the cover tapes 290, the full container is replaced with an empty one. The movable blade 522 is moved up, after cutting the cover tape 290, and waits for the next cover-tape cutting operation. Otherwise, the operator may empty the full container by discarding the cut-off pieces collected therein, and again use the thus emptied container.

The time chart of FIG. 21 indicates that before the cutting of the cover tape 290 is finished, the movement of the movable table 262 is started. However, immediately after the movement of the movable table 262 is started, the movable blade 522 reaches its lower stroke end, thereby finishing the cutting of the cover tape 290. Therefore, the cover tape 290 moving with the EC-supply unit 260 is by no means dragged by the blades 522, 524. It is, however, possible that the supply unit 260 be moved in a state in which the free end portion of the cover tape 290 is pinched between the two blades 522, 524. Since the space between the first and second members 404, 406 which provide the guide-passage defining member 314 has, on the side of the cover-tape cutting device 510, two openings which are opposite to each other in the direction in which the movable table 262 is moved, those openings permit the free end portion of the cover tape 290 pinched between the two blades 522, 524, to be moved relative to the guide-passage defining member 314. Thus, the cover tape 290 moving with the movable table 262 is prevented from being forcedly broken.

Meanwhile, even in a particular case where one EC-suction nozzle 158 is not vertically moved because, e.g., the nozzle 164 need not pick up an EC 164, and accordingly the corresponding EC carrier tape 294 is not fed, the main servomotor 108 may not be stopped. In this case, the manner of operation of the air cylinder 446A, 446B is switched from the first direction to the second direction, so that the drive member 420A, 420B is not vertically moved. This switching occurs, as indicated in the time chart of FIG. 21, at a timing when the drive member 420A, 420B reaches its upper stroke end and the roller 440A, 440B engages the portion of the cam surface of the plate cam 442A, 442B that is the most distant from the center of rotation of the cam 442A, 442B. When the vertical movement of the suction nozzle 158 is resumed, the manner of operation of the air cylinder 446A, 446B is switched back to the first direction, in a state in which the roller 440A, 440B is engaged with the above-indicated most distant portion of the cam surface of the plate cam 442A, 442B.

The above description relates to the case where the ECs 164 are small and one-time driving operation of the drive member 420A, 420B can feed the EC carrier tape 294 over a distance equal to the predetermined pocket pitch at which the EC-accommodating pockets 288 are formed on the EC-accommodating tape 280. However, in the case where the ECs 164 are large, one-time driving operation of the drive member 420A, 420B may not feed the carrier tape 294 over the distance equal to the pocket pitch. In the latter case, the drive member 420A, 420B is driven by the second drive device 424 in addition to the first drive device 422A, 422B.

Next, there will be described the case where two-time driving operations of the drive member 420A, 420B are needed to feed the carrier tape 294 over the distance equal to the pocket pitch. In this case, a plurality of EC-supply units 260 are attached to the movable table 262, at a unit pitch which is two times as great as the previously-described reference unit pitch. The movable table 262 is moved at a pitch equal to twice the reference unit pitch.

First, there will be described the manner in which the supplying of ECs 164 from the EC-supply units 260 attached to the movable table 262 at the reference unit pitch is changed to the supplying of ECs 164 from the EC-supply units 260 attached to the movable table 262 at twice the reference unit pitch.

In the present EC mounting system, the movable table 262 is moved concurrently with the upward movement of one EC-suction nozzle 158, after the suction nozzle 158 has been moved downward and then picked up one EC 164. Thus, a portion of one-time carrier-tape feeding operation and the movement of the table 262 over the reference unit pitch concurrently occur, and the EC-supply portion of the EC-supply unit 260 reaches the EC-supply position after the one-time carrier-tape feeding operation has been finished. Therefore, when the first one of the units 260 attached to the table 262 at twice the reference unit pitch reaches the EC-supply position after the last one of the units 260 attached to the table 262 at the reference unit pitch, the EC carrier tape 294 on the first unit 260 has already been fed over half the pocket pitch thereof.

Then, the main servomotor 108 is stopped at the end (i.e., "0" degree in FIG. 21) of the cyclic operation time of each EC-suction nozzle 158. Thus, the rotation of each rotary plate 70, the vertical movement of each suction nozzle 158, the operation of each first drive device 422A, 422B, and the cutting of the cover tape 290 and the EC-accommodating tape 280 are stopped. During this time period, too, the movable table 262 is moved, so that the table 262 is moved at once over a distance equal to twice the reference unit pitch. Consequently, the EC-supply portion of the first one of the units 260 attached to the table 262 at twice the reference unit pitch is positioned at the EC-supply position.

Figure 23:
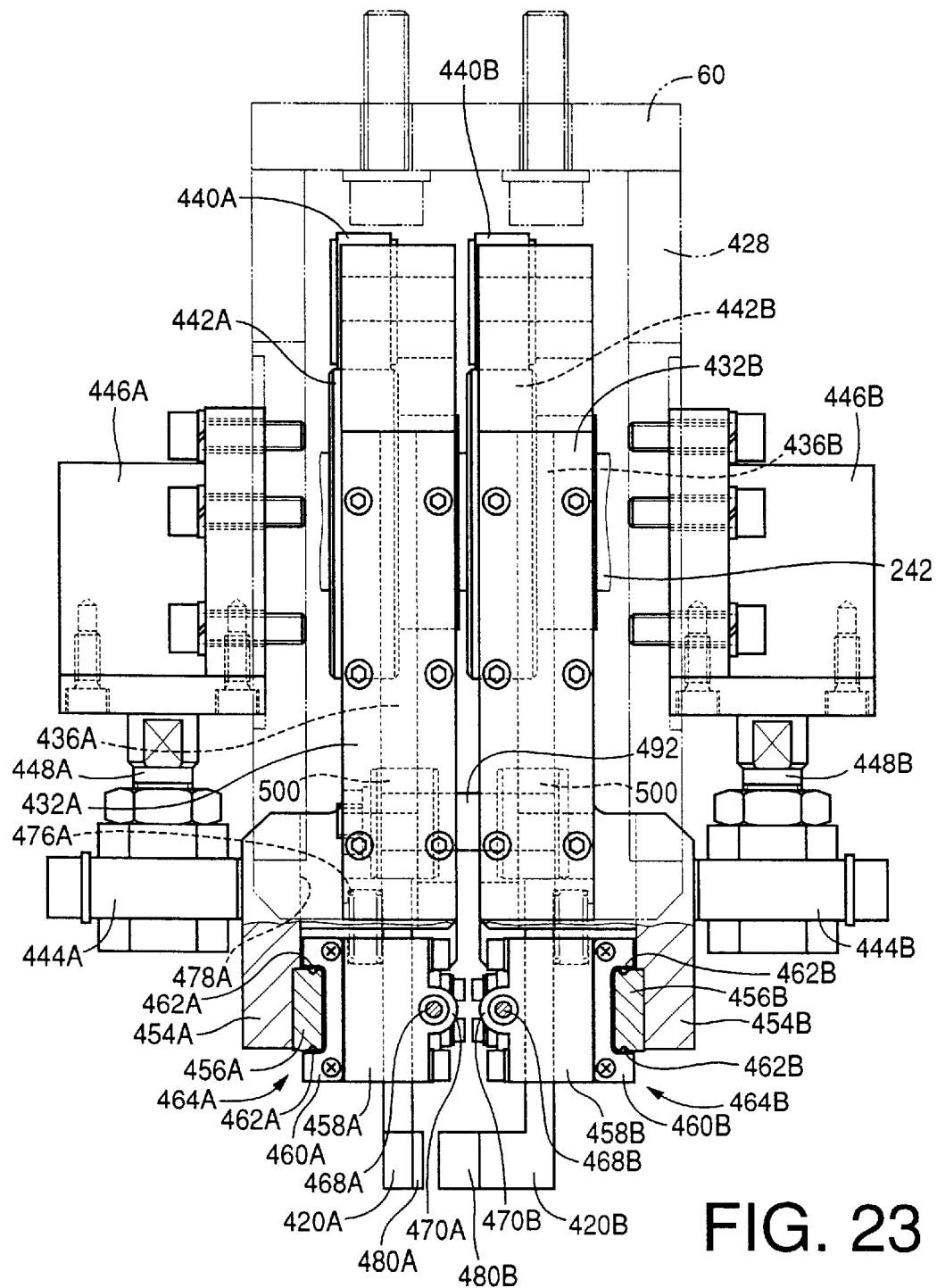
FIG. 23 is a partly cross-sectioned, side elevation view of the drive members driven by a second drive device.

In this state, the air cylinder 496 of the second drive device 424 is operated and accordingly the lever 492 is pivoted, so that, as shown in FIG. 23, the two operative rollers 500 push down the drive members 420A, 420B and thereby drive the driven bar 344. Consequently the driven bar 344 is vertically moved and the cover tape 290 is peeled from the EC-accommodating tape 280 over a length equal to a carrier-tape feed pitch at which the EC carrier tape 294 is fed. The carrier tape 294 is fed over a distance equal to the carrier-tape feed pitch, so that the leading EC 164 is positioned at the EC-pick-up position. Since the feeding of the leading EC 164 to the EC-pick-up position needs the two-time carrier-tape feeding operations, the driven bar 344 is driven two times, first by the drive member 420A or 420B being driven by the first drive device 422A or 422B, and second by the drive members 420A and 420B being driven by the second drive device 424.

Then, the main servomotor 108 is started again, and the EC-suction nozzle 158 is moved up to pick up the EC 164. Meanwhile, the U-shaped tongue 368 of the cover member 302 is so formed that the tongue 368 can be completely retracted away from the leading EC 164 irrespective of whether the EC 164 is small or large. Thus, the suction nozzle 158 is allowed to pick up the EC 164. When the main servomotor 108 is re-started, the cover-tape cutting device 510 cuts off the free end portion of the cover tape 290, into a cut-off piece which has a length equal to twice the carrier-tape feed pitch. After the picking-up of the EC 164, the movement of the movable table 262 is started at the same timing as that at which the movement of the table 262 is started in the case where the EC-supply units 260 are attached to the table 262 at the reference unit pitch. Thus, a portion of one-pitch feeding of the carrier tape 294 and the movement of the table 262 concurrently occur.

A plurality of EC-supply units 260 which are attached to the movable table 262 at twice the reference unit pitch may sequentially supply the ECs 164. In this case, too, the table 262 is moved over a distance equal to twice the reference unit pitch, the main servomotor 108 is stopped, the second drive device 424 is operated to feed the EC carrier tape for the second time, and then the main servomotor 108 is re-started to pick up the EC 164.

Next, there will be described the case where the supplying of ECs 164 from the EC-supply units 260 attached to the movable table 262 at twice the reference unit pitch is changed to the supplying of ECs 164 from the EC-supply units 260 attached to the table 262 at the reference unit pitch. Since the distance between the last one of the units 260 attached to the table 262 at twice the reference unit pitch and the first one of the units 260 attached to the table 262 at the reference unit pitch is equal to twice the reference unit pitch, the EC-supply portion of the first unit 260 is positioned at the EC-supply position by moving the table 262 over the distance equal to twice the reference unit pitch. During this movement of the table 262, more specifically, at a timing corresponding to the "0" degree of the cyclic operation time of each suction nozzle 158, the main servomotor 108 is stopped. However, after the EC-supply portion of the first unit 260 is positioned at the EC-supply position, the main servomotor 108 is re-started, so that the suction nozzle 158 is vertically moved to pick up the EC 164 and the table 262 is moved, according to the time chart of FIG. 21.

Next, there will be described the case where the supplying of ECs 164 from the EC-supply units 260 attached to the movable table 262 at twice the reference unit pitch is changed to the supplying of ECs 164 from the EC-supply units 260 attached to the table 262 at a unit pitch equal to three times as great as the reference unit pitch.

In the above case, after one EC-suction nozzle 158 has picked up one EC 164 from the last one of the units 260 attached to the table 262 at twice the reference unit pitch, the table 262 is moved concurrently with the upward movement of the nozzle 158. The table 262 is moved over a distance equal to three times the reference unit pitch, so that the EC-supply portion of the first one of the units 260 attached to the table 262 at three times the reference unit pitch is positioned at the EC-supply position. During this movement of the table 262, more specifically, at a timing corresponding to the "0" degree of the cyclic operation time of each suction nozzle 158, the main servomotor 108 is stopped. At this timing, the EC carrier tape 294 on the first unit 260 has been fed over a distance equal to one third of the predetermined pocket pitch. After the EC-supply portion of the first unit 260 is positioned at the EC-supply position, the second drive device 424 performs its carrier-tape feeding operation two times, so that the leading EC 164 is positioned at the EC-pick-up position. Then, the main servomotor 108 is re-started, so that the leading EC 164 is picked up and the carrier tape 294 is fed. Subsequently, the movement of the table 262 is started at the same timing as that at which the movement of the table 262 is started in the case where the EC-supply units 260 are attached to the table 262 at the reference unit pitch. Thus, the EC-supply portion of the first unit 260 is moved away from the EC-supply position. This also applies to the case where a plurality of EC-supply units 260 which are attached to the table 262 at three times the reference unit pitch sequentially supply the ECs 164.

Next, there will be described the case where the supplying of ECs 164 from the units 260 attached to the table 262 at three times the reference unit pitch is changed to the supplying of ECs 164 from the units 260 attached to the table 262 at twice the reference unit pitch. Since the distance between the last one of the units 260 attached to the table 262 at three times the reference unit pitch and the first one of the units 260 attached to the table 262 at twice the reference unit pitch is equal to three times the reference unit pitch, the EC-supply portion of the first unit 260 is positioned at the EC-supply position by moving the table 262 over the distance equal to three times the reference unit pitch. During this movement of the table 262, the main servomotor 108 is stopped. However, after the EC-supply portion of the first unit 260 is positioned at the EC-supply position, the second drive device 424 performs its carrier-tape feeding operation one time. Subsequently, the main servomotor 108 is re-started, and the EC 164 is picked up.

In the above description, the reference unit pitch is defined as the unit pitch at which the plurality of EC-supply units 260 each of which feeds the EC carrier tape 294 at the carrier-tape feed pitch equal to the pocket pitch are attached to the movable table 262. This is generalized such that the plurality of EC-supply units 260 each of which feeds the EC carrier tape 294 at the carrier-tape feed pitch equal to the value obtained by dividing the pocket pitch by the natural number N are attached to the movable table 262 at the unit pitch equal to the value obtained by multiplying the reference unit pitch by the number N. In the case where the natural number N is not smaller than 2, respective portions of one-time carrier-tape feeding operation and one-time tape-feed preparing operation of the carrier-tape feeding device 310 occur concurrently with a portion of the movement of the movable table 262 over the unit pitch equal to N times the reference unit pitch. The remaining portion of the movement of the table 262 over the unit pitch, and the feeding of the carrier tape 294 based on the (N−1)-time carrier-tape feeding operations of the second drive device 424 occur solely while the main servomotor 108 is stopped.

However, it is not essentially required that the EC-supply units 260 each of which feeds the EC carrier tape 294 at the feed pitch equal to the value obtained by dividing the pocket pitch by the natural number N are attached to the movable table 262 at the unit pitch equal to the value obtained by multiplying the reference unit pitch by the same number N. That is, the units 260 may be attached to the table 262 at a unit pitch equal to a value obtained by multiplying the reference unit pitch by a natural number, M, different from the natural number N. In this case, if the natural number N is not smaller than 2, a one-pitch feeding of the carrier tape 294 and a preparation therefor occur concurrently with a portion of the movement of the table 262, and the remaining portion of one-time carrier-tape feeding operation of the carrier-tape feeding device 310 occurs after the vertical movement of the suction nozzle 158 is stopped. Meanwhile, if the natural number M is not less than 2, a portion of the movement of the table 262 over the unit pitch equal to M times the reference unit pitch occurs concurrently with the feeding of the carrier tape 294, and the remaining portion of the movement occurs solely.

The foregoing description relates to the case where it is taken as a general rule that while the movable table 262 is moved in one direction only, the respective EC-supply portions of the EC-supply units 260 are sequentially positioned at the EC-supply position where each EC-supply portion supplies one or more ECs 164. However, it is possible to move the table 262 in a backward direction opposite to the above-indicated one direction, i.e., forward direction, for the purpose of, e.g., utilizing again one or more units 260 which have been used to supply the ECs. 164. In the latter case, not only when the table 262 is moved in the forward direction but also when the table 262 is moved in the backward direction, respective portions of the forward and backward movement of the cover member 302 and the feeding of the EC carrier tape 294 occur concurrently with the movement of the table 262. The forward movement of the table 262 is changed to the backward movement thereof, at the same timing as that at which the movement of the table 262 is resumed in the case where the table 262 is moved in the forward direction only. This also applies to the case where the units 260 each of which feeds the carrier tape 294 at the feed pitch equal to the value obtained by dividing the pocket pitch by the natural number N (not smaller than 2) are attached to the table 262 at the unit pitch equal to the value obtained by multiplying the reference unit pitch by the natural number M (not smaller than 2; the number M may, or may not, be equal to the number N).

Each drive-member holder 458A, 458B fits on the corresponding rod 468A, 468B, and is biased by the corresponding pair of compression coil springs 472A, 474A, 472B, 474B in opposite directions. While the drive member 420A, 420B does not drive the driven bar 344, the holder 458A, 458B is positioned at the origin position of the drive member 420A, 420B corresponding to the middle position of the rod 468A, 468B. When either one of the pair of coil springs is compressed, the holder 458A, 458B is moved in one of the opposite directions and, when the one coil spring is restored, the holder is returned in the other direction by the biasing force of the one coil spring. Therefore, irrespective of which direction each EC-supply unit 260 is moved in, the drive member 420A, 420B can follow the unit 260. When the unit 260 is moved in the backward direction opposite to the forward direction, the drive member 420A, 420B engages a second portion of the driven tongue 352 that is different from a first portion thereof which the drive member 420A, 420B engages when the unit 260 is moved in the forward direction. The first and second portions of the driven tongue 352 are distant from each other in the direction in which the table 262 is moved forward and backward. To this end, the driven tongue 352 has a width (i.e., a dimension as measured in a direction parallel to the direction of forward and backward movements of the table 262) which assures that the drive member 420A, 420B engages the driven tongue 352 irrespective of which direction the unit 260 is moved in.

In the cover-tape cutting device 510, the movable blade 522 has the generally V-shaped cutting edge line. Therefore, in the state in which the cutting device 510 is not operated, the distance between the two blades 522, 524 increases in a direction from the widthwise center of the movable blade 522 toward each of widthwise opposite ends of the same 522. Irrespective of whether the cover tape 290 is moved in the forward or backward direction relative to the cutting device 510, the tape 290 is guided by each of the two inclined side portions of the V-shaped cutting edge line of the movable blade, so that the tape 290 is easily and reliably positioned between the two blades 522, 524 and is cut by the same 522, 524. In the case where the cover tape 290 enters the space defined by, and between, the shorter one of the two inclined side portions of the generally V-shaped cutting edge line and a corresponding portion of the fixed blade 544, the tape 290 passes the engagement guide 550 provided laterally of the widthwise center of the movable blade 522, and reaches the center of the blade 522, before being cut. The engagement guide 550 guides, irrespective of whether the cover tape 290 is moved in the forward or backward direction relative to the cutting device 510, the engagement of the movable and fixed blades 522, 524 so that respective surfaces of the two blades 522, 524 that are opposed to each other contact each other and shear off the free end portion of the cover tape 290.

In the cover-tape cutting device 510, the guide members 532, 534, 584, 586 which guide the projecting portion of the cover tape 290 that projects from the guide-passage defining member 314, are provided on both sides of the defining member 314 as seen in the direction of movement of the movable table 262. Therefore, irrespective of whether each EC-supply unit 260 is moved in the forward or backward direction relative to the cutting device 510, the free end portion of the cover tape 290 is guided to the position between the movable and fixed blades 522, 524. In addition, the space defined by, and between, the first and second members 404, 406 which provide the guide-passage defining member 314 includes, on the side of the cover-tape cutting device 510, a portion which opens on both sides of the defining member 314 as seen in the direction of movement of the table 262. Therefore, irrespective of whether each EC-supply unit 260 is moved in the forward or backward direction, the free end portion of the cover tape 290 is permitted to be moved relative to the defining member 314.

It is not essentially required that the plurality of EC-supply units 260 provided on the movable table 262 sequentially supply ECs 164 in the same order as the order of provision of the units 260 on the table 262. For example, it is possible that only every second or third unit 260 out of all the units 260 supply ECs 164. In the latter case, the movable table 262 is additionally moved over an excessive distance equal to a distance obtained by subtracting the reference unit pitch from the distance between the current unit 260 whose EC-supply portion is being positioned at the EC-supply position and the next unit 260 whose EC-supply portion is next to be positioned at the EC-supply position. During this excessive movement of the table 262, the main servomotor 108 is kept stopped and no EC-suction nozzles 158 are vertically moved.

In the case where one or each of the EC-supply units 260 successively supply a plurality of ECs 164, the movable table 262 may not be moved, i.e., may be kept stopped when the EC-suction nozzle 158 is moved up and the EC carrier tape 294 is fed. In this case, after supplying of a certain number of ECs 164, the table 262 is moved concurrently with the feeding of the carrier tape 294, according to the time chart of FIG. 21.

It emerges from the foregoing description that, in the present EC mounting system, respective portions of the movement of each EC-supply unit 260 and the feeding of the EC carrier tape 294 on the each unit 260 concurrently occur. Therefore, the present system can shorten the time interval at which the respective EC-supply portions of the EC-supply units 260 reach the EC-supply position, without having to the time duration needed to move the each unit 260 or the time duration needed to feed the carrier tape 294.

The above-indicated time interval can be shortened by employing, in the each unit 260, the tension coil spring 342 which has a greater spring constant, increasing the speed of feeding of the carrier tape 294, and thereby shortening the time duration needed to feed the carrier tape 294. In this case, however, the pivotable plate 324, the cover-member drive member 356, the carrier-tape drive member 332, and other elements of the each unit 260 are worn in a shorter period, that is, the life expectancy of the unit 260 is decreased. In addition, the driven bar 344 which is biased by the spring 342 via the drive lever 336 must be driven by a greater force, that is, a drive device which has a greater power. In a special case where an operator manually operates the unit 260 to perform the feeding of the carrier tape 294, the operator must apply a greater force to the unit 260. Furthermore, a greater force is exerted from the teeth of the sprocket 318 to the feed holes 292 of the EC-accommodating tape 280, which may lead to deform or break the feed holes 292 and thereby lower the accuracy of feeding of the carrier tape 294 or the accuracy of positioning of each EC 164 at the EC-pick-up position. In contrast, in the present EC mounting system, respective portions of the movement of each EC-supply unit 260 and the feeding of the EC carrier tape 294 on the each unit 260 concurrently occur. Accordingly, the present system can shorten the time interval at which the respective EC-supply portions of the EC-supply units 260 reach the EC-supply position. The present system does not have to shorten the time duration needed to move the each unit 260 or the time duration needed to feed the carrier tape 294, employ the tension coil spring 342 which has a greater spring constant, or suffer from the problem that the life expectancy of the constituent elements of the each unit 260 is shortened. Thus, the present EC mounting system enjoys the advantage of shortening the cyclic operation time of the EC mounting device 12. As indicated previously, the cyclic operation time of the EC mounting device 12 is defined as the time duration from the time when each one of the EC-suction nozzles 158 reaches an operation position such as the component-suck position or the component-mount position, to the time when the following one of the nozzles 158 reaches the same operation position.

The cover tape 290 peeled from the EC-accommodating tape 280 is cut into pieces by the cover-tape cutting device 510, and those pieces are sucked by the vacuum pump 416. Thus, the peeled cover tape 290 can be more easily treated as compared with the case where the tape 290 is taken up around a take-up reel.

In addition, when the EC carrier tape 294 wound around the reel 296 is all consumed and the empty reel 296 is replaced with a new one, it is not needed to replace the cover-tape take-up reel with a new one or treat the cover-tape 290 taken up on the take-up reel, in contrast to the case where the peeled cover tape tape 290 is taken up around the take-up reel. Thus, the operator can supply the new carrier-tape reel to each EC-supply unit 260, in a largely shortened time duration.

Moreover, since each EC-supply unit 260 need not employ the cover-tape take-up reel or the take-up-reel drive device, the unit 260 enjoys a lighter weight. If a given condition allows each unit 260 to produce vibration at the conventional level, it is possible to shorten the time duration needed to position the EC-supply portion of each unit 260, by increasing the acceleration and deceleration of the movable table 262. Otherwise, if a given condition allows the table 262 to be moved at the conventional acceleration and deceleration, it is possible to start and stop the movement of the table 262, with less vibration. Thus, each EC 164 can be accurately positioned at the EC-supply portion of each unit 260, and the accuracy of supplying of ECs 164 is largely improved. Moreover, the table-moving servomotor 268 as the drive source of the table 262 may be one which has a smaller power.

The two drive members 420A, 420B are alternately operated. When the operation of the drive member 420A, 420B is not needed, the manner of operation of the air cylinder 446A, 446B is switched to the second direction, so that the roller holder 434A, 434B is held at its upper stroke end and accordingly the drive member 420A, 420B is held at its retracted (i.e., inoperative) position. Since the two drive members 420A, 420B are alternately operated, the switching of the air cylinder 446A, 446B has only to be finished within a sufficiently long time corresponding to the cyclic operation time of the EC mounting device 12.

As is apparent from the foregoing description, in the present embodiment, the drive-member holder 458A, the guide device 464A, and the compression coil springs 472A, 474A cooperate with one another to provide a drive-member returning device which returns the drive member 420A to its origin position as its reference position; and the drive-member holder 458B, the guide device 464B, and the compression coil springs 472B, 474B cooperate with one another to provide a drive-member returning device which returns the drive member 420B to its origin position as its reference position. An EC-reception control device is provided by the plate cam 238 of the head elevating and lowering device 220 provided at the position corresponding to the component-suck position, and the switching devices (i.e., switching valves) 178 which are controlled by the control device 660. The plate cam 238 is so formed as to elevate and lower the EC-suction nozzle 158 of each EC-holding head 120 being positioned at the component-suck position where the suction nozzle 158 receives the EC 164 from the EC-supply portion of each EC-supply unit 260 being positioned at the EC-supply position. The control device 660 controls, when the suction nozzle 158 is vertically moved, each of the switching devices 178 so that the negative pressure is supplied to the nozzle 168. Likewise, an EC-mounting control device is provided by the plate cam 238 of the head elevating and lowering device 220 provided at the position corresponding to the component-mount position, and the switching devices. This plate cam 238 is so formed as to elevate and lower the EC-suction nozzle 158 of each EC-holding head 120 being positioned at the component-mount position where the suction nozzle 158 mounts the EC 164 on the printed circuit board 38. The control device 660 controls, when the suction nozzle 158 is vertically moved, each of the switching devices 178 so that the supplying of the negative pressure is cut from the nozzle 168.

The ratchet wheel 322, the pivotable plate 324, the drive lever 336, the carrier-tape drive plate 332, the driven bar 344, the first drive devices 422A, 422B, the second drive device 424, and the drive members 420A, 420B cooperate with one another to provide a drive device of the carrier-tape feeding device 310, and this drive device cooperates with the sprocket 318 to provide the feeding device 310. The feed lever 386, the tension coil spring 388, the drive lever 336, the driven bar 344, the first drive devices 422A, 422B, the second drive device 424, and the drive members 420A, 420B cooperate with one another to provide a drive device of the cover-tape peeling and feeding device 312, and this drive device cooperates with the drive roller 380 and the driven roller 382 to provide the peeling and feeding device 312. The respective drive devices of the carrier-tape feeding device 310 and the cover-tape peeling and feeding device 312 commonly include the drive lever 336, the driven bar 344, the first drive devices 422A, 422B, the second drive device 424, and the drive members 420A, 420B.

In the illustrated embodiment, the second drive device 424 simultaneously drives the two drive members 420A, 420B. However, the second drive device 424 may be replaced with one which drives only either one of the two drive members 420A, 420B.

Figure 24:
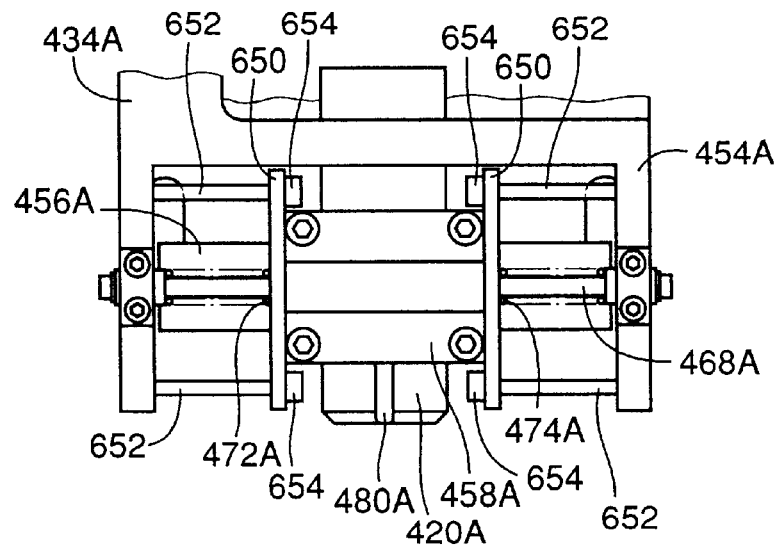
FIG. 24 is a front elevation view of a drive-member returning device employed in another EC mounting system as a second embodiment of the present invention.

In the drive-member returning device of the illustrated embodiment, the drive-member holder 458A, 458B is positioned at its origin position where the respective biasing forces of the compression coil springs 472A, 472B and the compression coil spring 474A, 474B are balanced, so that the drive member 420A, 420B is positioned at its origin position. However, FIG. 24 shows a modified drive-member returning device which returns the drive member 420A, 420B to its origin position. The following description relates to only the drive member 420A as a representative of the two drive members 420A, 420B, but applies to the other drive member 420B. The modified drive-member returning device includes a pair of movable members 650 which cooperate with each other to sandwich the drive-member holder 458A with respective small clearances being left between the two movable members 650 and opposite end faces of the holder 458A. The modified drive-member returning device can reliably return the drive-member 458A to its origin position, thereby returning the drive member 420A to its origin position.

The two movable members 650 each of which has a plate-like configuration fit on respective portions of the rod 468A that project from the opposite ends of the drive-member holder 458A. Each movable member 650 movably fits on two guide rods 652 which are supported by the support portion 454A of the roller holder 434A such that the guide rods 652 extend parallel to the direction of movement of the drive-member holder 458A. Each guide rod 652 includes a stopper portion 654 having a large diameter. Each of the two compression coil springs 472A, 474A biases a corresponding one of the two movable members 650 so that the one movable member 650 is brought into pressed contact with the respective stopper portions 654 of the corresponding pair of guide rods 652. In the state in which each movable member 650 is held in pressed contact with the stopper portions 654 of the pair of guide rods 652, a small clearance or space (not shown) is left between the each movable member 650 and the drive-member holder 458A. Thus, the stopper portions 654 of each pair of guide rods 652 define the end of the movement or stroke of a corresponding one of the movable members 650 by the biasing force of a corresponding one of the two springs 472A, 474A.

When the drive member 420A being engaged with the driven bar 344 of one EC-supply unit 260 is moved with the unit 260 from the right-hand side to the left-hand side in FIG. 24, the drive-member holder 458A is moved while compressing the compression coil spring 472A via the corresponding movable member 650. During this movement, the other movable member 650 is kept in pressed contact with the stopper portions 654 of the corresponding pair of guide rods 652 by the biasing force of the compression coil spring 474A. When the drive member 420A is moved away, and disengaged, from the drive bar 344, the spring 472A being compressed is restored while moving the corresponding movable member 650 toward its stroke end defined by the stopper portions 654 of the corresponding pair of guide rods 652. Consequently the drive-member holder 458A is moved with the movable member 650, and is returned to its origin position. After the movable member 650 is moved to its stroke end, the biasing force of the spring 472A is not applied to the holder 458A. The biasing force of the other spring 474A is not applied to the holder 458A, either. Thus, the holder 458A is sandwiched by the pair of movable members 650 being positioned at their stroke ends, and is reliably positioned at its origin position defined by the two movable members 650. Consequently the drive member 420A is reliably positioned at its origin position where the drive member 420A can engage the driven bar 344 of each unit 260.

Figure 25:
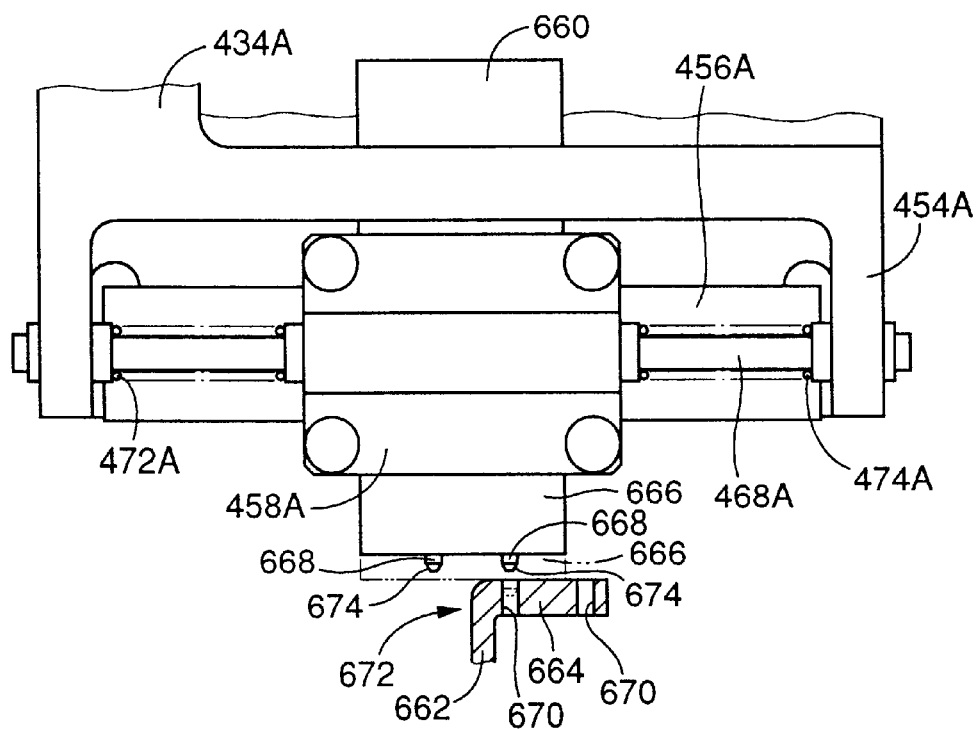
FIG. 25 is a front elevation view of a drive-member returning device employed in another EC mounting system as a third embodiment of the present invention.

In the drive-member returning device of the illustrated embodiment, the drive tongue 480A, 480B of the drive member 420A, 420B engages, by friction, the driven tongue 352 of the driven bar 344 of each EC-supply unit 260, and follows the unit 260 being moved. However, FIG. 25 shows a modified drive-member returning device which returns a drive member 660 to its origin position as its reference position. The drive member 660 includes a lower portion providing a drive portion 666 which projects toward a driven tongue 664 of a driven bar 662 of an EC-supply unit 672. Two engageable projections 668 each of which has a circular cross section project downward from a lower surface of the drive portion 666. The driven tongue 664 has two circular engageable holes 670 as engageable recesses. In the state in which the engageable projections 668 are engaged with the engageable holes 670, the drive member 660 is mechanically connected to the driven bar 662, so that the drive member 660 is forcedly moved with the EC-supply unit 672 being moved. The same reference numerals as used in the first embodiment shown in FIGS. I to 23 are used to designate the corresponding elements or parts in the third embodiment shown in FIG. 25, and the description of those elements or parts is omitted.

Each of the engageable projections 668 has, in its free end portion, a tapered guide portion 674 whose diameter decreases toward the tip. Each of the engageable holes 670 has a diameter slightly greater than that of a straight base portion of each projection 668. Thus, the two projections 668 can easily engage the two holes 670, respectively. The two holes 670 are spaced from each other in a direction parallel to a direction in which the EC-supply unit 672 is moved forward and backward. Thus, irrespective of whether the unit 672 is moved in the forward or backward direction, the projections 668 can engage the holes 672.

When the drive member 660 is lowered to drive the driven bar 662, the engageable projections 668 are guided by the respective guide portions 674 so as to engage, by fitting, in the engageable holes 670 of the driven bar 662 being moved. Thus, the drive member 660 is forcedly moved with the driven bar 662. In addition to the engagement of the projections 668 with the holes 670, the lower surface of the drive portion 666 engages an upper surface of the driven tongue 664, so that the drive member 660 pushes down the driven bar 344 while being moved with the unit 672. When the drive member 660 is moved up, the projections 668 are disengaged from the holes 670, so that the drive member 660 is returned to its origin position.

The engageable projections 668 provide engageable members which are engageable with the engageable holes 670 as engageable portions of the EC-supply unit 672. A drive-member drive device (not shown) which vertically moves the drive member 660 provides an engageable-member moving device which moves the engageable projections 668 to their engaging position where the projections 668 engage the holes 670 and to their retracted position where the projections 668 do not engage the holes 670.

Each of the engageable holes 670 may include, in its upper end portion, a tapered guide portion whose diameter increases toward its opening in the upper surface of the driven tongue 664. In this case, each of the engageable projections 668 may not include its tapered guide portion 674. In addition, the drive member 660 may be provided with a drive tongue similar to the drive tongue 480A, 480B of the drive member 420A, 420B. In this case, the drive tongue may include one or more projecting portions whose width is smaller than that of the drive tongue. The projecting portions provide engageable members. Moreover, the driven bar 662 as a driven member may be provided with one or more engageable projections, and the drive member 660 may be provided with engageable holes. Furthermore, the engageable members which are different from the drive member 660 may, or may not, be supported by the drive member 660. For example, the engageable members may be supported by the drive-member holder 458A such that the engageable members are distant from the drive member 660 supported by the holder 458A. In the last case, it is possible to employ an engageable-member moving device (not shown) which is independent of the drive-member drive device and which moves moves the engageable members to their engaging and retracted positions.

Figure 26:
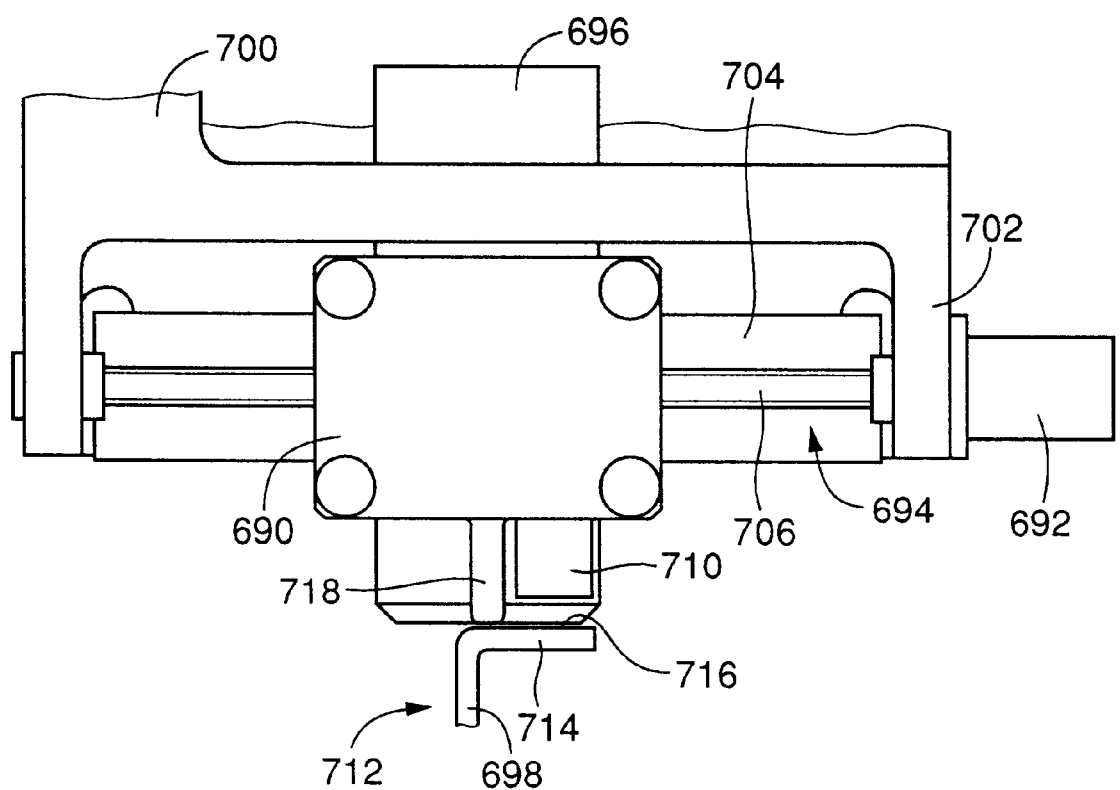
FIG. 26 is a front elevation view of a drive-member returning device employed in another EC mounting system as a fourth embodiment of the present invention.

FIG. 26 shows another modified drive-member returning device which returns a drive member 696 to its origin position as its reference position. In this returning device, a drive-member holder 690 is moved, by a holder moving device 694 including an electric motor 692 as its drive source, so that the drive member 696 follows a driven bar 698 of an EC-supply unit 712 being moved. The drive-member holder 690 is provided with a guide block (not shown) as a to-be-guided member which fits on a guide rail 704 via a plurality of balls. The guide rail 704 is supported by a support portion 702 of a roller holder 700. In addition, the drive-member holder 690 is provided with a nut (not shown) which is threadedly engaged with a ball screw 706 as a feed bar which is supported by the support portion 702 such that the screw 706 extends parallel to the direction of movement of the unit 712. When the ball screw 706 is rotated by the electric motor 692, the drive-member holder 690 is moved in a direction parallel to the direction of movement of the unit 712.

The drive member 696 which is similar to the drive member 420A fits in the drive-member holder 690 such that the drive member 696 is vertically movable. A photoelectric sensor 710 is fixed to a lower surface of the drive member 690. The photoelectric sensor 710 is of a reflection type wherein a light emitter and a light detector are employed. A reflecting member 716 is fixed to an upper surface of a driven tongue 714 of the driven bar 698. The reflector 716 is provided at a position where the reflector can reflect a light emitted from the light emitter toward the light detector in a state in which a drive tongue 718 of the drive member 696 is engaged with the driven tongue 714. The control device 660 controls the electric motor 692 to move the drive-member holder 690 such that the light detector of the sensor 710 continues to detect the light emitted from the light emitter and then reflected by the reflector 716. Thus, the drive member 696 is forcedly moved with the driven bar 712. The drive-member holder 690 is moved with the EC-supply unit 712 till the the drive member 696 is moved up away from the driven bar 698. Subsequently, the electric motor 692 is rotated in a direction opposite to the direction in which the motor 692 is rotated to forcively move the holder 690 with the driven bar 712, till the holder 690 is moved to its origin position. A rotary encoder may be employed to detect the amount of rotation of the electric motor 692. In this case, the motor 692 is rotated in the opposite or reverse direction by the rotation amount detected by the encoder when the motor 62 is rotated to forcively move the holder 690 with the driven bar 712. Alternatively, a detector which detects a particular state in which the holder 690 is positioned at its origin position, may be employed. In this case, after the motor 62 is rotated to forcively move the holder 690 with the driven bar 712, the motor 692 is rotated in the reverse direction by the motor 62, till the detector detects the above-indicated particular state. In the last case, the holder 690 may be provided with a dog, and the detector may be provided by a sensor which is supported by the roller holder 700 and which detects the dog.

In each of the illustrated embodiments, the ECs 164 are supplied from the EC-supply units 260 on the movable table 262 which is moved in such a manner that the table 262 is moved from its supply-start position to its supply-end position, while being allowed to be moved forward and backward, and then is returned at a stroke from the end position to the start position. However, the ECs 164 may be supplied from the EC-supply units 260, not only when the table 262 is moved forward from its supply-start position to its supply-end position, but also when the table 262 is moved backward from the end position to the start position. In this case, the end position when the table 262 is moved forward is used as the start position when the table 262 is moved backward, and the order of supplying of ECs 164 when the table 262 is moved forward is reverse to that when the table 262 is moved backward.

In each of the illustrated embodiments, it is taken as a general rule that each of the EC-supply units 260, 672, 698 supplies the ECs 164, one by one. However, each EC-supply unit may be adapted to supply successively a plurality of ECs. In this case, while each EC-supply unit successively supplies a plurality of ECs, the movable table 262 is kept stopped. The driven member of each EC-supply unit may be alternately driven by the two drive members, or may be driven by either one of the two drive members.

In each of the illustrated embodiments, the negative-pressure supplying source which supplies the negative pressure to the EC-suction nozzles 158 is provided by the vacuum pump 180; the suction device which supplies the negative pressure to the duct of the EC-accommodating-tape cutting device 410 is provided by the vacuum pump 416; and the suction device which supplies the negative pressure to the duct 518 of the cover-tape cutting device 510 is provided by the vacuum pump 416. However, the two vacuum pumps 180, 416 may be replaced by a single, common vacuum pump, or the two cutting devices 410, 510 may include respective exclusive suction devices.

In the first embodiment shown in FIGS. 1 to 23, the guide device 464A, 464B which guides the drive-member holder 458A, 458B includes the guide block 460A, 460B provided on the drive-member holder 458A, 458B, the ball 462A, 462B, and guide rail 456A, 456B provided on the roller holder 434A, 434B. However, the drive-member holder may be provided with a rail-like guided portion, and the roller holder may be provided with a guide groove by which the guided portion is guided. This also applies to each of the other embodiments.

In each of the illustrated embodiments, the air cylinders 248, 446A, 446B which cause the rollers 236, 440A, 440B to follow the plate cams 238, 442A, 442B and cause the rollers not to follow the plate cams, are of a double-action type. However, the cylinders 248, 446A, 446B may be replaced with cylinders of a single-action type.

In each of the illustrated embodiments, the roller 574 as part of the movable-blade elevating and lowering device 552 which elevates and lowers the movable blade 522 of the cover-tape cutting device 510 is biased, by the tension coil spring 574, so as to follow the plate cam 578. However, the spring 574 may be replaced with an air-cylinder device. In this case, an operative portion of the air-cylinder device is moved selectively in a first direction in which the operative portion causes the roller 574 to follow the cam 578 so that the cutting device 510 cuts the cover tape 510, and in a second direction in which the operative portion causes the roller not to follow the cam 578.

In each of the illustrated embodiments, each of the EC-supply units 260, 672, 698 which are detachably attached to the movable table 262 is provided by the main frame 274, and the carrier-tape feeding device 310 and the cover-tape peeling and feeding device 312 both of which are attached to the main frame 274. However, a plurality of mechanisms which include a plurality of carrier-tape feeding devices and a plurality of cover-tape peeling and feeding devices and which feed a plurality of EC carrier tapes 294 and peels a plurality of cover tapes 290, may be fixedly provided on a common frame member which is separate from the respective main frames of the EC-supply units. The plurality of carrier-tape feeding devices and the plurality of cover-tape peeling and feeding devices provided on the common frame member correspond to the plurality of EC-supply units 260, 672, 698, respectively.

The present invention is applicable to an EC supplying unit, an EC supplying apparatus, and an EC mounting apparatus each of which includes a take-up reel for taking up the cover tape 290 peeled from the EC-accommodating tape 280 and a reel drive device which rotates the take-up reel to take up the cover tape. In the case where the cover tape 290 is taken up by the take-up reel, the time duration needed to feed the carrier tape 294 can be shortened by employing the tension coil spring 342 which has a greater spring constant and thereby increasing the speed of feeding of the carrier tape 294. However, the speed of taking-up of the cover tape 290 is also increased and the inertia of the take-up reel is accordingly increased. Consequently the tension force exerted from the take-up reel to the cover tape 290 is increased, which may lead to breaking the cover tape 290 or moving up the cover member 302 covering the carrier tape 294. In contrast, in the EC supplying unit, the EC supplying apparatus, or the EC mounting apparatus according to the present invention, at least a portion of the feeding of the carrier tape 294 occurs concurrently with the movement of each EC-supply unit 260, 672, 698. Thus, the present invention is free from the problem that the cover tape 290 may be broken. The cover tape 290 can be taken up by the take-up reel, and the time duration needed to position the EC-supply portion of each EC-supply unit at the EC-supply position can be shortened.

It is to be understood that the present invention may be embodied with other changes, improvements, and modifications that may occur to the person skilled in the art without departing from the scope and spirit of the invention defined in the appended claims.

What is claimed is:

1. An electric-component supplying apparatus comprising:

a frame;

a component-supply table including a displaceable table which is supported by the frame and is displaceable relative to the frame in a reference direction, and a plurality of component-supply units which are provided on the displaceable table such that respective component-supply portions of the component-supply units are arranged along a line parallel to the reference direction, each of the component-supply units including a driven member and a carrier-tape feeding device which is connected to the driven member and feeds, based on the driven member being driven, a carrier tape carrying a plurality of electric components at a predetermined component-carry pitch, at a tape-feed pitch equal to a quotient obtained by dividing the component-carry pitch by an integral number, so that the electric components are positioned, one by one, at the component-supply portion of each of the component-supply units;

a table displacing device which is provided between the frame and the displaceable table, displaces the displaceable table relative to the frame in the reference direction and thereby positions the component-supply portion of said each component-supply units, at a predetermined component-supply position;

at least one drive member which is, near the component-supply position, supported by the frame such that the drive member is movable in a direction parallel to the reference direction and a direction intersecting the reference direction;

at least one drive device which is operatively associated with the drive member and which drives the drive member and thereby moves, in said direction intersecting the reference direction, the drive member which in turn engages and drives the driven member of each of said component-supply units; and at least one drive-member returning device which is provided between the frame and the drive member and which permits, in a state in which the drive member is engaged with the driven member of said each of said component-supply units being displaced with the displaceable table in said direction parallel to the reference direction, the drive member to be displaced, in said direction parallel to the reference direction, with the driven member being displaced and, in a state in which the drive member is away from the driven member, returns the drive member to a reference position thereof in said direction parallel to the reference direction.

2. The apparatus according to claim 1, wherein the drive member returning device comprises:

a drive-member holder which holds the drive member such that the drive member is movable in said direction intersecting the reference direction;

a guide device which is provided between the frame and the drive-member holder and guides the drive-member holder in said direction parallel to the reference direction; and a biasing device which is provided between the frame and the drive member holder and biases, in said direction parallel to the reference direction, the drive-member holder toward the reference position of the drive member.

3. The apparatus according to claim 2, wherein the biasing device comprises a pair of biasing members which are positioned between and engage the frame and the drive-member holder and apply, to the drive-member holder, respective elastic forces in opposite directions, so that the drive-member holder is allowed to move in each of the opposite directions.

4. The apparatus according to claim 3, wherein the drive-member returning device further comprises a pair of movable members each of which is positioned between and engages a corresponding one of the pair of biasing members and the drive-member holder and which are biased toward respective stop positions by the pair of biasing members, and wherein a slight space is left between the drive-member holder and each of the pair of movable members that is positioned at the respective stop positions thereof.

5. An apparatus according to claim 2, wherein the drive-member returning device further comprises:

an engageable member which is different from the drive member and which is supported by the drive-member holder such that the engageable member is movable to an engaging position where the engageable member engages an engageable portion of said each of said component-supply units and to a retracted position where the engageable member does not engage the engageable portion; and an engageable-member moving device which is operatively connected to the engageable member and moves the engageable member to each of the engaging position and the retracted position.

6. The apparatus according to claim 1, wherein the drive-member returning device comprises:

a drive-member holder which holds the drive member such that the drive member is movable in said direction intersecting the reference direction;

a guide device which is attached to the frame and operatively connected to the drive-member holder and guides the drive-member holder in said direction parallel to the reference direction;

a detector which is carried by the drive-member holder and which detects a detectable portion of each of said component-supply units; and a holder moving device attached to the frame which includes a drive source and which is operatively connected to the drive-member holder and moves the drive-member holder such that the detector continues to detect the detectable portion of each of said component-supply units.

7. An apparatus according to claim 1, wherein said at least one drive-member comprises two drive members and said at least one drive-member returning device comprises two drive-member returning devices which return said two drive members to respective reference position thereof, said two drive members alternately driving a respective driven member of the component-supply units.

8. The apparatus according to claim 1, wherein the drive device comprises a first drive device which includes a first drive source and is operatively connected to the drive member, and a second drive device which includes a second drive source independent of the first drive source and is operatively connected to the drive member.

9. The apparatus according to claim 8, wherein the first drive source comprises an electric motor which is supported by the frame, wherein the first drive device further comprises a cam mechanism including a rotary cam which is connected to, and rotated by, the electric motor, and a cam follower which is operatively connected to the drive member and follows the rotary cam, and wherein the second drive source comprises a fluid-pressure-operated cylinder device which is supported by the frame and is operatively connected to the drive member.

10. The apparatus according to claim 1, wherein the drive device comprises:
 a rotary cam which is supported by the frame;
 a cam follower which is operatively connected to the drive member and follows the rotary cam;
 a fluid-pressure-operated actuator which is supported by the frame and includes an operative portion which is movable in a first direction in which the operative portion presses the cam follower against the rotary cam, and in a second direction in which the operative portion moves the cam follower away from the rotary cam;
 a valve device which is operatively associated with the fluid-pressure-operated actuator and changes a direction in which a working fluid is supplied to the fluid-pressure-operated actuator and thereby switches a movement of the operative portion of the fluid-pressure-operated actuator to one of the first and second directions.

11. The apparatus according to claim 1, wherein the driven member includes a flat driven portion which is connected to the Carrier-tape feeding device and is parallel to the reference direction, and wherein the drive member includes a flat drive portion which is operatively connected to the drive device and is perpendicular to the reference direction and the flat driven portion.

12. An electric-component mounting system comprising:
 a frame,
 a component-supply table including a displaceable table which is supported by the frame and is displaceable relative to the frame in a reference direction, and a plurality of component-supply units which are provided on the displaceable table such that respective component-supply portions of the component-supply units are arranged along a line parallel to the reference direction, each of the component-supply units including a driven member and a carrier-tape feeding device which is connected to the driven member and feeds, based on the driven member being driven, a carrier tape carrying a plurality of electric components at a predetermined component-carry pitch, at a tape-feed pitch equal to a quotient obtained by dividing the component-carry pitch by an integral number, so that the electric components are positioned, one by one, at the component-supply portion of each of the component-supply units, and
 a table displacing device which is provided between the frame and the displaceable table, displaces the displaceable table relative to the frame in the reference direction and thereby positions the component-supply portion of each of said component-supply units, at a predetermined component-supply position;
 a circuit-substrate holding device which is provided on the frame and holds a circuit substrate on which electric components are to be mounted;
 a plurality of component holders which are supported by the frame such that the component holders are movable relative to the frame and which hold respective electric components;
 a holder revolving device which are provided on the frame, revolves the component holders about an axis line perpendicular to the reference direction, and sequentially positions the component holders at a component-receive position opposed to the component-supply position;
 a component-reception control device which is provided on the frame, is connected to the holder revolving device and the component holders, and controls the holder revolving device and each of the component holders such that of said each component holders receives, while being positioned at the component-receive position, an electric component from the component-supply portion of each of the component-supply units being positioned at the component-supply position;
 a component-mounting control device which is provided on the frame, is connected to the holder revolving device and the component holders, and controls the holder revolving device and said each of said component holder such that said each component holders mounts, while being opposed to the circuit substrate held by the circuit-substrate holding device, the electric component on the circuit substrate; and
 at least one drive member which is, near the component-supply position, supported by the frame such that the drive member is movable in a direction parallel the reference direction and a direction intersecting the reference direction,
 at least one drive device which is operatively associated with the drive member and which drives the drive member and thereby moves, in said direction intersecting the reference direction, the drive member which in turn engages and drives the driven member of said each of said component-supply units, and
 at least one drive-member returning device which is provided between the frame and the drive member and which permits, in a state in which the drive member is engaged with the driven member of said each of said component-supply units being displaced with the displaceable table in said direction parallel to the reference direction, the drive member to be displaced, in said direction parallel to the reference direction, with the driven member being displaced and, in a state in which the drive member is away from the driven member, returns the drive member to a reference position thereof in said direction parallel to the reference direction.

* * * * *